United States Patent
Osaka et al.

(10) Patent No.: US 9,761,812 B2
(45) Date of Patent: Sep. 12, 2017

(54) LIGHT-EMITTING ELEMENT, LIGHT-EMITTING DEVICE, ELECTRONIC DEVICE, AND LIGHTING DEVICE

(71) Applicant: Semiconductor Energy Laboratory Co., Ltd., Kanagawa-ken (JP)

(72) Inventors: Harue Osaka, Kanagawa (JP); Satoko Shitagaki, Kanagawa (JP); Nobuharu Ohsawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 683 days.

(21) Appl. No.: 14/088,690

(22) Filed: Nov. 25, 2013

(65) Prior Publication Data
US 2014/0145166 A1    May 29, 2014

(30) Foreign Application Priority Data
Nov. 26, 2012  (JP) ................................ 2012-257369

(51) Int. Cl.
*H01L 51/50* (2006.01)
*H01L 51/00* (2006.01)

(52) U.S. Cl.
CPC ...... *H01L 51/0072* (2013.01); *H01L 51/0061* (2013.01); *H01L 51/5012* (2013.01); *H01L 51/5056* (2013.01); *H01L 51/5088* (2013.01)

(58) Field of Classification Search
None
See application file for complete search history.

(56) References Cited

U.S. PATENT DOCUMENTS

| | | | |
|---|---|---|---|
| 5,049,464 | A | 9/1991 | Kanemaru et al. |
| 2007/0075632 | A1 | 4/2007 | Kawakami et al. |
| 2007/0231503 | A1 | 10/2007 | Hwang et al. |
| 2008/0099757 | A1 | 5/2008 | Furukawa et al. |
| 2008/0106188 | A1 | 5/2008 | Hwang et al. |
| 2008/0107919 | A1 | 5/2008 | Hwang et al. |
| 2008/0254318 | A1 | 10/2008 | Nakashima et al. |
| 2008/0284328 | A1 | 11/2008 | Nakashima et al. |

(Continued)

FOREIGN PATENT DOCUMENTS

| | | |
|---|---|---|
| CN | 101812057 A | 8/2010 |
| JP | 02-178670 A | 7/1990 |

(Continued)

OTHER PUBLICATIONS

Office Action re U.S. Appl. No. 13/481,142, dated Apr. 24, 2013.

(Continued)

*Primary Examiner* — Gregory Clark
(74) *Attorney, Agent, or Firm* — Husch Blackwell LLP

(57) ABSTRACT

To provide a light-emitting element with high emission efficiency. In a light-emitting element including an organic compound between a pair of electrodes, the molecular weight X of the organic compound is 450 or more and 1500 or less, and the absorption edge of the organic compound is at 380 nm or more. By liquid chromatography mass spectrometry in a positive mode in which an argon gas is made to collide with the organic compound subjected to separation using a liquid chromatograph at any energy higher than or equal to 1 eV and lower than or equal to 30 eV, a product ion is detected at least around $m/z=(X-240)$.

19 Claims, 31 Drawing Sheets

(56) References Cited

U.S. PATENT DOCUMENTS

| | | |
|---|---|---|
| 2009/0015140 A1 | 1/2009 | Kawakami et al. |
| 2009/0058267 A1 | 3/2009 | Nakashima et al. |
| 2009/0206745 A1 | 8/2009 | Hwang et al. |
| 2010/0069647 A1 | 3/2010 | Suzuki et al. |
| 2010/0207517 A1 | 8/2010 | Nomura et al. |
| 2011/0049487 A1 | 3/2011 | Kim et al. |
| 2012/0007495 A1 | 1/2012 | Yuji et al. |
| 2012/0012824 A1 | 1/2012 | Yuji et al. |
| 2012/0071668 A1 | 3/2012 | Suzuki et al. |
| 2012/0077987 A1 | 3/2012 | Osaka et al. |
| 2012/0302762 A1 | 11/2012 | Osaka et al. |

FOREIGN PATENT DOCUMENTS

| | | | |
|---|---|---|---|
| JP | 03-118548 A | 5/1991 | |
| JP | 10-310574 A | 11/1998 | |
| JP | 2011-001349 * | 1/2011 | ............ C09K 11/06 |
| JP | 4729641 B1 | 7/2011 | |
| JP | 2013-010749 A | 1/2013 | |
| KR | 2010-0123172 A | 11/2010 | |
| KR | 2010-0132109 A | 12/2010 | |
| KR | 10-1007516 B1 | 1/2011 | |
| KR | 2011-0087768 A | 8/2011 | |
| KR | 2011-0111967 A | 10/2011 | |
| KR | 1070223 B | 10/2011 | |
| KR | 2011-0134581 A | 12/2011 | |
| KR | 2012-0009761 A | 2/2012 | |
| KR | 2012-0039470 A | 4/2012 | |
| WO | WO 2006/070907 A1 | 7/2006 | |
| WO | WO 2007/043484 A1 | 4/2007 | |
| WO | WO 2008/010377 A1 | 1/2008 | |
| WO | WO 2010/021524 A2 | 2/2010 | |
| WO | WO 2010/067746 A1 | 6/2010 | |
| WO | WO 2010/113743 A1 | 10/2010 | |
| WO | WO 2011/031086 A2 | 3/2011 | |
| WO | WO 2011/090149 A1 | 7/2011 | |
| WO | WO 2012/005360 A1 | 1/2012 | |

OTHER PUBLICATIONS

Final Rejection re U.S. Appl. No. 13/481,142, dated Sep. 24, 2013.
Office Action re U.S. Appl. No. 13/481,142, dated Apr. 15, 2014.
Balionyte, A. et al., "Polymers Containing 9-alkylcarbazol-3,6-diyl and Different Aromatic Amino Groups in the Main Chain," Europian Polymer Journal, Aug. 1, 2005, vol. 41, No. 8, pp. 1821-1827.
Ho, M.-H. et al., "P-131: Novel Deep Blue Dopants for Organic Light-Emitting Devices," SID Digest '05: SID International Symposium Digest of Technical Papers, vol. 36, May 24, 2005, pp. 802-805.
Chinese Office Action re Application No. CN 201310606271.7, dated Aug. 29, 2016.

* cited by examiner

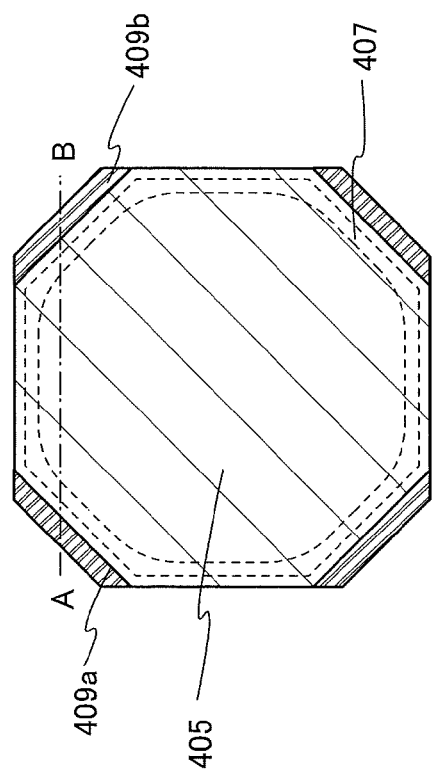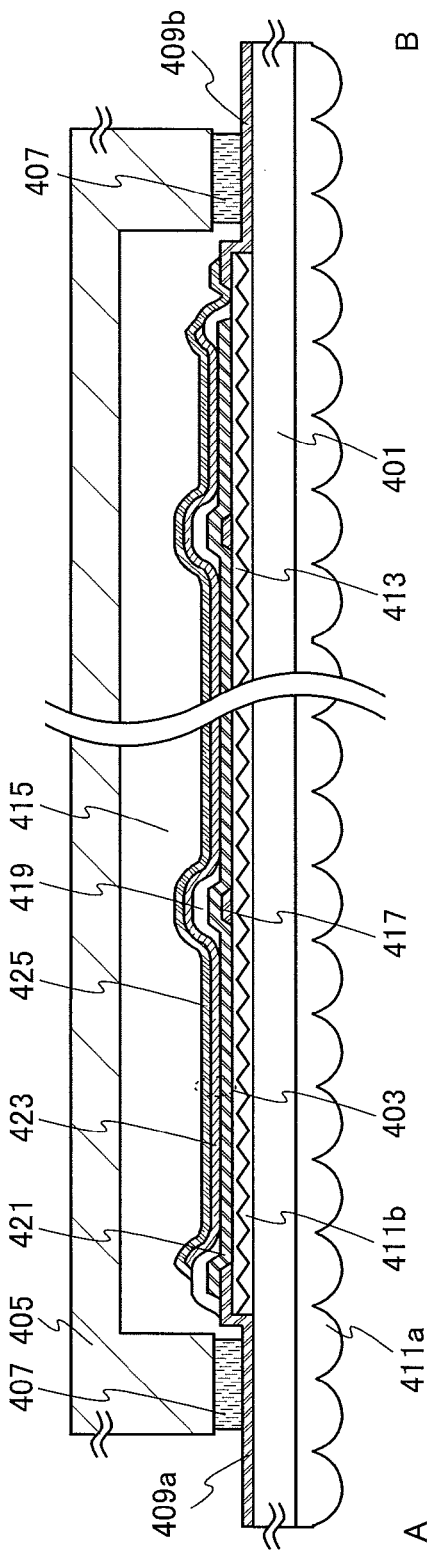
FIG. 2A
FIG. 2B

FIG. 4A
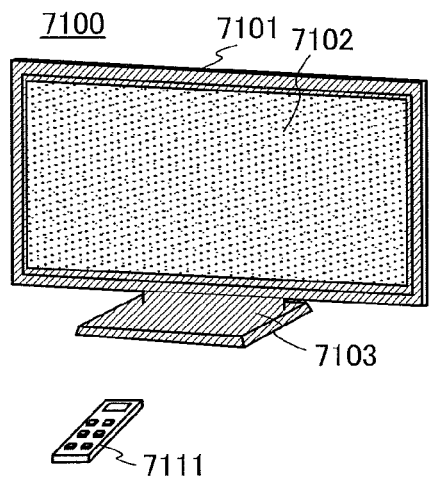
FIG. 4B
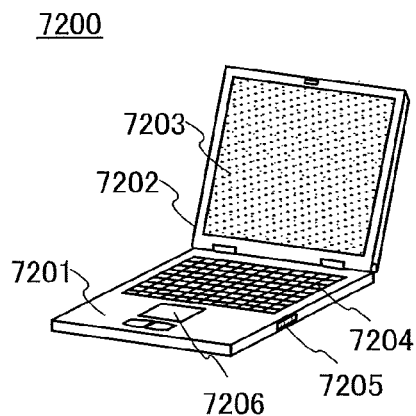
FIG. 4C
FIG. 4D
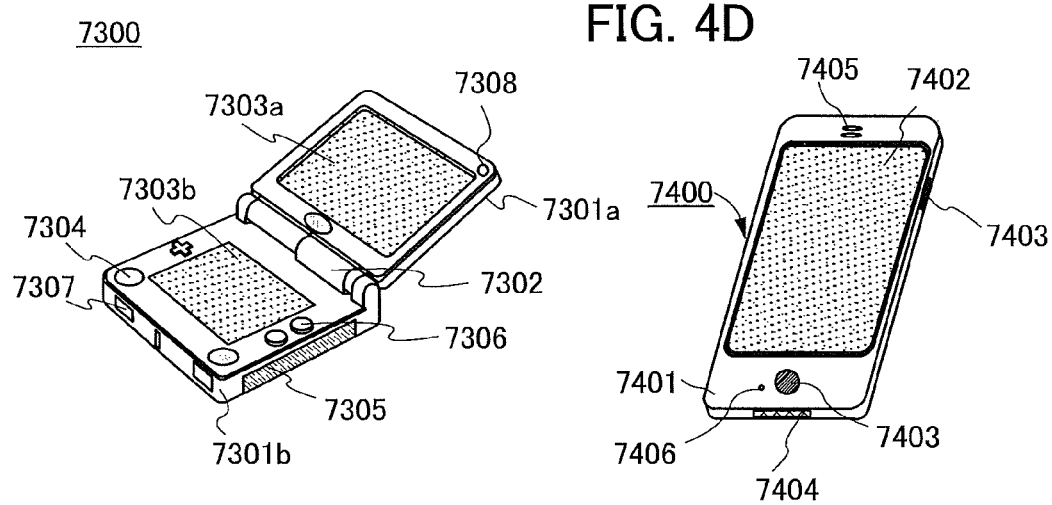
FIG. 4E
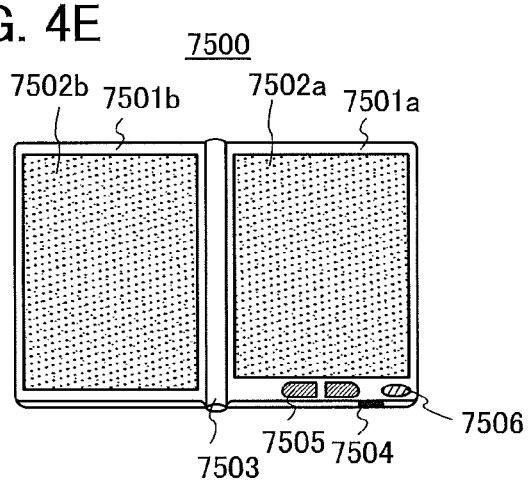

LIGHT-EMITTING ELEMENT, LIGHT-EMITTING DEVICE, ELECTRONIC DEVICE, AND LIGHTING DEVICE

BACKGROUND OF THE INVENTION

1. Field of the Invention

The present invention relates to a light-emitting element using electroluminescence (EL). Further, the present invention relates to an organic compound included in the light-emitting element. Furthermore, the present invention relates to a light-emitting device, an electronic device, and a lighting device each of which includes the light-emitting element.

2. Description of the Related Art

In recent years, research and development have been extensively conducted on light-emitting elements utilizing EL. In a basic structure of such a light-emitting element, a layer containing a light-emitting substance is interposed between a pair of electrodes. By applying voltage to this element, light emission from the light-emitting substance can be obtained.

Such light-emitting elements are self-luminous elements and have advantages over liquid crystal displays in having high pixel visibility and eliminating the need for backlights, for example; thus, such light-emitting elements are thought to be suitable for flat panel display elements. The light-emitting elements also have a great advantage that they can be manufactured as thin and lightweight elements. Further, very high-speed response is also one of the features of such elements.

Further, since such a light-emitting element can be formed in a film form, planar light emission can be easily obtained. Therefore, large-area elements utilizing planar light emission can be easily formed. This feature is difficult to obtain with point light sources typified by incandescent lamps and LEDs or linear light sources typified by fluorescent lamps. Thus, the light-emitting element also has great potential as a planar light source applicable to a lighting device and the like.

The light-emitting elements utilizing EL can be broadly classified according to whether they use an organic compound or an inorganic compound as a light-emitting substance. In the case where an organic compound is used as the light-emitting substance, application of a voltage to a light-emitting element causes injection of electrons and holes into a layer that includes the organic compound from a pair of electrodes, and thus a current flows. Then, the injection of these carriers (the electrons and holes) makes the organic compound to form an excited state and to emit light when it returns from the excited state to a ground state.

With such a mechanism, such a light-emitting element is called a current-excitation light-emitting element. Note that the excited state formed by an organic compound can be a singlet excited state or a triplet excited state, and luminescence from the singlet excited state is referred to as fluorescence, and luminescence from the triplet excited state is referred to as phosphorescence.

In improving element characteristics of such a light-emitting element, there are a lot of problems which depend on a substance, and in order to solve the problems, improvement of an element structure, development of a substance, and the like have been carried out (for example, see Non-Patent Document 1).

REFERENCE

Non-Patent Document

[Non-Patent Document 1] Meng-Huan Ho, Yao-Shan Wu and Chin H. Chen, 2005 SID International Symposium Digest of Technical Papers, Vol. XXXVI. pp. 802-805.

SUMMARY OF THE INVENTION

An object of one embodiment of the present invention is to provide a light-emitting element with high emission efficiency. Further, an object is to provide a light-emitting device, an electronic device, or a lighting device with low power consumption.

A light-emitting element of one embodiment of the present invention includes an organic compound having a phenylcarbazole skeleton. The organic compound has a high hole-transport property. Thus, when the organic compound is used for a light-emitting element, a light-emitting element having high emission efficiency can be obtained. Further, a light-emitting element in which increase of driving voltage is suppressed can be obtained.

One embodiment of the present invention is a light-emitting element including an organic compound between a pair of electrodes. The molecular weight X of the organic compound is greater than or equal to 450 and less than or equal to 1500. The absorption edge of the organic compound is at 380 nm or more. By liquid chromatography mass spectrometry (abbreviation: LC/MS analysis) in a positive mode in which an argon gas is made to collide, at any energy higher than or equal to 1 eV and lower than or equal to 30 eV, with the organic compound subjected to separation using a liquid chromatograph (also referred to as LC separation), a product ion is detected at least around m/z=(X−240).

Note that in this specification, m/z refers to a mass-to-charge ratio. In this specification, a positive mode refers to a mode in which a positive ion is detected. In this specification, a product ion refers to an ion generated by dissociation of an organic compound or an ion thereof in LC/MS analysis or analysis with a time-of-flight secondary ion mass spectrometer (TOF-SIMS).

One embodiment of the present invention is a light-emitting element including an organic compound between a pair of electrodes. The molecular weight of the organic compound is 486. The absorption edge of the organic compound is at 380 nm or more. By LC/MS analysis in a positive mode in which an argon gas is made to collide with the organic compound subjected to LC separation at any energy higher than or equal to 1 eV and lower than or equal to 30 eV, a product ion is detected at least around m/z=246.

One embodiment of the present invention is a light-emitting element including an organic compound between a pair of electrodes. The molecular weight of the organic compound is 562. The absorption edge of the organic compound is at 380 nm or more. By LC/MS analysis in a positive mode in which an argon gas is made to collide with the organic compound subjected to LC separation at any energy higher than or equal to 1 eV and lower than or equal to 30 eV, a product ion is detected at least around m/z=322.

Here, for example, "around 246" includes at least a range of greater than or equal to 243.5 and less than 248.5. That is, in this specification, "around N" (N is an integer) includes a numeric value greater than or equal to (N−2.5) and less than (N+2.5).

One embodiment of the present invention is a light-emitting element including an organic compound between a pair of electrodes. The molecular weight of the organic compound is greater than or equal to 450 and less than or equal to 1500. The absorption edge of the organic compound is at 380 nm or more. The organic compound includes a phenylcarbazole skeleton and an N-biphenyl-N-phenylamine skeleton. By LC/MS analysis in a positive mode in which an argon gas is made to collide with the organic compound subjected to LC separation at any energy higher than or equal to 1 eV and lower than or equal to 30 eV, a product ion of m/z derived from at least the N-biphenyl-N-phenylamine skeleton is detected.

One embodiment of the present invention is a light-emitting element including an organic compound between a pair of electrodes. The molecular weight of the organic compound is greater than or equal to 450 and less than or equal to 1500. The absorption edge of the organic compound is at 380 nm or more. The organic compound includes a phenylcarbazole skeleton and an N,N-bis-biphenylamine skeleton. By LC/MS analysis in a positive mode in which an argon gas is made to collide with the organic compound subjected to LC separation at any energy higher than or equal to 1 eV and lower than or equal to 30 eV, a product ion of m/z derived from at least the N,N-bis-biphenylamine skeleton is detected.

In each of the above-described structures, a product ion may be detected at least around m/z=243 in a qualitative spectrum (a positive ion) of the organic compound measured with a TOF-SIMS in which $Bi_3^{++}$ is used as a primary ion and the amount of irradiation with the primary ion is greater than or equal to $8 \times 10^{10}$ ions/cm$^2$ and less than or equal to $1 \times 10^{12}$ ions/cm$^2$.

It is preferable that the light-emitting element with any of the above-described structures include a hole-injection layer, a hole-transport layer, and a light-emitting layer and that the organic compound be included in at least one of the hole-injection layer, the hole-transport layer, and the light-emitting layer.

One embodiment of the present invention is a light-emitting device including any of the above-described light-emitting elements of one embodiment of the present invention in a light-emitting portion. One embodiment of the present invention is an electronic device including the light-emitting device in a display portion. One embodiment of the present invention is a lighting device including the light-emitting device in a lighting portion.

The light-emitting element of one embodiment of the present invention has high emission efficiency, and thus, a light-emitting device with low power consumption can be obtained. In a similar manner, an electronic device and a lighting device with low power consumption can be obtained by adopting one embodiment of the present invention.

Note that the light-emitting device in this specification includes an image display device that uses a light-emitting element. Further, the category of the light-emitting device in this specification includes a module in which a light-emitting element is provided with a connector such as an anisotropic conductive film or a TCP (tape carrier package); a module including a TCP which is provided with a printed wiring board at the end thereof; and a module in which an IC (integrated circuit) is directly mounted on a light-emitting element by a COG (chip on glass) method. Furthermore, light-emitting devices that are used in lighting equipment and the like shall also be included.

In one embodiment of the present invention, the molecular weight X of an organic compound is greater than or equal to 450 and less than or equal to 1500, the absorption edge of the organic compound is at 380 nm or more, and a product ion is detected at least around m/z=(X−240) by LC/MS analysis in a positive mode in which an argon gas is made to collide with the organic compound subjected to LC separation at any energy higher than or equal to 1 eV and lower than or equal to 30 eV.

For example, in one embodiment of the present invention, the molecular weight X of an organic compound is 486, the absorption edge of the organic compound is at 380 nm or more, and a product ion is detected at least around m/z=246 in LC/MS analysis in a positive mode in which an argon gas is made to collide with the organic compound subjected to LC separation at any energy higher than or equal to 1 eV and lower than or equal to 30 eV. Further, in one embodiment of the present invention, the molecular weight X of an organic compound is 562, the absorption edge of the organic compound is at 380 nm or more, and a product ion is detected at least around m/z=322 by LC/MS analysis in a positive mode in which an argon gas is made to collide with the organic compound subjected to LC separation at any energy higher than or equal to 1 eV and lower than or equal to 30 eV.

In one embodiment of the present invention, the molecular weight of an organic compound is greater than or equal to 450 and less than or equal to 1500, the absorption edge of the organic compound is at 380 nm or more, the organic compound includes a phenylcarbazole skeleton and an N-biphenyl-N-phenylamine skeleton, and, by LC/MS analysis in a positive mode in which an argon gas is made to collide with the organic compound subjected to LC separation at any energy higher than or equal to 1 eV and lower than or equal to 30 eV, a product ion of m/z derived from at least the N-biphenyl-N-phenylamine skeleton is detected. In another embodiment of the present invention, the molecular weight of an organic compound is greater than or equal to 450 and less than or equal to 1500, the absorption edge of the organic compound is at 380 nm or more, the organic compound includes a phenylcarbazole skeleton and an N,N-bis-biphenylamine skeleton, and, by LC/MS analysis in a positive mode in which an argon gas is made to collide with the organic compound subjected to LC separation at any energy higher than or equal to 1 eV and lower than or equal to 30 eV, a product ion of m/z derived from at least the N,N-bis-biphenylamine skeleton is detected.

In each of the above-described organic compounds, a product ion may be detected at least around m/z=243 in a qualitative spectrum (a positive ion) of the organic compound measured with a TOF-SIMS in which $Bi_3^{++}$ is used as a primary ion and the amount of irradiation with the primary ion is greater than or equal to $8 \times 10^{10}$ ions/cm$^2$ and less than or equal to $1 \times 10^{12}$ ions/cm$^2$.

By use of one embodiment of the present invention, a light-emitting element having high emission efficiency can be provided. Further, by use of one embodiment of the present invention, a light-emitting device, an electronic device, or a lighting device with low power consumption can be provided.

BRIEF DESCRIPTION OF THE DRAWINGS

FIGS. 2A and 2B show an example of a light-emitting device.
FIGS. 4A to 4E show examples of an electronic device.

DETAILED DESCRIPTION OF THE INVENTION

Figure 1A:
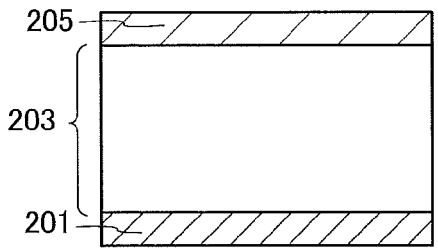
FIGS. 1A to 1D show examples of a light-emitting element.

Embodiments will be described in detail with reference to the accompanying drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Embodiment 1

In this embodiment, a light-emitting element of one embodiment of the present invention will be described with reference to FIGS. 1A to 1D.

A light-emitting element of one embodiment of the present invention includes an organic compound having a phenylcarbazole skeleton. The organic compound has a high hole-transport property. Thus, when the organic compound is used for a light-emitting element, a light-emitting element having high emission efficiency can be obtained. Further, a light-emitting element in which increase of driving voltage is suppressed can be obtained.

One embodiment of the present invention is a light-emitting element including an organic compound between a pair of electrodes. The molecular weight X of the organic compound is greater than or equal to 450 and less than or equal to 1500. The absorption edge of the organic compound is at 380 nm or more. By LC/MS analysis in a positive mode in which an argon gas is made to collide with the organic compound subjected to LC separation at any energy higher than or equal to 1 eV and lower than or equal to 30 eV, a product ion is detected at least around m/z=(X−240).

In this specification, by analysis of an organic compound included in a light-emitting element by LC/MS, a skeleton of the organic compound in the light-emitting element can be identified. When the molecular weight of the organic compound included in a light-emitting element of one embodiment of the present invention is X, a product ion is detected at least around m/z=(X−240) by LC/MS analysis performed under the above-described conditions for the organic compound subjected to LC separation. The product ion which is detected in one embodiment of the present invention is derived from a proton adduct of a cation in a state where phenylcarbazole skeleton is eliminated from the organic compound, and is one of characteristic product ions representing the organic compound having the phenylcarbazole skeleton.

Example 5 which is described later shows an example in which a product ion is detected around m/z=246 by LC/MS analysis in a positive mode in which an argon gas is made to collide at an energy of 6 eV with an organic compound whose molecular weight is 486. Example 5 also shows an example in which a product ion is detected around m/z=322 by LC/MS analysis in a positive mode in which an argon gas is made to collide at an energy of 6 eV with an organic compound whose molecular weight is 562.

One embodiment of the present invention is a light-emitting element including an organic compound between a pair of electrodes. The molecular weight of the organic compound is greater than or equal to 450 and less than or equal to 1500. The absorption edge of the organic compound is at 380 nm or more. The organic compound includes a phenylcarbazole skeleton and an N-biphenyl-N-phenylamine skeleton. By LC/MS analysis in a positive mode in which an argon gas is made to collide at any energy higher than or equal to 1 eV and lower than or equal to 30 eV with the organic compound subjected to LC separation, a product ion of m/z derived from at least the N-biphenyl-N-phenylamine skeleton is detected.

One embodiment of the present invention is a light-emitting element including an organic compound between a pair of electrodes. The molecular weight of the organic compound is greater than or equal to 450 and less than or equal to 1500. The absorption edge of the organic compound is at 380 nm or more. The organic compound includes a phenylcarbazole skeleton and an N,N-bis-biphenylamine skeleton. By LC/MS analysis in a positive mode in which an argon gas is made to collide at any energy higher than or equal to 1 eV and lower than or equal to 30 eV with the organic compound subjected to LC separation, a product ion of m/z derived from at least the N,N-bis-biphenylamine skeleton is detected.

A product ion is detected in the light-emitting element of one embodiment of the present invention and derived from an N-biphenyl-N-phenylamine skeleton or an N,N-bis-biphenylamine skeleton. The product ion is derived from a radical cation in a state from which a phenylcarbazole skeleton is eliminated from the organic compound, and is one of characteristic product ions representing the organic compound having the phenylcarbazole skeleton and the N-biphenyl-N-phenylamine skeleton or the N,N-bis-biphenylamine skeleton.

In each of the above-described structures, a product ion may be detected at least around m/z=243 in a qualitative spectrum (a positive ion) of the organic compound measured with a TOF-SIMS in which $Bi_3^{++}$ is used as a primary ion and the amount of irradiation with the primary ion is greater than or equal to $8 \times 10^{10}$ ions/cm$^2$ and less than or equal to $1 \times 10^{12}$ ions/cm$^2$.

In this specification, by analysis of an organic compound in a light-emitting element with a TOF-SIMS, a skeleton of the organic compound in the light-emitting element can be identified. A product ion is detected at least around m/z=243 in a qualitative spectrum (a positive ion) of the organic compound included in the light-emitting element of one embodiment of the present invention which is measured with a TOF-SIMS under the above-described conditions. The product ion detected around m/z=243 in one embodiment of the present invention is derived from a proton adduct of a radical cation of phenylcarbazole skeleton, and is one of characteristic product ions representing the organic compound having the phenylcarbazole skeleton.

<<Structural Example of Light-Emitting Element>>

A light-emitting element illustrated in FIG. 1A includes an EL layer 203 between a first electrode 201 and a second electrode 205. In this embodiment, the first electrode 201 serves as an anode, and the second electrode 205 serves as a cathode.

When a voltage higher than the threshold voltage of the light-emitting element is applied between the first electrode 201 and the second electrode 205, holes are injected to the EL layer 203 from the first electrode 201 side and electrons are injected to the EL layer 203 from the second electrode 205 side. The injected electrons and holes are recombined in the EL layer 203 and a light-emitting substance contained in the EL layer 203 emits light.

The EL layer 203 includes at least a light-emitting layer containing a light-emitting substance. For the EL layer 203, either a low molecular compound or a high molecular compound can be used, and an inorganic compound may also be used.

In addition to the light-emitting layer, the EL layer 203 may further include one or more layers containing any of a substance with a high hole-injection property, a substance with a high hole-transport property, a substance with a high electron-transport property, a substance with a high electron-injection property, a substance with a bipolar property (a substance with a high electron-transport property and a high hole-transport property), and the like.

Further, when a plurality of light-emitting layers are provided in the EL layer and emission colors of the layers are made different, light emission of a desired color can be provided from the light-emitting element as a whole. For example, in a light-emitting element having two light-emitting layers, the emission colors of first and second light-emitting layers are complementary, so that the light-emitting element can emit white light as a whole. Note that the word "complementary" means color relationship in which an achromatic color is obtained when colors are mixed. In other words, when lights obtained from substances which emit light of complementary colors are mixed, white emission can be obtained. Further, the same applies to a light-emitting element having three or more light-emitting layers.

Figure 1B:
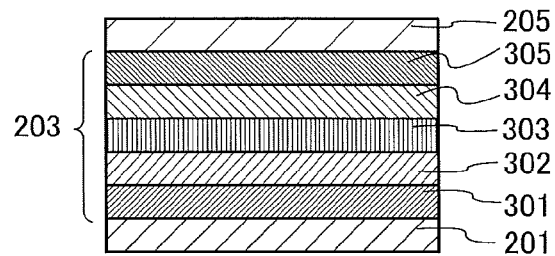

A light-emitting element illustrated in FIG. 1B includes the EL layer 203 between the first electrode 201 and the second electrode 205, and in the EL layer 203, a hole-injection layer 301, a hole-transport layer 302, the light-emitting layer 303, an electron-transport layer 304, and an electron-injection layer 305 are stacked in that order from the first electrode 201 side.

Figure 1C:
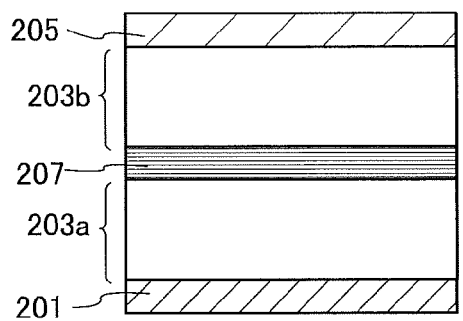
Figure 1D:
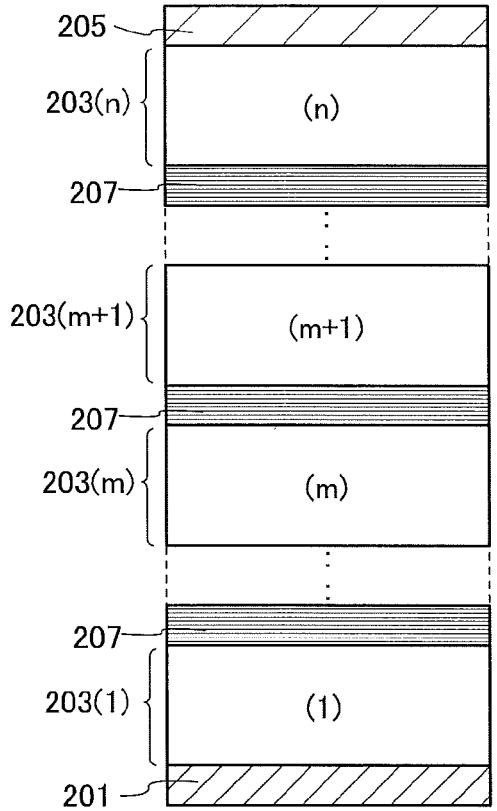

As in light-emitting elements illustrated in FIGS. 1C and 1D, a plurality of EL layers may be stacked between the first electrode 201 and the second electrode 205. In this case, an intermediate layer 207 is preferably provided between the stacked EL layers. The intermediate layer 207 includes at least a charge-generation region.

For example, the light-emitting element illustrated in FIG. 1C includes the intermediate layer 207 between a first EL layer 203a and a second EL layer 203b. The light-emitting element illustrated in FIG. 1D includes n EL layers (n is a natural number of 2 or more), and the intermediate layers 207 between the EL layers.

The following will show behaviors of electrons and holes in the intermediate layer 207 between the EL layer 203(m) and the EL layer 203(m+1). When a voltage higher than the threshold voltage of the light-emitting element is applied between the first electrode 201 and the second electrode 205, holes and electrons are generated in the intermediate layer 207, and the holes move into the EL layer 203(m+1) provided on the second electrode 205 side and the electrons move into the EL layer 203(m) provided on the first electrode 201 side. The holes injected into the EL layer 203(m+1) are recombined with the electrons injected from the second electrode 205 side, so that a light-emitting substance contained in the EL layer 203(m+1) emits light. Further, the electrons injected into the EL layer 203(m) are recombined with the holes injected from the first electrode 201 side, so that a light-emitting substance contained in the EL layer 203(m) emits light. Thus, the holes and electrons generated in the intermediate layer 207 cause light emission in the respective EL layers.

Note that the EL layers can be provided in contact with each other with no intermediate layer interposed therebetween when these EL layers allow the same structure as the intermediate layer to be formed therebetween. For example, when the charge-generation region is formed over one surface of an EL layer, another EL layer can be provided in contact with the surface.

Further, by forming EL layers to emit light of different colors from each other, a light-emitting element as a whole can provide light emission of a desired color. For example, in a light-emitting element having two EL layers, the emission colors of first and second EL layers are complementary, so that the light-emitting element can emit white light as a whole. This can be applied to a light-emitting element having three or more EL layers.

<<Organic Compound>>

Next, the organic compound having a phenylcarbazole skeleton which is included in the light-emitting element of one embodiment of the present invention is described in detail. The organic compound has a high hole-transport property. In the light-emitting element of one embodiment of the present invention, the organic compound is included in at least any one of a hole-injection layer, a hole-transport layer, and a light-emitting layer. In the case of being included in the light-emitting layer, the organic compound can be used as a light-emitting substance (guest material) or a host material in which a guest material is dispersed.

As an example the organic compound included in the light-emitting element of one embodiment of the present invention, an organic compound represented by a general formula (G1) is given.

In the general formula (G1), $R^1$ represents hydrogen, an alkyl group having 1 to 6 carbon atoms, or a substituted or unsubstituted phenyl group, $R^2$ to $R^6$ separately represent hydrogen, an alkyl group having 1 to 6 carbon atoms, a substituted or unsubstituted phenyl group, a substituted or unsubstituted naphthyl group, or a substituted or unsubstituted phenanthryl group, $Ar^1$ represents hydrogen, a substituted or unsubstituted phenyl group, a substituted or unsubstituted naphthyl group, or a substituted or unsubstituted phenanthryl group, and $Ar^2$ represents a substituted or unsubstituted phenyl group, a substituted or unsubstituted naphthyl group, or a substituted or unsubstituted phenanthryl group.

Note that in the case where the phenyl group, the naphthyl group, or the phenanthryl group includes a substituent, an alkyl group having 1 to 6 carbon atoms is given as an example of the substituent. A substituent is preferably included because in that case a bulkier structure can be obtained.

As for $R^2$ to $R^6$ in the general formula (G1), the following case is preferable: $R^4$ is a substituent other than hydrogen and $R^2$, $R^3$, $R^5$, and $R^6$ are each hydrogen (i.e., a phenylene group having $R^2$ to $R^6$ is a paraphenylene group). In this case, driving voltage of the light-emitting element is low. Further, as for $R^2$ to $R^6$ in the general formula (G1), the following cases are preferable: a case where $R^2$ is a substituent other than hydrogen and $R^3$, $R^4$, $R^5$, and $R^6$ are each hydrogen; a case where $R^3$ is a substituent other than hydrogen and $R^2$, $R^4$, $R^5$, and $R^6$ are each hydrogen; and the like (i.e., a case where a phenylene group having $R^2$ to $R^6$ is a metaphenylene group or an orthophenylene group). In these cases, a band gap of the organic compound is wide and the level of singlet excitation energy ($S_1$ level) and the level of triplet excitation energy ($T_1$ level) are high.

As examples of $R^1$ in the general formula (G1), structural formulae (s-1) to (s-5) and the like can be given in addition to hydrogen. As examples of $R^2$ to $R^6$ in the general formula (G1), structural formulae (s-1) to (s-8) and the like can be given in addition to hydrogen. As examples of $Ar^1$ in the general formula (G1), structural formulae (s-5) to (s-8) and the like can be given in addition to hydrogen. As examples of $Ar^2$ in the general formula (G1), structural formulae (s-5) to (s-8) and the like can be given in addition to hydrogen.

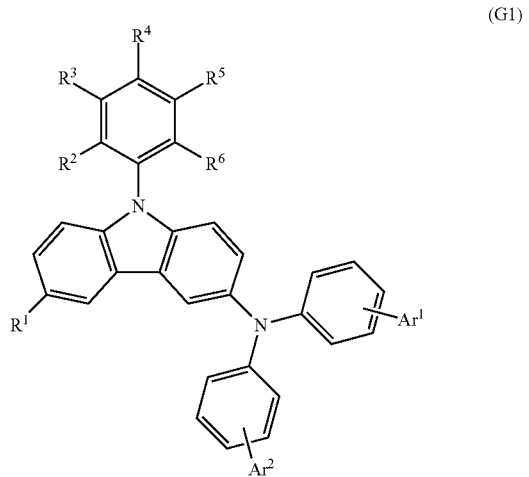

(G1)

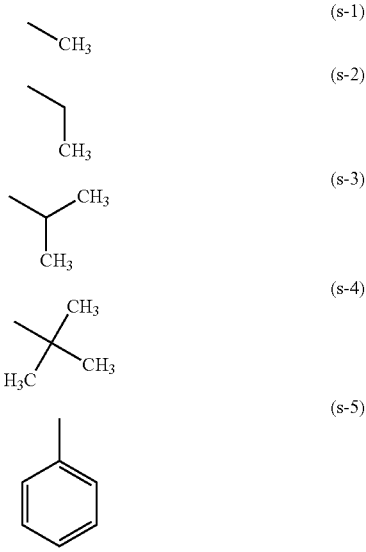

(s-1)

(s-2)

(s-3)

(s-4)

(s-5)

-continued

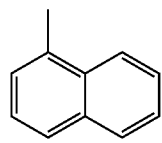
(s-6)

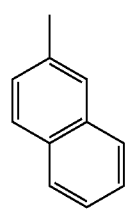
(s-7)

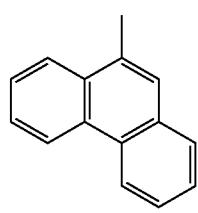
(s-8)

Note that an alkyl group which is represented by any of the structural formulae (s-1) to (s-4) is preferably used because, in that case, a higher amorphous property of the organic compound can be obtained. The use of such an alkyl group is preferable also because favorable solubility of the organic compound in an organic solvent can be achieved, which facilitates purification and solution preparation. Further, a phenyl group which is represented by the structural formula (s-5) is preferably used because, in that case, the band gap of the organic compound is wide and the $S_1$ level and the $T_1$ level are high. An aryl group which is represented by any of the structural formulae (s-5) to (s-8) is preferably used because, in that case, the carrier-transport property of the organic compound can be improved. A condensed ring is preferably included as shown in any of the structural formulae (s-6) to (s-8) because, in that case, the carrier-transport property of the organic compound can be further improved.

As an example of the organic compound included in the light-emitting element of one embodiment of the present invention, an organic compound represented by a general formula (G2) is given.

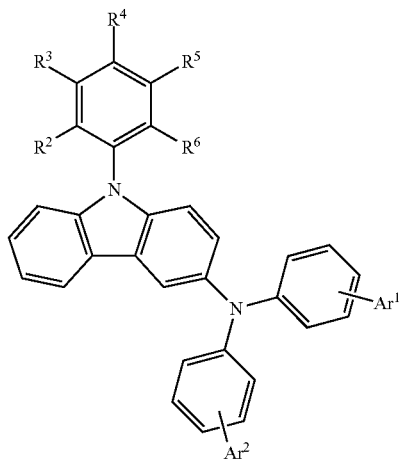
(G2)

In the general formula (G2), $R^2$ to $R^6$ separately represent hydrogen, an alkyl group having 1 to 6 carbon atoms, a substituted or unsubstituted phenyl group, a substituted or unsubstituted naphthyl group, or a substituted or unsubstituted phenanthryl group, $Ar^1$ represents hydrogen, a substituted or unsubstituted phenyl group, a substituted or unsubstituted naphthyl group, or a substituted or unsubstituted phenanthryl group, and $Ar^2$ represents a substituted or unsubstituted phenyl group, a substituted or unsubstituted naphthyl group, or a substituted or unsubstituted phenanthryl group.

As specific examples of $R^2$ to $R^6$, $Ar^1$, and $Ar^2$ in the general formula (G2), examples similar to those for the general formula (G1) can be given.

As an example of the organic compound included in the light-emitting element of one embodiment of the present invention, an organic compound represented by a general formula (G3) is given.

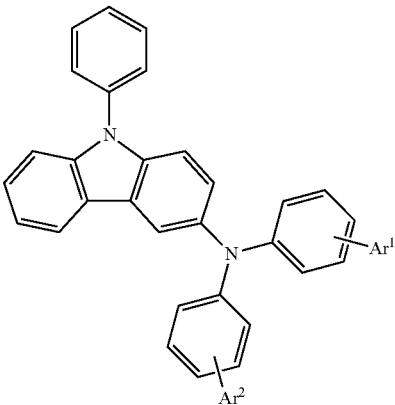
(G3)

In the general formula (G3), $Ar^1$ represents hydrogen, a substituted or unsubstituted phenyl group, a substituted or unsubstituted naphthyl group, or a substituted or unsubstituted phenanthryl group, and $Ar^2$ represents a substituted or unsubstituted phenyl group, a substituted or unsubstituted naphthyl group, or a substituted or unsubstituted phenanthryl group.

As specific examples of $Ar^1$ and $Ar^2$ in the general formula (G3), examples similar to those for the general formula (G1) can be given.

As an example of the organic compound included in the light-emitting element of one embodiment of the present invention, an organic compound represented by a general formula (G4) is given.

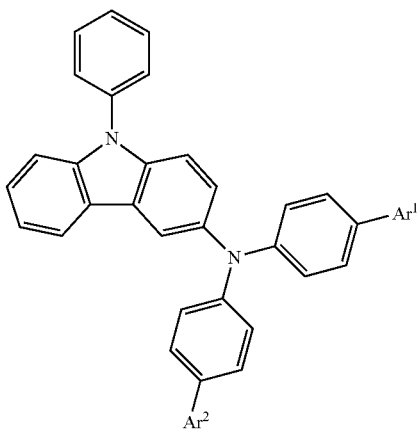
(G4)

In the general formula (G4), Ar¹ represents hydrogen, a substituted or unsubstituted phenyl group, a substituted or unsubstituted naphthyl group, or a substituted or unsubstituted phenanthryl group, and Ar² represents a substituted or unsubstituted phenyl group, a substituted or unsubstituted naphthyl group, or a substituted or unsubstituted phenanthryl group.

As specific examples of Ar¹ and Ar² in the general formula (G4), examples similar to those for the general formula (G1) can be given.

Note that in any of the general formulae (G1) to (G4), one or more alkyl groups each having 1 to 6 carbon atoms (e.g., a methyl group, an ethyl group, a tert-butyl group, or a cyclohexyl group), one or more phenyl groups, or one or more biphenyl groups may be further bonded.

By analysis of the organic compound represented by any of the general formulae (G1) to (G4) by LC/MS, a skeleton of the organic compound in the light-emitting element can be identified.

For example, in the organic compound represented by the general formula (G1), a product ion derived from at least one of structures represented by general formulae (P1-1) to (P1-10) (or structures showing the same or substantially the same m/z values as the structures represented by the general formulae (P1-1) to (P1-10)) is detected. It is likely that, particularly, a product ion derived from the structure represented by the general formula (P1-1) (or a structure showing the same or substantially the same m/z value as the structure represented by the general formula (P1-1)) is easily detected.

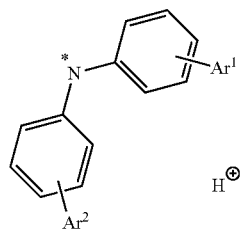
(P1-1)

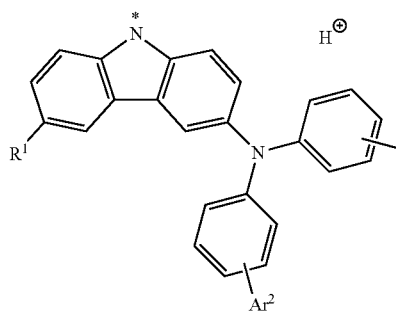
(P1-2)

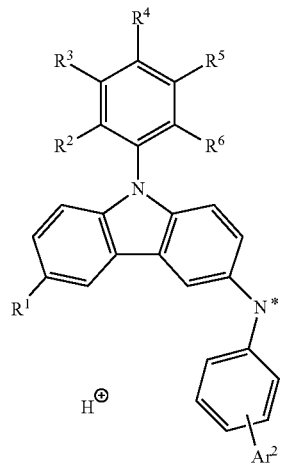
(P1-3)

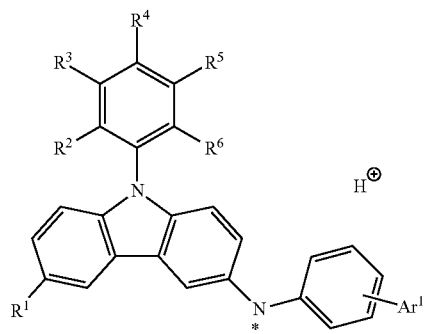
(P1-4)

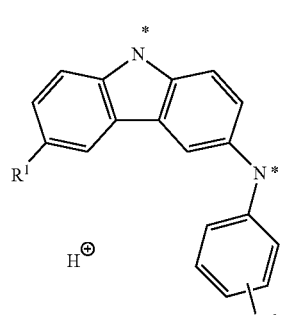
(P1-5)

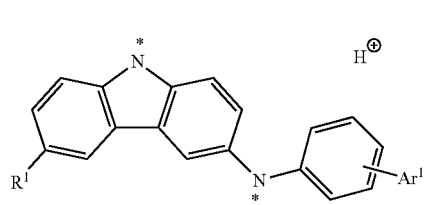
(P1-6)

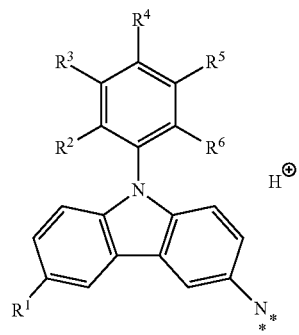
(P1-7)

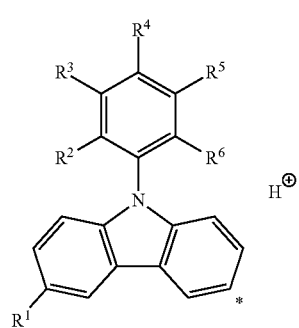
(P1-8)

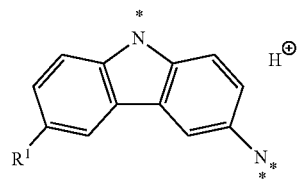
(P1-9)

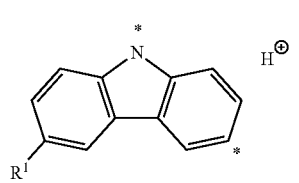
(P1-10)

For example, in the organic compound represented by the general formula (G2), a product ion derived from at least one of structures represented by general formulae (P2-1) to (P2-10) (or structures showing the same or substantially the same m/z values as the structures represented by the general formulae (P2-1) to (P2-10)) is detected. It is likely that, particularly, a product ion derived from the structure represented by the general formula (P2-1) (or a structure showing the same or substantially the same m/z value as the structure represented by the general formula (P2-1)) is easily detected.

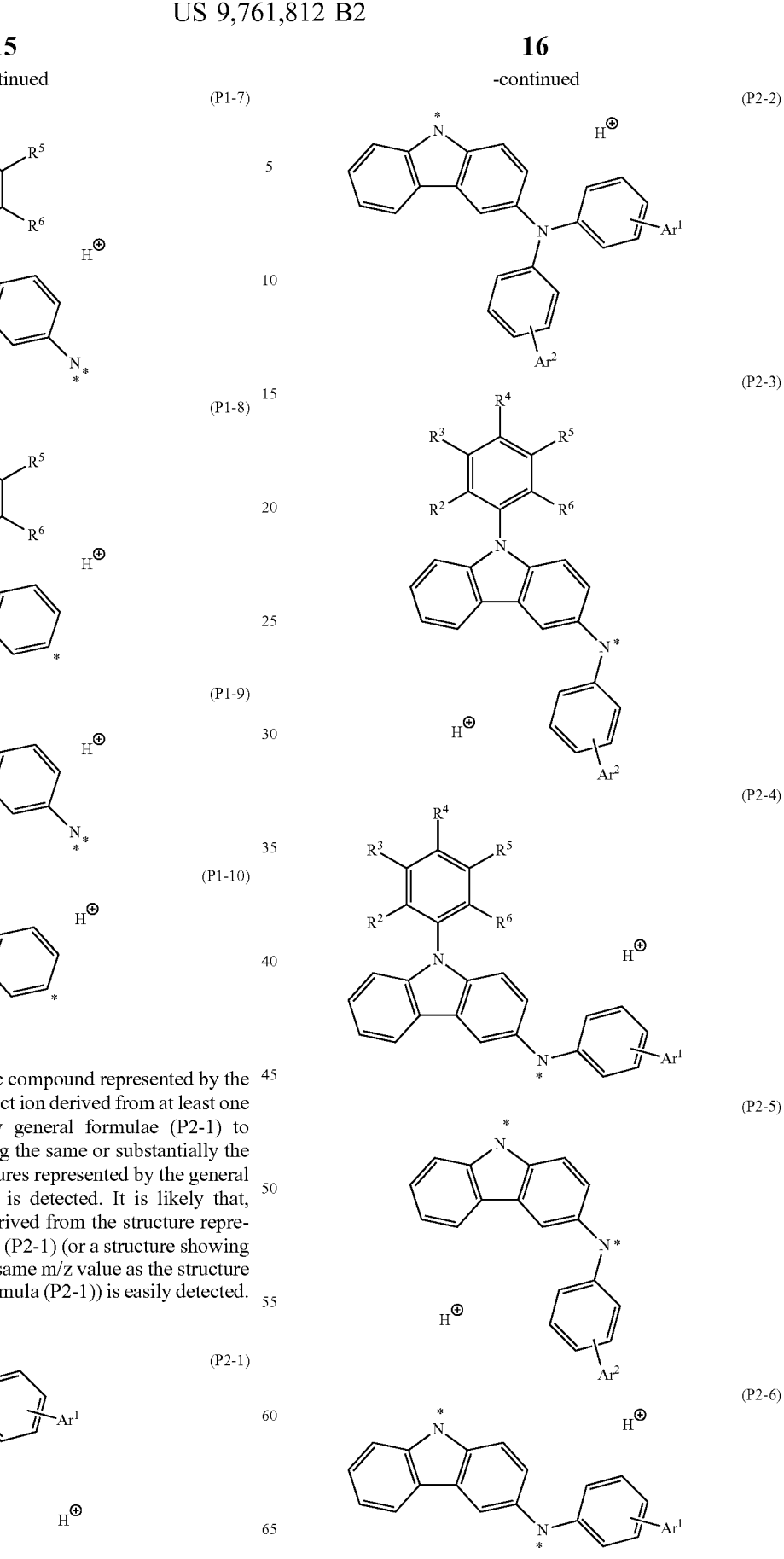

(P2-7)
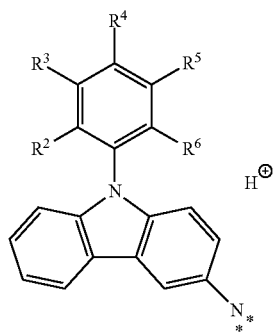

(P2-8)
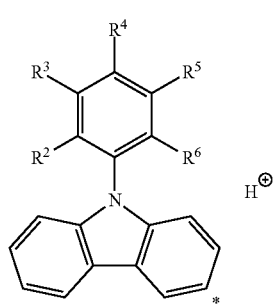

(P2-9)
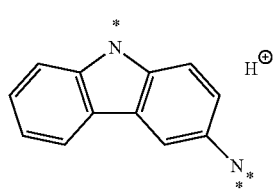

(P2-10)
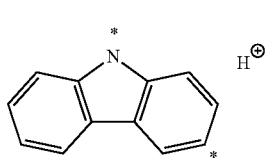

For example, in the organic compound represented by the general formula (G3), a product ion derived from at least one of structures represented by general formulae (P3-1) to (P3-10) (or structures showing the same or substantially the same m/z values as the structures represented by the general formulae (P3-1) to (P3-10)) is detected. It is likely that, particularly, a product ion derived from the structure represented by the general formula (P3-1) (or a structure showing the same or substantially the same m/z value as the structure represented by the general formula (P3-1)) is easily detected.

(P3-1)
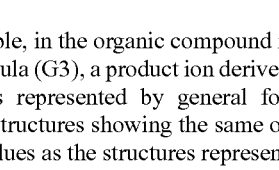

(P3-2)
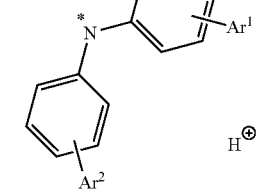

(P3-3)
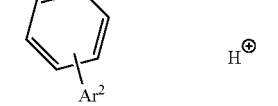

(P3-4)

(P3-5)

(P3-6)

-continued (P3-7)
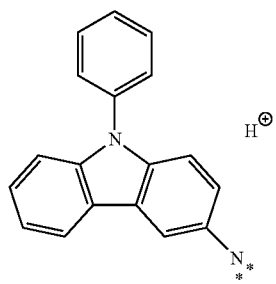

(P3-8)
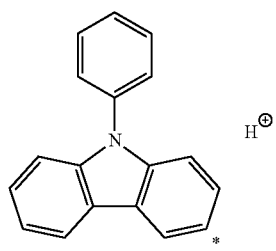

(P3-9)
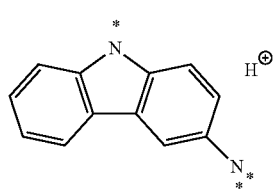

(P3-10)
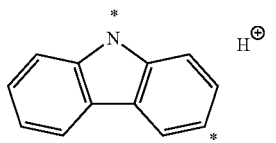

For example, in the organic compound represented by the general formula (G4), a product ion derived from at least one of structures represented by general formulae (P4-1) to (P4-10) (or structures showing the same or substantially the same m/z values as the structures represented by the general formulae (P4-1) to (P4-10)) is detected. It is likely that, particularly, a product ion derived from the structure represented by the general formula (P4-1) (or a structure showing the same or substantially the same m/z value as the structure represented by the general formula (P4-1)) is easily detected.

(P4-1)
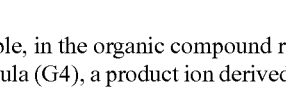

-continued (P4-2)
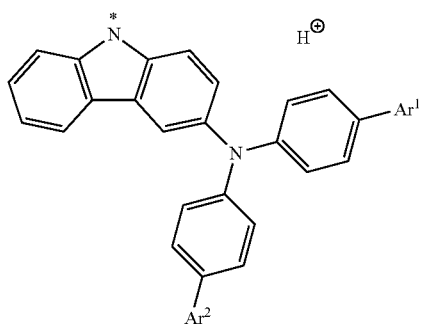

(P4-3)
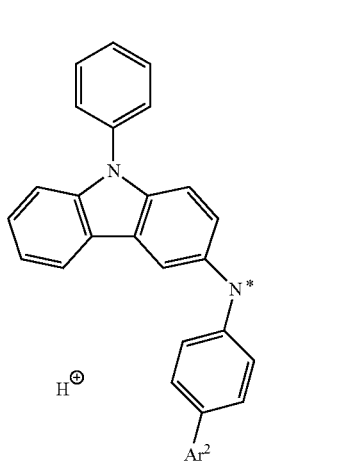

(P4-4)
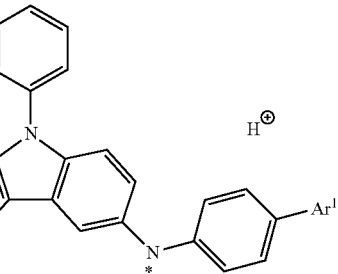

(P4-5)
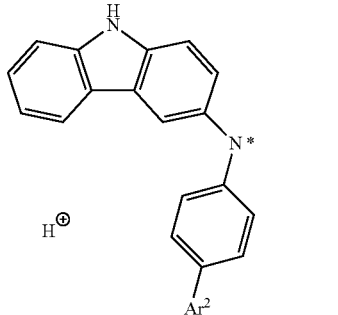

(P4-6)
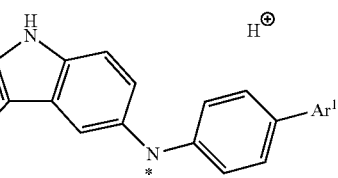

(P4-7)
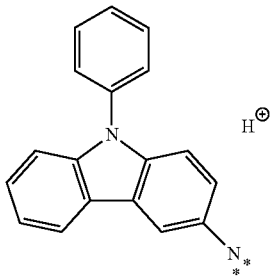
(P4-8)
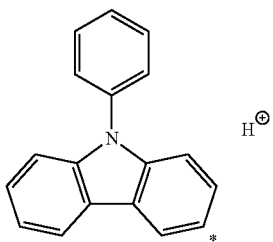
(P4-9)
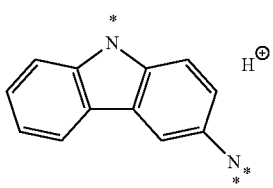
(P4-10)
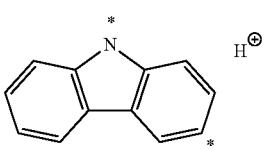
Specific examples of the structural formula of the above-described organic compound are structural formulae (100) to (116) given below. Note that the present invention is not limited to these formulae.
(100)
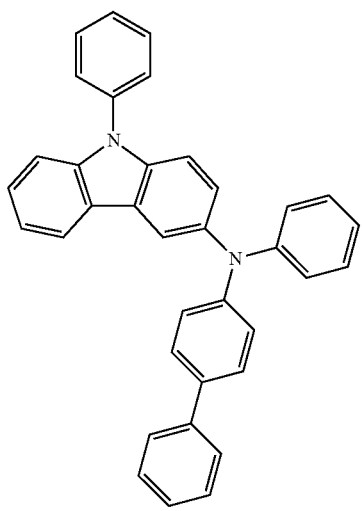
(101)
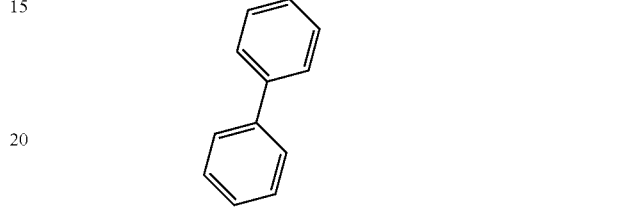
(102)
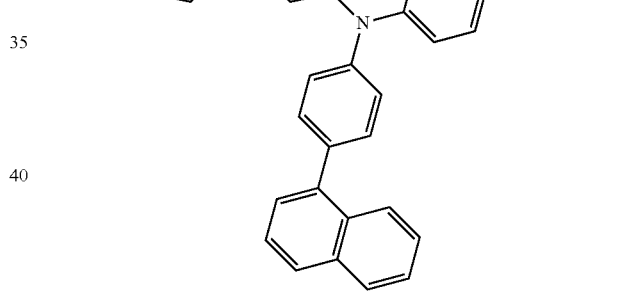
(103)
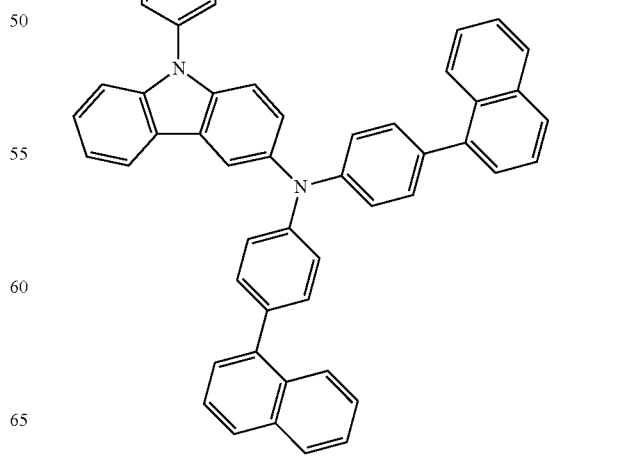

(104)
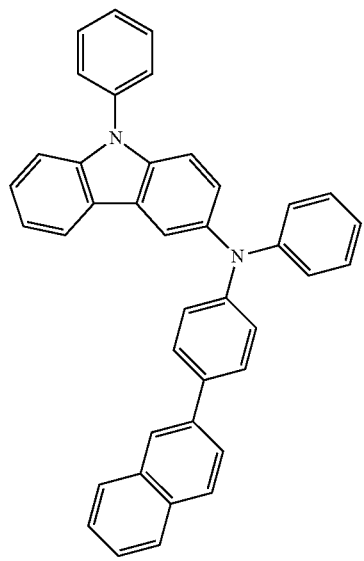
(105)
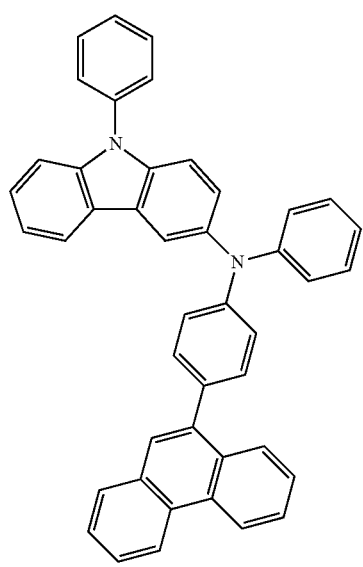
(106)
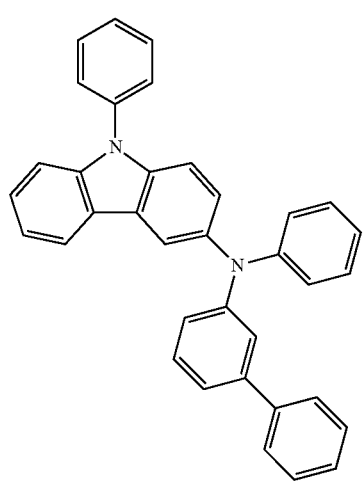
(107)
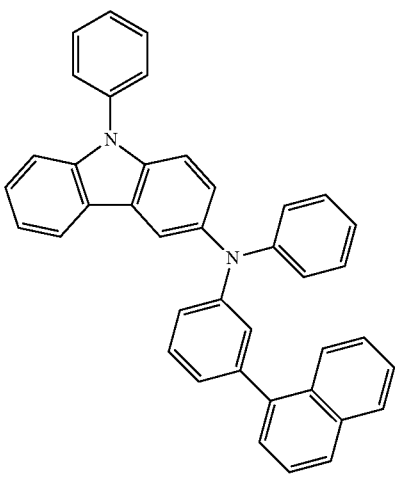
(108)
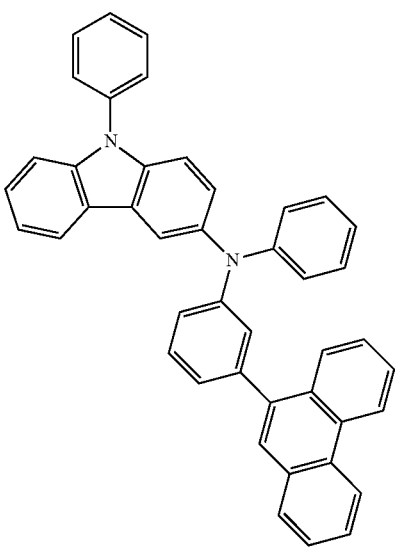
(109)
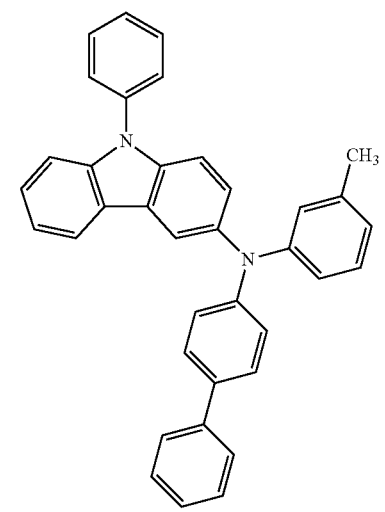

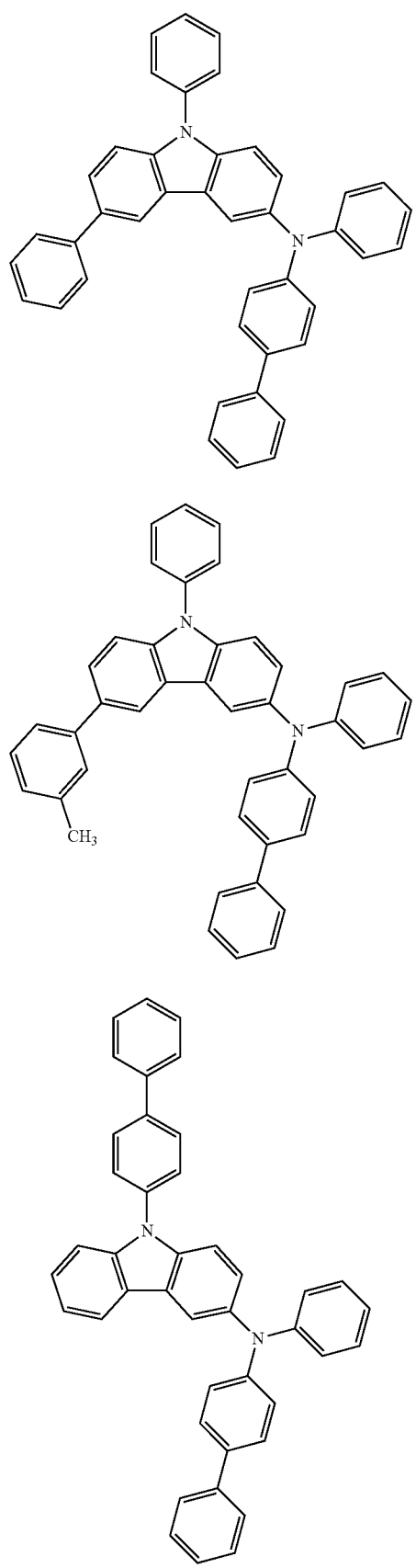
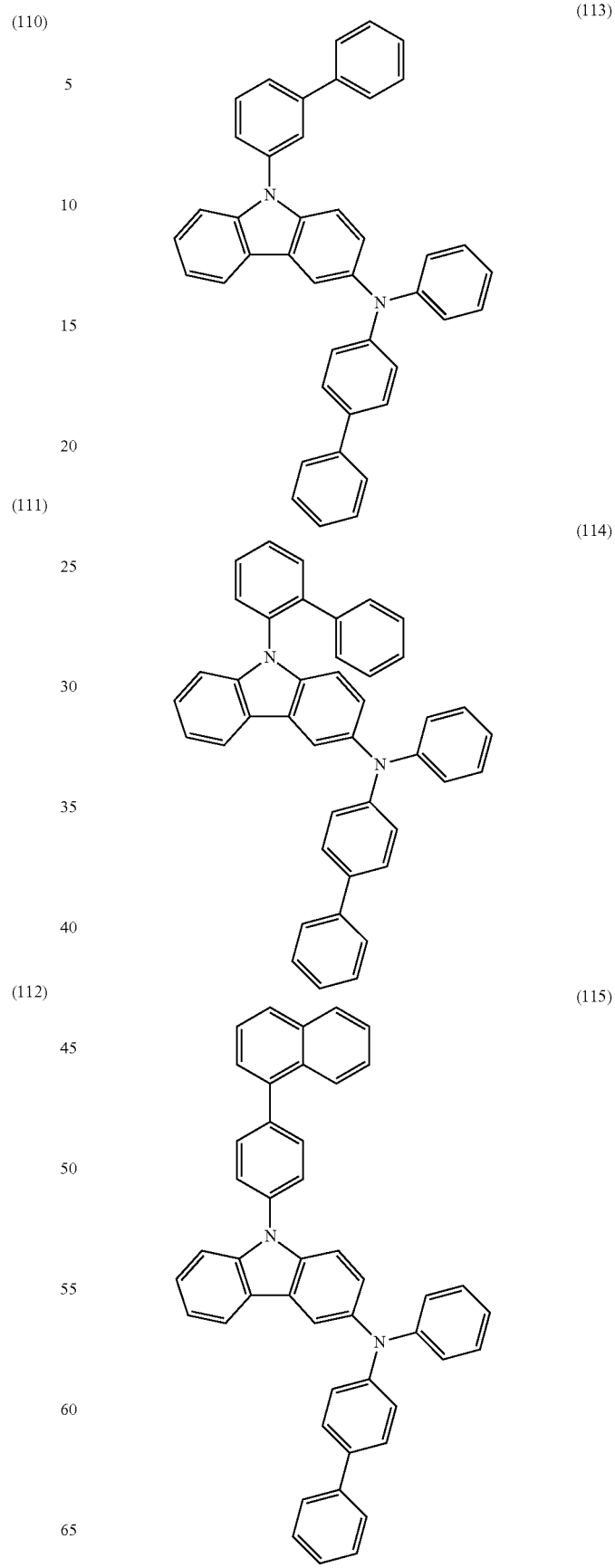

(116)

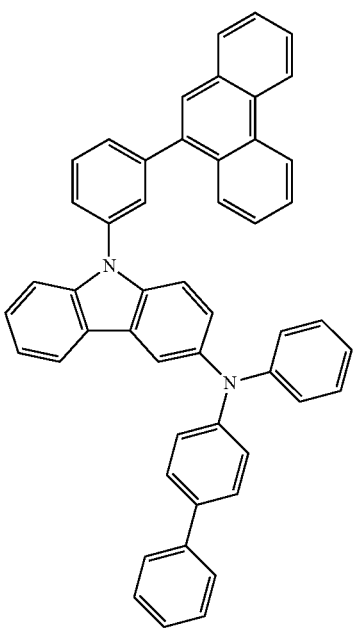

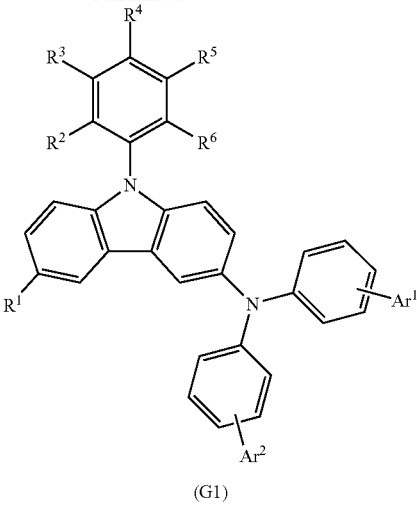

(G1)

Next, an example of a method for synthesizing the organic compound represented by the general formula (G1) is described.

The organic compound represented by the general formula (G1) is obtained by coupling of a carbazole compound (a1) having a halogen group ($X^1$) and a diarylamine derivative (a2) as shown in a synthesis scheme (A).

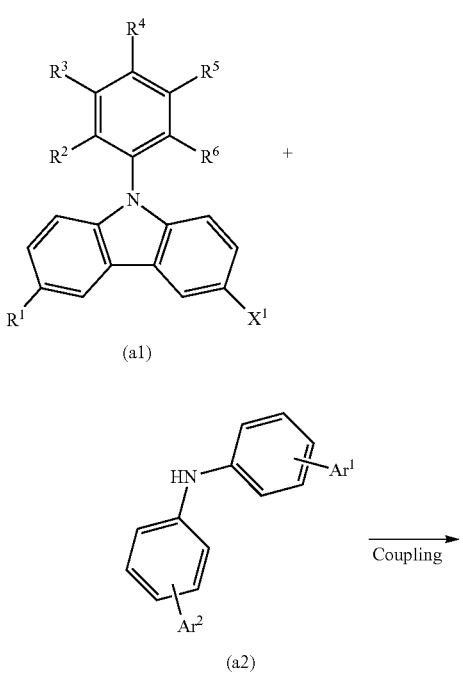

Note that the coupling reaction of the carbazole compound (a1) having a halogen group and the diarylamine derivative (a2) which is shown in the synthesis scheme (A) can be performed by a variety of methods and any of them is applicable; here, the case where the Buchwald-Hartwig reaction is used is described as an example.

A palladium catalyst can be used as a metal catalyst, and a mixture of a palladium complex and a ligand thereof can be used as a palladium catalyst. As examples of the palladium complex, bis(dibenzylideneacetone)palladium(0), palladium(II) acetate, and the like can be given. As the ligand, tri(tert-butyl)phosphine, tri(n-hexyl)phosphine, tricyclohexylphosphine, 1,1-bis(diphenylphosphino)ferrocene (abbreviation: DPPF), and the like can be given. As a substance which can be used as a base, an organic base such as sodium tert-butoxide, an inorganic base such as potassium carbonate, and the like can be given. In addition, the above reaction is preferably performed in a solution, and toluene, xylene, benzene, and the like can be given as a solvent that can be used in the above reaction. However, the catalyst, ligand, base, and solvent which can be used are not limited thereto. In addition, the reaction is more preferably performed under an inert atmosphere of nitrogen, argon, or the like.

Although examples of the synthesis methods are described above, the organic compound included in the light-emitting element of one embodiment of the present invention may be synthesized by any other synthesis method.

<<Materials of Light-Emitting Element>>

Examples of materials which can be used for layers which form the light-emitting element will be described below. Note that each layer is not limited to a single layer, and may be a stack of two or more layers.

<Anode>

The electrode serving as the anode (the first electrode 201 in this embodiment) can be formed using one or more kinds of conductive metals, alloys, conductive compounds, and the like. In particular, it is preferable to use a material with a high work function (4.0 eV or more). Examples include indium tin oxide (ITO), indium tin oxide containing silicon or silicon oxide, indium zinc oxide, indium oxide containing tungsten oxide and zinc oxide, graphene, gold, platinum, nickel, tungsten, chromium, molybdenum, iron, cobalt, copper, palladium, titanium, and a nitride of a metal material (e.g., titanium nitride).

When the anode is in contact with the charge-generation region, any of a variety of conductive materials can be used regardless of their work functions; for example, aluminum, silver, an alloy containing aluminum, or the like can be used.

<Cathode>

The electrode serving as the cathode (the second electrode 205 in this embodiment) can be formed using one or more kinds of conductive metals, alloys, conductive compounds, and the like. In particular, it is preferable to use a material with a low work function (3.8 eV or less). Examples include aluminum, silver, an element belonging to Group 1 or 2 of the periodic table (e.g., an alkali metal such as lithium or cesium, an alkaline earth metal such as calcium or strontium, or magnesium), an alloy containing any of these elements (e.g., Mg—Ag or Al—Li), a rare earth metal such as europium or ytterbium, and an alloy containing any of these rare earth metals.

Note that when the cathode is in contact with the charge-generation region, a variety of conductive materials can be used regardless of its work function. For example, ITO, silicon, or indium tin oxide containing silicon oxide can be used.

The electrodes may be formed separately by a vacuum evaporation method or a sputtering method. Alternatively, when a silver paste or the like is used, a coating method or an inkjet method may be used.

<Light-Emitting Layer>

As described above, the light-emitting element of this embodiment includes the light-emitting substance (guest material) in the light-emitting layer 303. As the guest material, a fluorescent compound, a phosphorescent compound, a substance exhibiting thermally activated delayed fluorescence, or the like can be used. Further, the light-emitting layer 303 may include another compound (host material or the like) in addition to the guest material.

Examples of the fluorescent compound that can be used for the light-emitting layer include the organic compounds represented by the above general formulae (G1) to (G4), N,N'-bis[4-(9-phenyl-9H-fluoren-9-yl)phenyl]-N,N'-diphenyl-pyrene-1,6-diamine (abbreviation: 1,6FLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N'''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM).

Examples of the phosphorescent compound that can be used for the light-emitting layer include bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis[2-(3',5'-bistrifluoromethylphenyl)pyridinato-N,$C^{2'}$]iridium(III)picolinate (abbreviation: [Ir(CF$_3$ppy)$_2$(pic)]), bis[2-(4',6'-difluorophenyl)pyridinato-N,$C^{2'}$]iridium(III) acetylacetonate (abbreviation: FIracac), tris(2-phenylpyridinato)iridium(III) (abbreviation: [Ir(ppy)$_3$]), bis(2-phenylpyridinato)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), bis(2,4-diphenyl-1,3-oxazolato-N,$C^{2'}$)iridium(III) acetylacetonate (abbreviation: [Ir(dpo)$_2$(acac)]), bis{2-[4'-(perfluorophenyl)phenyl]pyridinato-N,$C^{2'}$}iridium(III) acetylacetonate (abbreviation: [Ir(p-PF-ph)$_2$(acac)]), bis(2-phenylbenzothiazolato-N,$C^{2'}$)iridium(III)acetylacetonate (abbreviation: [Ir(bt)$_2$(acac)]), bis[2-(2'-benzo[4,5-a]thienyl)pyridinato-N,$C^{3'}$]iridium(III)(acetylacetonate) (abbreviation: [Ir(btp)$_2$(acac)]), bis(1-phenylisoquinolinato-N,$C^{2'}$)iridium(III)acetylacetonate (abbreviation: [Ir(piq)$_2$(acac)]), (acetylacetonato)bis[2,3-bis(4-fluorophenyl)quinoxalinato]iridium(III) (abbreviation: [Ir(Fdpq)$_2$(acac)]), (acetylacetonato)bis(2,3,5-triphenylpyrazinato)iridium(III) (abbreviation: [Ir(tppr)$_2$(acac)]), 2,3,7,8,12,13,17,18-octaethyl-21H,23H-porphineplatinum(II) (abbreviation: PtOEP), tris(acetylacetonato)(monophenanthroline)terbium (III) (abbreviation: Tb(acac)$_3$(Phen)), tris(1,3-diphenyl-1,3-propanedionato)(monophenanthroline)europium(III) (abbreviation: Eu(DBM)$_3$(Phen)), tris[1-(2-thenoyl)-3,3,3-trifluoroacetonato](monophenanthroline)europium(III) (abbreviation: Eu(TTA)$_3$(Phen)), and bis(2,3,5-triphenylpyrazinato)(dipivaloylmethanato)iridium(III) (abbreviation: [Ir(tppr)$_2$(dpm)]).

The guest material is preferably dispersed in the host material. When the light-emitting layer has the structure in which the guest material is dispersed in the host material, the crystallization of the light-emitting layer can be inhibited. Further, it is possible to suppress concentration quenching due to high concentration of the guest material, and thus the light-emitting element can have higher emission efficiency. A compound to be described below which easily accepts electrons or a compound to be described below which easily accepts holes can be used as the host material. For example, the organic compounds represented by the general formulae (G1) to (G4) may be used for the host material in the case where the guest material is a fluorescent compound or a phosphorescent compound exhibiting emission of light with a wavelength longer than or equal to that of yellow light.

Note that the $T_1$ level of the host material (or a material other than the guest material in the light-emitting layer) is preferably higher than the $T_1$ level of the guest material. This is because, when the $T_1$ level of the host material is lower than the $T_1$ level of the guest material, the triplet excitation energy of the guest material which is to contribute to light emission is quenched by the host material and accordingly the emission efficiency is decreased.

Here, for improvement in efficiency of energy transfer from a host material to a guest material, Förster mechanism (dipole-dipole interaction) and Dexter mechanism (electron exchange interaction), which are known as mechanisms of energy transfer between molecules, are considered. According to the mechanisms, it is preferable that an emission spectrum of a host material (fluorescence spectrum in energy transfer from a singlet excited state, phosphorescence spectrum in energy transfer from a triplet excited state) largely overlap with an absorption spectrum of a guest material (specifically, spectrum in an absorption band on the longest wavelength (lowest energy) side).

However, in general, it is difficult to obtain an overlap between a fluorescence spectrum of a host material and an absorption spectrum in an absorption band on the longest wavelength (lowest energy) side of a guest material. The reason for this is as follows: if the fluorescence spectrum of the host material overlaps with the absorption spectrum in the absorption band on the longest wavelength (lowest energy) side of the guest material, since a phosphorescence spectrum of the host material is located on a longer wavelength (lower energy) side as compared to the fluorescence spectrum, the $T_1$ level of the host material becomes lower than the $T_1$ level of the phosphorescent compound and the above-described problem of quenching occurs; yet, when the host material is designed in such a manner that the $T_1$ level of the host material is higher than the $T_1$ level of the phosphorescent compound to avoid the problem of quenching, the fluorescence spectrum of the host material is shifted to the shorter wavelength (higher energy) side, and thus the fluorescence spectrum does not have any overlap with the absorption spectrum in the absorption band on the longest wavelength (lowest energy) side of the guest material. For that reason, in general, it is difficult to obtain an overlap between a fluorescence spectrum of a host material and an absorption spectrum in an absorption band on the longest wavelength (lowest energy) side of a guest material so as to maximize energy transfer from a singlet excited state of a host material.

Thus, it is preferable that in a light-emitting layer of a light-emitting element of one embodiment of the present invention which uses a phosphorescent compound as a guest material, a third substance be contained in addition to the phosphorescent compound and the host material (which are respectively regarded as a first substance and a second substance contained in the light-emitting layer), and a combination of the host material the third substance form an exciplex (also referred to as excited complex). In that case, the host material and the third substance form an exciplex at the time of recombination of carriers (electrons and holes) in the light-emitting layer. Thus, in the light-emitting layer, fluorescence spectra of the host material and the third substance are converted into an emission spectrum of the exciplex which is located on a longer wavelength side. Moreover, when the host material and the third substance are selected such that the emission spectrum of the exciplex has a large overlap with the absorption spectrum of the guest material, the efficiency of energy transfer from a singlet excited state can be maximized. Note that also in the case of a triplet excited state, energy transfer from the exciplex, not the host material, is assumed to occur. In one embodiment of the present invention to which such a structure is applied, energy transfer efficiency can be improved owing to energy transfer utilizing an overlap between an emission spectrum of an exciplex and an absorption spectrum of a phosphorescent compound; accordingly, a light-emitting element with high external quantum efficiency can be provided.

As the guest material, a phosphorescent compound described above or the like can be used. Although any combination of the host material and the third substance can be used as long as an exciplex is formed, a compound which easily accepts electrons (a compound having an electron-trapping property) and a compound which easily accepts holes (a compound having a hole-trapping property) are preferably combined.

Examples of a compound which easily accepts holes and which can be used as the host material or the third substance include the organic compounds represented by the general formulae (G1) to (G4), a π-electron rich heteroaromatic compound (e.g., a carbazole derivative or an indole derivative) and an aromatic amine compound.

Specifically, the following examples can be given: 4-phenyl-4'-(9-phenyl-9H-carbazol-3-yl)triphenylamine (abbreviation: PCBA1BP), 4,4'-di(1-naphthyl)-4''-(9-phenyl-9H-carbazol-3-yl)triphenylamine (abbreviation: PCBNBB), 3-[N-(1-naphthyl)-N-(9-phenylcarbazol-3-yl)amino]-9-phenylcarbazole (abbreviation: PCzPCN1), 4,4',4''-tris[N-(1-naphthyl)-N-phenylamino]triphenylamine (abbreviation: 1'-TNATA), 2,7-bis[N-(4-diphenylaminophenyl)-N-phenylamino]-spiro-9,9'-bifluorene (abbreviation: DPA2SF), N,N'-bis(9-phenylcarbazol-3-yl)-N,N'-diphenylbenzene-1,3-diamine (abbreviation: PCA2B), N-(9,9-dimethyl-2-diphenylamino-9H-fluoren-7-yl)diphenylamine (abbreviation: DPNF), N,N',N''-triphenyl-N,N',N''-tris(9-phenylcarbazol-3-yl)benzene-1,3,5-triamine (abbreviation: PCA3B), 2-[N-(9-phenylcarbazol-3-yl)-N-phenylamino]spiro-9,9'-bifluorene (abbreviation: PCASF), 2-[N-(4-diphenylaminophenyl)-N-phenylamino]spiro-9,9'-bifluorene (abbreviation: DPASF), N,N'-bis[4-(carbazol-9-yl)phenyl]-N,N'-diphenyl-9,9-dimethylfluorene-2,7-diamine (abbreviation: YGA2F), N,N'-bis(3-methylphenyl)-N,N'-diphenyl-[1,1'-biphenyl]-4,4'-diamine (abbreviation: TPD), 4,4'-bis[N-(4-diphenylaminophenyl)-N-phenylamino]biphenyl (abbreviation: DPAB), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 4,4'-bis(N-{4-[N'-(3-methylphenyl)-N'-phenylamino]phenyl}-N-phenylamino)biphenyl (abbreviation: DNTPD), and 3,6-bis[N-(4-diphenylaminophenyl)-N-(1-naphthyl)amino]-9-phenylcarbazole (abbreviation: PCzTPN2).

The following examples can also be given: aromatic amine compounds such as 4,4'-bis[N-(1-naphthyl)-N-phenylamino]biphenyl (abbreviation: NPB or α-NPD), 4,4',4"-tris(N,N-diphenylamino)triphenylamine (abbreviation: TDATA), 4,4',4"-tris[N-(3-methylphenyl)-N-phenylamino] triphenylamine (abbreviation: MTDATA), 4,4'-bis[N-(spiro-9,9'-bifluoren-2-yl)-N-phenylamino]biphenyl (abbreviation: BSPB), 4,4',4"-tris(carbazol-9-yl)triphenylamine(abbreviation: TCTA), 4-phenyl-4'-(9-phenylfluoren-9-yl)triphenylamine (abbreviation: BPAFLP), and 4,4'-bis[N-(9,9-dimethylfluoren-2-yl)-N-phenylamino]biphenyl (abbreviation: DFLDPBi); and carbazole derivatives such as 4,4'-di(N-carbazolyl)biphenyl (abbreviation: CBP), 9-[4-(10-phenyl-9-anthracenyl)phenyl]-9H-carbazole (abbreviation: CzPA), and 9-phenyl-3-[4-(10-phenyl-9-anthryl)phenyl]-9H-carbazole (abbreviation: PCzPA). In addition, high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl] phenyl-M-phenylamino}phenyl)methacrylamide] (abbreviation: PTPDMA), and poly[N,N'-bis(4-butylphenyl)-N,N'-bis(phenyl)benzidine] (abbreviation: Poly-TPD) can be given.

Examples of the compound which easily accepts electrons and which can be used as the host material or the third substance include a π-electron deficient heteroaromatic compound such as a nitrogen-containing heteroaromatic compound, a metal complex having a quinoline skeleton or a benzoquinoline skeleton, and a metal complex having an oxazole-based ligand or a thiazole-based ligand.

Specific examples include the following: metal complexes such as bis(10-hydroxybenzo[h]quinolinato)berylium(II) (abbreviation: BeBq$_2$), bis(2-methyl-8-quinolinolato) (4-phenylphenolato)aluminum(III) (abbreviation: BAlq), bis(8-quinolinolato)zinc(II) (abbreviation: Znq), bis [2-(2-hydroxyphenyl)benzoxazolato]zinc (abbreviation: Zn(BOX)$_2$), and bis[2-(2-hydroxyphenyl)benzothiazolato] zinc(II) (abbreviation: Zn(BTZ)$_2$); heterocyclic compounds having polyazole skeletons, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds having quinoxaline skeletons or dibenzoquinoxaline skeletons, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl) phenyl]dibenzo[f,h]quinoxaline (abbreviation: 7mDBTPDBq-II), 6-[3-(dibenzothiophen-4-yl)phenyl]dibenzo[f,h] quinoxaline (abbreviation: 6mDBTPDBq-II), and 2-[3'-(9H-carbazol-9-yl)biphenyl-3-yl]dibenzo[f,h]quinoxaline (abbreviation: 2mCzBPDBq); heterocyclic compounds having diazine skeletons (pyrimidine skeletons or pyrazine skeletons), such as 4,6-bis[3-(phenanthren-9-yl)phenyl]pyrimidine (abbreviation: 4,6mPnP2Pm), 4,6-bis[3-(9H-carbazol-9-yl)phenyl]pyrimidine (abbreviation: 4,6mCzP2Pm), and 4,6-bis[3-(4-dibenzothienyl)phenyl]pyrimidine (abbreviation: 4,6mDBTP2Pm-II); heterocyclic compounds having pyridine skeletons, such as 3,5-bis[3-(9H-carbazol-9-yl) phenyl]pyridine (abbreviation: 35DCzPPy), 1,3,5-tri[3-(3-pyridyl)phenyl]benzene (abbreviation: TmPyPB), and 3,3', 5,5'-tetra[(m-pyridyl)-phen-3-yl]biphenyl (abbreviation: BP4 mPy). Among the above-described compounds, the heterocyclic compounds having quinoxaline skeletons or dibenzoquinoxaline skeletons, the heterocyclic compounds having diazine skeletons, and the heterocyclic compounds having pyridine skeletons have favorable reliability and can preferably be used.

The following examples can also be given: metal complexes having quinoline skeletons or benzoquinoline skeletons, such as tris(8-quinolinolato)aluminum(III) (abbreviation: Alq) and tris(4-methyl-8-quinolinolato)aluminum (abbreviation: Almq$_3$); and heteroaromatic compounds such as bathophenanthroline (abbreviation: BPhen), bathocuproine (abbreviation: BCP), 3-(4-tert-butylphenyl)-4-(4-ethylphenyl)-5-(4-biphenylyl)-1,2,4-triazole (abbreviation: p-EtTAZ), and 4,4'-bis(5-methylbenzoxazol-2-yl)stilbene (abbreviation: BzOs). In addition, high molecular compounds such as poly(2,5-pyridinediyl) (abbreviation: PPy), poly[(9,9-dihexylfluorene-2,7-diyl)-co-(pyridine-3,5-diyl)] (abbreviation: PF-Py) and poly[(9,9-dioctylfluorene-2,7-diyl)-co-(2,2'-bipyridine-6,6'-diyl)] (abbreviation: PF-BPy) can also be given.

The materials which can be used as the host material or the third substance are not limited to the above materials as long as a combination of the material used as the host material and the material used as the third substance can form an exciplex, an emission spectrum of the exciplex overlaps with an absorption spectrum of the guest material, and a peak of the emission spectrum of the exciplex is located on a longer wavelength side than a peak of the absorption spectrum of the guest material.

Note that when a compound which easily accepts electrons and a compound which easily accepts holes are used for the host material and the third substance, carrier balance can be controlled by the mixture ratio of the compounds. Specifically, the ratio of the host material to the third substance is preferably from 1:9 to 9:1.

Further, the exciplex may be formed at the interface between two layers. For example, when a layer containing the compound which easily accepts electrons and a layer containing the compound which easily accepts holes are stacked, the exciplex is formed in the vicinity of the interface thereof. These two layers may be used as the light-emitting layer in the light-emitting element of one embodiment of the present invention. In that case, the phosphorescent compound may be added to the vicinity of the interface. The phosphorescent compound may be added to one of the two layers or both.

<Hole-Transport Layer>

The hole-transport layer 302 contains a substance with a high hole-transport property.

The substance with a high hole-transport property is preferably a substance with a property of transporting more holes than electrons, and is especially preferably a substance with a hole mobility of $10^{-6}$ cm$^2$/Vs or more.

For the hole-transport layer 302, it is possible to use any of the compounds which easily accept holes and are described, e.g., the organic compounds represented by the general formulae (G1) to (G4), as examples of the substance applicable to the light-emitting layer 303.

It is also possible to use an aromatic hydrocarbon compound such as 2-tert-butyl-9,10-di(2-naphthyl)anthracene (abbreviation: t-BuDNA), 9,10-di(2-naphthyl)anthracene (abbreviation: DNA), or 9,10-diphenylanthracene (abbreviation: DPAnth).

<Electron-Transport Layer>

The electron-transport layer 304 contains a substance with a high electron-transport property.

The substance with a high electron-transport property is preferably an organic compound having a property of transporting more electrons than holes, and is especially preferably a substance with an electron mobility of $10^{-6}$ cm$^2$/Vs or more.

For the electron-transport layer 304, it is possible to use any of the compounds which easily accept electrons and are described as examples of the substance applicable to the light-emitting layer 303.

<Hole-Injection Layer>

The hole-injection layer 301 contains a substance with a high hole-injection property.

Examples of the substance with a high hole-injection property include metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide.

A phthalocyanine-based compound such as phthalocyanine (abbreviation: H$_2$Pc), or copper(II) phthalocyanine (abbreviation: CuPc) can also be used.

Further alternatively, it is possible to use an aromatic amine compound which is a low molecular organic compound, such as TDATA, MTDATA, DPAB, DNTPD, 1,3,5-tris[N-(4-diphenylaminophenyl)-N-phenylamino]benzene (abbreviation: DPA3B), PCzPCA1, PCzPCA2, or PCzPCN1.

Further alternatively, it is possible to use a high molecular compound such as PVK, PVTPA, PTPDMA, or Poly-TPD, or a high molecular compound to which acid is added, such as poly(3,4-ethylenedioxythiophene)/poly(styrenesulfonic acid) (abbreviation: PEDOT/PSS) or polyaniline/poly(styrenesulfonic acid) (abbreviation: PAni/PSS).

The hole-injection layer 301 may serve as the charge-generation region. When the hole-injection layer 301 in contact with the anode serves as the charge-generation region, a variety of conductive materials can be used for the anode regardless of their work functions. Materials contained in the charge-generation region will be described later.

<Electron-Injection Layer>

The electron-injection layer 305 contains a substance with a high electron-injection property.

Examples of the substance with a high electron-injection property include an alkali metal, an alkaline earth metal, a rare earth metal, and a compound thereof (e.g., an oxide thereof, a carbonate thereof, and a halide thereof), such as lithium, cesium, calcium, lithium oxide, lithium carbonate, cesium carbonate, lithium fluoride, cesium fluoride, calcium fluoride, and erbium fluoride.

The electron-injection layer 305 may serve as the charge-generation region. When the electron-injection layer 305 in contact with the cathode serves as the charge-generation region, any of a variety of conductive materials can be used for the cathode regardless of their work functions. Materials contained in the charge-generation region will be described later.

<Charge-Generation Region>

The charge-generation region may have either a structure in which an electron acceptor (acceptor) is added to an organic compound with a high hole-transport property or a structure in which an electron donor (donor) is added to an organic compound with a high electron-transport property. Alternatively, these structures may be stacked.

As examples of an organic compound with a high hole-transport property, the above materials which can be used for the hole-transport layer, e.g., the organic compounds represented by the above general formulae (G1) to (G4), can be given, and as examples of an organic compound with a high electron-transport property, the above materials which can be used for the electron-transport layer can be given.

Further, as examples of the electron acceptor, 7,7,8,8-tetracyano-2,3,5,6-tetrafluoroquinodimethane (abbreviation: F4-TCNQ), chloranil, and the like can be given. In addition, a transition metal oxide can be given. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is especially preferable because it is stable in the air, has a low hygroscopic property, and is easily handled.

Further, as the electron donor, it is possible to use an alkali metal, an alkaline earth metal, a rare earth metal, a metal belonging to Group 2 or Group 13 of the periodic table, or an oxide or a carbonate thereof. Specifically, lithium, cesium, magnesium, calcium, ytterbium, indium, lithium oxide, cesium carbonate, or the like is preferably used. Alternatively, an organic compound such as tetrathianaphthacene may be used as the electron donor.

The above-described layers included in the EL layer 203 and the intermediate layer 207 can be formed separately by any of the following methods: an evaporation method (including a vacuum evaporation method), a transfer method, a printing method, an inkjet method, a coating method, and the like.

By use of the light-emitting element described in this embodiment, a passive matrix light-emitting device or an active matrix light-emitting device in which driving of the light-emitting element is controlled by a transistor can be manufactured. Furthermore, the light-emitting device can be applied to an electronic device, a lighting device, or the like.

As described above, a light-emitting element of one embodiment of the present invention includes an organic compound having a phenylcarbazole skeleton. Since the organic compound has a high hole-transport property, low voltage driving and high efficiency of a light-emitting element can be achieved. Further, by performing LC/MS analysis or TOF-SIMS analysis on the organic compound included in the light-emitting element of one embodiment of the present invention, a skeleton of the organic compound can be identified. Specifically, by performing LC/MS analysis or TOF-SIMS analysis on the organic compound, a characteristic product ion representing the organic compound having the phenylcarbazole skeleton can be detected.

This embodiment can be freely combined with other embodiments.

Embodiment 2

In this embodiment, a light-emitting device of one embodiment of the present invention will be described with reference to FIGS. 2A and 2B and FIGS. 3A to 3C. The light-emitting device of this embodiment includes the light-emitting element of one embodiment of the present invention. Since the light-emitting element has high emission efficiency, a light-emitting device with low power consumption can be provided.

FIG. 2A is a plan view of a light-emitting device of one embodiment of the present invention, and FIG. 2B is a cross-sectional view taken along dashed-dotted line A-B in FIG. 2A.

In the light-emitting device of this embodiment, a light-emitting element 403 is included in a space 415 surrounded by a support substrate 401, a sealing substrate 405, and a sealing material 407. The light-emitting element 403 is a light-emitting element having a bottom-emission structure; specifically, a first electrode 421 which transmits visible light is provided over the support substrate 401, an EL layer 423 is provided over the first electrode 421, and a second electrode 425 which reflects visible light is provided over the EL layer 423. The light-emitting element 403 is a light-emitting element to which one embodiment of the present invention in Embodiment 1 is applied.

A first terminal 409a is electrically connected to an auxiliary wiring 417 and the first electrode 421. An insulating layer 419 is provided over the first electrode 421 in a region which overlaps with the auxiliary wiring 417. The first terminal 409a is electrically insulated from the second electrode 425 by the insulating layer 419. A second terminal 409b is electrically connected to the second electrode 425. Note that although the first electrode 421 is formed over the auxiliary wiring 417 in this embodiment, the auxiliary wiring 417 may be formed over the first electrode 421.

A light extraction structure 411a is preferably provided at the interface between the support substrate 401 and the atmosphere. When provided at the interface between the support substrate 401 and the atmosphere, the light extraction structure 411a can reduce light which cannot be extracted to the atmosphere due to total reflection, resulting in an increase in the light extraction efficiency of the light-emitting device.

In addition, a light extraction structure 411b is preferably provided at the interface between the light-emitting element 403 and the support substrate 401. When the light extraction structure 411b has unevenness, a planarization layer 413 is preferably provided between the light extraction structure 411b and the first electrode 421. Accordingly, the first electrode 421 can be a flat film, and generation of leakage current in the EL layer 423 due to the unevenness of the first electrode 421 can be prevented. Further, because of the light extraction structure 411b at the interface between the planarization layer 413 and the support substrate 401, light which cannot be extracted to the atmosphere due to total reflection can be reduced, so that the light extraction efficiency of the light-emitting device can be increased.

As a material of the light extraction structure 411a and the light extraction structure 411b, a resin can be used, for example. Alternatively, for the light extraction structure 411a and the light extraction structure 411b, a hemispherical lens, a micro lens array, a film provided with an uneven surface structure, a light diffusing film, or the like can be used. For example, the light extraction structure 411a and the light extraction structure 411b can be formed by attaching the lens or film to the support substrate 401 with an adhesive or the like which has substantially the same refractive index as the support substrate 401 or the lens or film.

The surface of the planarization layer 413 which is in contact with the first electrode 421 is flatter than the surface of the planarization layer 413 which is in contact with the light extraction structure 411b. As a material of the planarization layer 413, glass, liquid, a resin, or the like having a light-transmitting property and a high refractive index can be used.

Figure 3A:
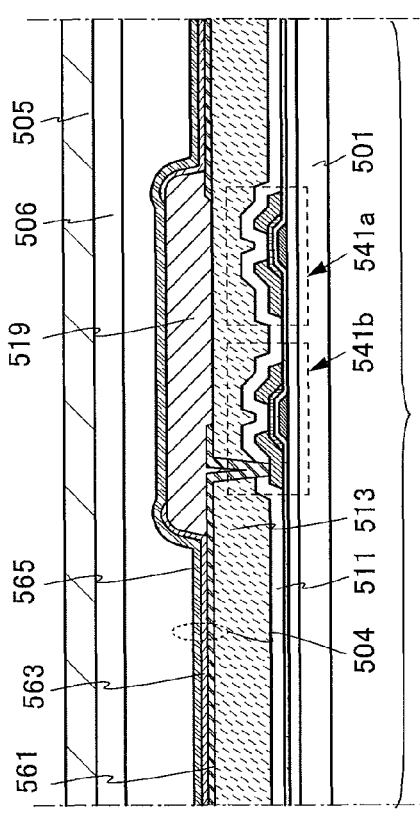
FIGS. 3A to 3C show examples of a light-emitting device.
Figure 3C:
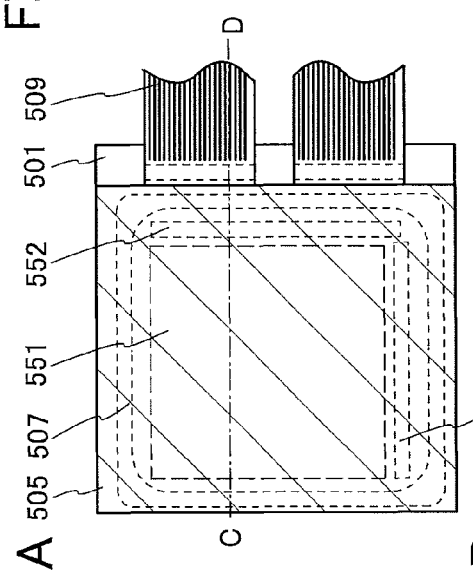
Figure 3B:
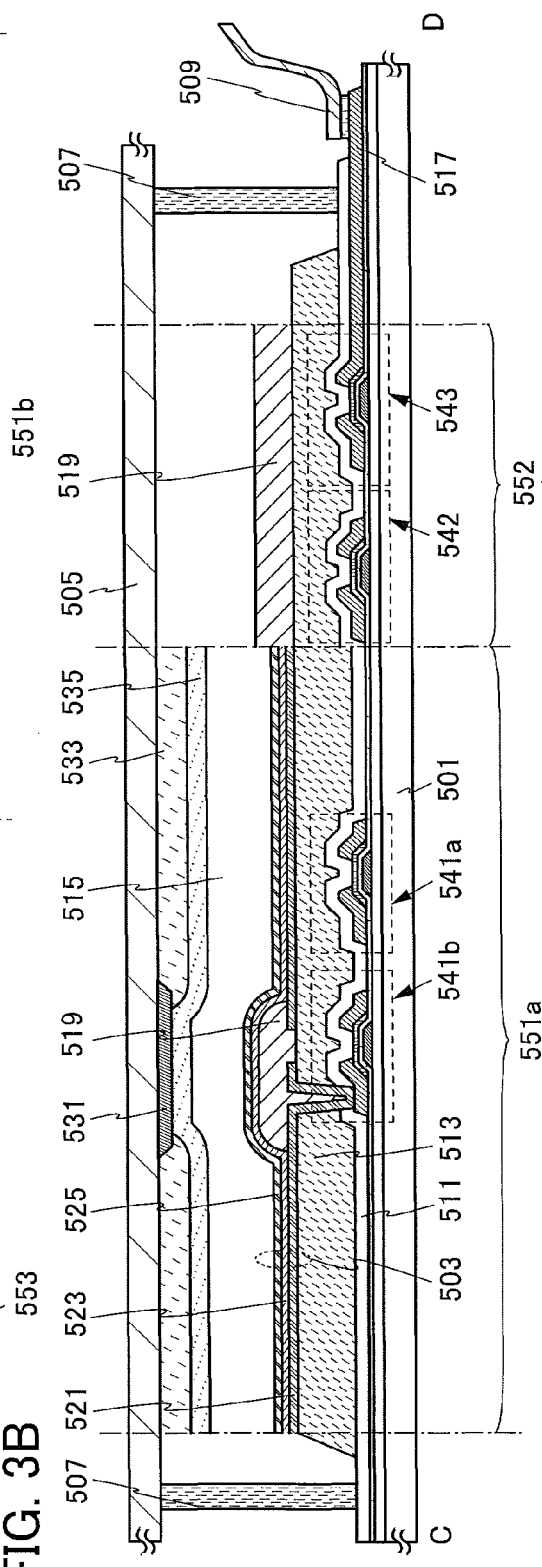

FIG. 3A is a plan view of a light-emitting device of one embodiment of the present invention, FIG. 3B is a cross-sectional view taken along dashed-dotted line C-D in FIG. 3A, and FIG. 3C is a cross-sectional view illustrating a modified example of the light-emitting portion.

An active matrix light-emitting device of this embodiment includes, over a support substrate 501, a light-emitting portion 551 (the cross section of which is illustrated in FIG. 3B and FIG. 3C as a light-emitting portion 551a and a light-emitting portion 551b, respectively), a driver circuit portion 552 (gate side driver circuit portion), a driver circuit portion 553 (source side driver circuit portion), and a sealing material 507. The light-emitting portion 551 and the driver circuit portions 552 and 553 are sealed in a space 515 surrounded by the support substrate 501, a sealing substrate 505, and the sealing material 507.

Any of a separate coloring method, a color filter method, and a color conversion method can be applied to the light-emitting element of one embodiment of the present invention. The light-emitting portion 551a fabricated by a color filter method is illustrated in FIG. 3B, and the light-emitting portion 551b fabricated by a separate coloring method is illustrated in FIG. 3C.

Each of the light-emitting portion 551a and the light-emitting portion 551b includes a plurality of light-emitting units each including a switching transistor 541a, a current control transistor 541b, and a second electrode 525 electrically connected to a wiring (a source electrode or a drain electrode) of the transistor 541b.

A light-emitting element 503 included in the light-emitting portion 551a has a bottom-emission structure and includes a first electrode 521 which transmits visible light, an EL layer 523, and the second electrode 525. Further, a partition 519 is formed so as to cover an end portion of the first electrode 521.

A light-emitting element 504 included in the light-emitting portion 551b has a top-emission structure and includes a first electrode 561, an EL layer 563, and the second electrode 565 which transmits visible light. Further, the partition 519 is formed so as to cover an end portion of the first electrode 561. In the EL layer 563, at least layers (e.g., light-emitting layers) which contain a variable material depending on the light-emitting element are colored separately.

Over the support substrate 501, a lead wiring 517 for connecting an external input terminal through which a signal (e.g., a video signal, a clock signal, a start signal, or a reset signal) or a potential from the outside is transmitted to the driver circuit portion 552 or 553 is provided. Here, an example is described in which a flexible printed circuit (FPC) 509 is provided as the external input terminal.

The driver circuit portions 552 and 553 include a plurality of transistors. FIG. 3B illustrates two of the transistors in the driver circuit portion 552 (transistors 542 and 543).

To prevent an increase in the number of manufacturing steps, the lead wiring 517 is preferably formed using the same material and the same step(s) as those of the electrode or the wiring in the light-emitting portion or the driver circuit portion. Described in this embodiment is an example in which the lead wiring 517 is formed using the same material and the same step(s) as those of the source electrodes and the drain electrodes of the transistors included in the light-emitting portion 551 and the driver circuit portion 552.

In FIG. 3B, the sealing material 507 is in contact with a first insulating layer 511 over the lead wiring 517. The adhesion of the sealing material 507 to metal is low in some cases. Therefore, the sealing material 507 is preferably in contact with an inorganic insulating film over the lead wiring 517. Such a structure enables a light-emitting device to have high sealing capability, high adhesion, and high reliability. Examples of the inorganic insulating film include oxide films of metals and semiconductors, nitride films of metals and semiconductors, and oxynitride films of metals and semiconductors, and specifically, a silicon oxide film, a silicon nitride film, a silicon oxynitride film, a silicon nitride oxide film, an aluminum oxide film, a titanium oxide film, and the like.

The first insulating layer 511 has an effect of preventing diffusion of impurities into a semiconductor included in the transistor. As the second insulating layer 513, an insulating film having a planarization function is preferably selected in order to reduce surface unevenness due to the transistor.

There is no particular limitation on the structure and materials of the transistor used in the light-emitting device of one embodiment of the present invention. A top-gate transistor may be used, or a bottom-gate transistor such as an inverted staggered transistor may be used. The transistor may be a channel-etched transistor or a channel-protective transistor. An n-channel transistor may be used and a p-channel transistor may also be used.

A semiconductor layer can be formed using silicon or an oxide semiconductor such as an In—Ga—Zn-based metal oxide.

The sealing substrate 505 illustrated in FIG. 3B is provided with a color filter 533 as a coloring layer at a position overlapping with the light-emitting element 503 (a light-emitting region thereof), and is also provided with a black matrix 531 at a position overlapping with the partition 519. Further, an overcoat layer 535 is provided so as to cover the color filter 533 and the black matrix 531. The sealing substrate 505 illustrated in FIG. 3C is provided with a desiccant 506.

This embodiment can be combined with any of the other embodiments as appropriate.

Embodiment 3

In this embodiment, examples of electronic devices and lighting devices to which the light-emitting device of one embodiment of the present invention is applied will be described with reference to FIGS. 4A to 4E and FIGS. 5A and 5B.

Electronic devices of this embodiment each include the light-emitting device of one embodiment of the present invention in a display portion. Lighting devices of this embodiment each include the light-emitting device of one embodiment of the present invention in a light-emitting portion (lighting portion). An electronic device and a lighting device with low power consumption can be provided by adopting the light-emitting device of one embodiment of the present invention.

Examples of electronic devices to which the light-emitting device is applied are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like. Specific examples of these electronic devices and lighting devices are illustrated in FIGS. 4A to 4E and FIGS. 5A and 5B.

FIG. 4A illustrates an example of a television device. In a television device 7100, a display portion 7102 is incorporated in a housing 7101. The display portion 7102 is capable of displaying images. The light-emitting device of one embodiment of the present invention can be used for the display portion 7102. In addition, here, the housing 7101 is supported by a stand 7103.

The television device 7100 can be operated with an operation switch provided for the housing 7101 or a separate remote controller 7111. With operation keys of the remote controller 7111, channels and volume can be controlled and images displayed on the display portion 7102 can be controlled. The remote controller 7111 may be provided with a display portion for displaying data output from the remote controller 7111.

Note that the television device 7100 is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

FIG. 4B illustrates an example of a computer. A computer 7200 includes a main body 7201, a housing 7202, a display portion 7203, a keyboard 7204, an external connection port 7205, a pointing device 7206, and the like. Note that this computer is manufactured by using the light-emitting device of one embodiment of the present invention for the display portion 7203.

FIG. 4C illustrates an example of a portable game machine. A portable game machine 7300 has two housings, a housing 7301*a* and a housing 7301*b*, which are connected with a joint portion 7302 so that the portable game machine can be opened or closed. The housing 7301*a* incorporates a display portion 7303*a*, and the housing 7301*b* incorporates a display portion 7303*b*. In addition, the portable game machine illustrated in FIG. 4C includes a speaker portion 7304, a recording medium insertion portion 7305, an operation key 7306, a connection terminal 7307, a sensor 7308 (a sensor having a function of measuring or sensing force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays), an LED lamp, a microphone, and the like. It is needless to say that the structure of the portable game machine is not limited to the above structure as long as the light-emitting device of one embodiment of the present invention is used for at least either the display portion 7303*a* or the display portion 7303*b*, or both, and may include other accessories as appropriate. The portable game machine illustrated in FIG. 4C has a function of reading out a program or data stored in a recoding medium to display it on the display portion, and a function of sharing information with another portable game machine by wireless communication. Note that functions of the portable game machine illustrated in FIG. 4C are not limited to them, and the portable game machine can have various functions.

FIG. 4D illustrates an example of a cellular phone. A cellular phone 7400 is provided with a display portion 7402 incorporated in a housing 7401, an operation button 7403, an external connection port 7404, a speaker 7405, a microphone 7406, and the like. Note that the cellular phone 7400 is manufactured by using the light-emitting device of one embodiment of the present invention for the display portion 7402.

When the display portion 7402 of the cellular phone 7400 illustrated in FIG. 4D is touched with a finger or the like, data can be input into the cellular phone. Further, operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting information such as characters. The third mode is a display-and-input mode in which two modes of the display mode and the input mode are combined.

For example, in the case of making a call or creating e-mail, the input mode mainly for inputting characters is selected for the display portion 7402 so that characters displayed on the screen can be input.

When a sensing device including a sensor such as a gyroscope sensor or an acceleration sensor for detecting inclination is provided inside the cellular phone 7400, display on the screen of the display portion 7402 can be automatically changed in direction by determining the orientation of the cellular phone 7400 (whether the cellular phone 7400 is placed horizontally or vertically for a landscape mode or a portrait mode).

The screen modes are changed by touch on the display portion 7402 or operation with the operation button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by the display portion 7402 while in touch with the palm or the finger, whereby personal authentication can be performed. Further, when a backlight or a sensing light source which emits near-infrared light is provided in the display portion, an image of a finger vein, a palm vein, or the like can be taken.

FIG. 4E illustrates an example of a foldable tablet terminal (in an open state). A tablet terminal 7500 includes a housing 7501a, a housing 7501b, a display portion 7502a, and a display portion 7502b. The housing 7501a and the housing 7501b are connected by a hinge 7503 and can be opened and closed using the hinge 7503 as an axis. The housing 7501a includes a power switch 7504, operation keys 7505, a speaker 7506, and the like. Note that the tablet terminal 7500 is manufactured by using the light-emitting device of one embodiment of the present invention for either the display portion 7502a or the display portion 7502b, or both.

Part of the display portion 7502a or the display portion 7502b can be used as a touch panel region, where data can be input by touching displayed operation keys. For example, a keyboard can be displayed on the entire region of the display portion 7502a so that the display portion 7502a is used as a touch screen, and the display portion 7502b can be used as a display screen.

Figure 5A:
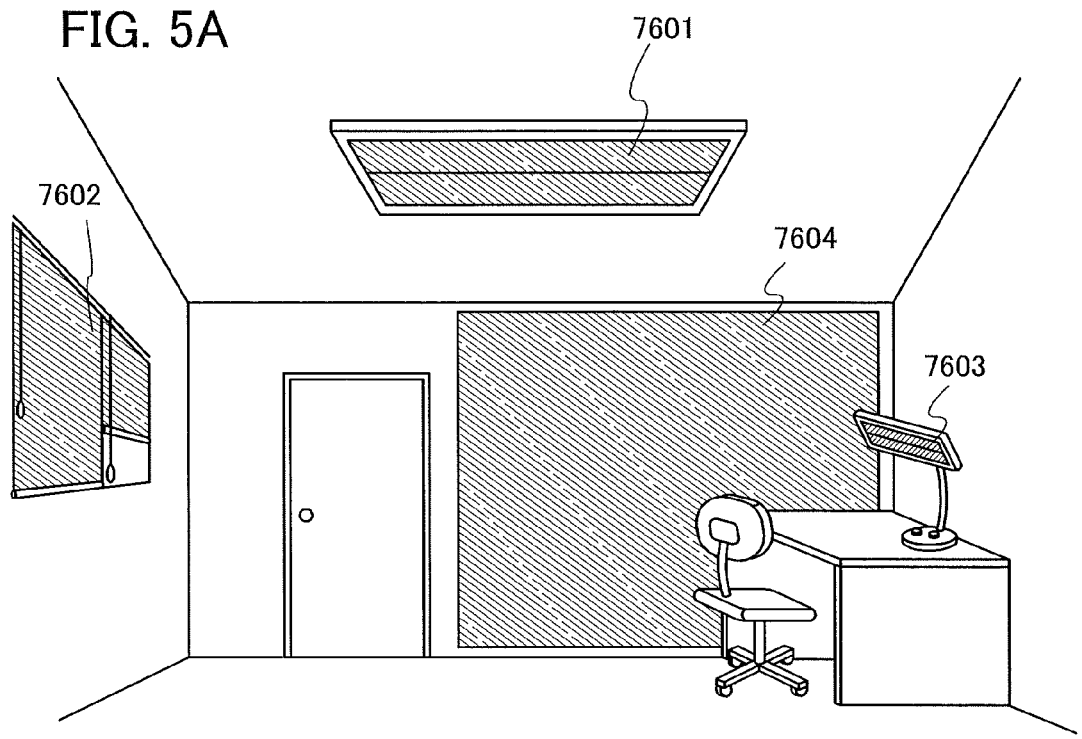
FIGS. 5A and 5B show examples of a lighting device.

An indoor lighting device 7601, a roll-type lighting device 7602, a desk lamp 7603, and a planar lighting device 7604 illustrated in FIG. 5A are each an example of a lighting device which includes the light-emitting device of one embodiment of the present invention. Since the light-emitting device of one embodiment of the present invention can have a larger area, it can be used as a large-area lighting device. Further, since the light-emitting device is thin, the light-emitting device can be mounted on a wall.

Figure 5B:
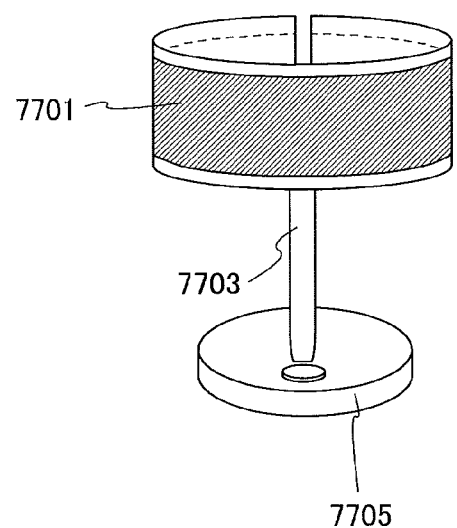

A desk lamp illustrated in FIG. 5B includes a lighting portion 7701, a support 7703, a support base 7705, and the like. The light-emitting device of one embodiment of the present invention is used for the lighting portion 7701. In one embodiment of the present invention, a lighting device whose light-emitting portion has a curved surface or a lighting device including a flexible lighting portion can be achieved. Such use of a flexible light-emitting device for a lighting device enables a place having a curved surface, such as the ceiling or dashboard of a motor vehicle, to be provided with the lighting device, as well as increases the degree of freedom in design of the lighting device.

This embodiment can be combined with any of the other embodiments as appropriate.

Example 1

Figure 6:
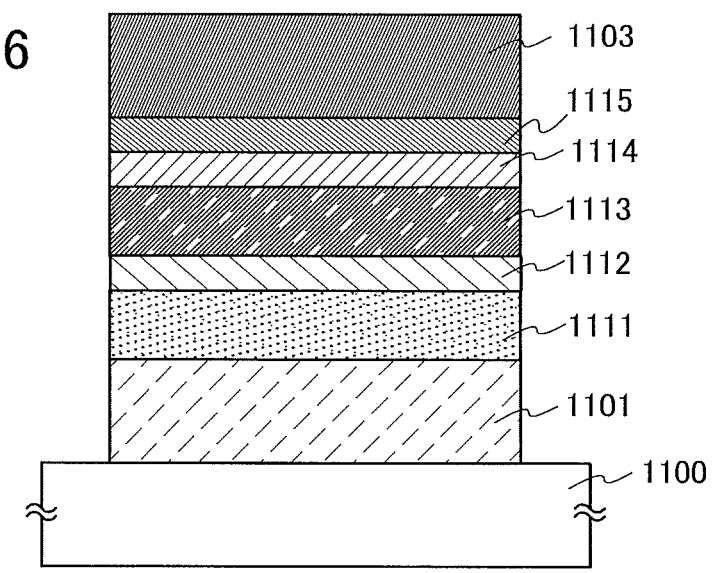
FIG. 6 shows a light-emitting element of Example.

In this example, a light-emitting element of one embodiment of the present invention is described referring to FIG. 6. Chemical formulae of materials used in this example are shown below.

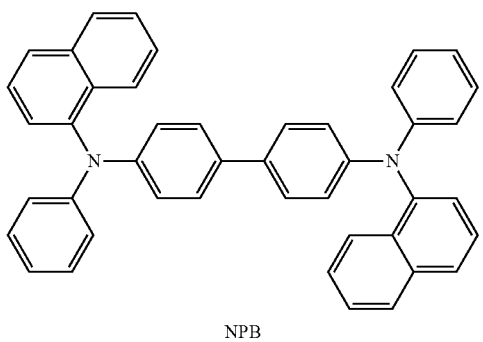

NPB

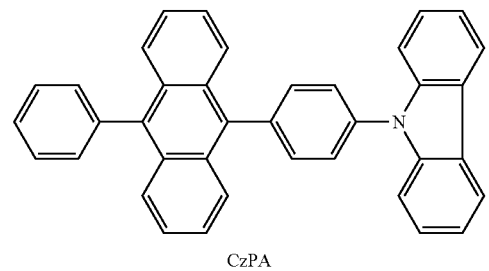

CzPA

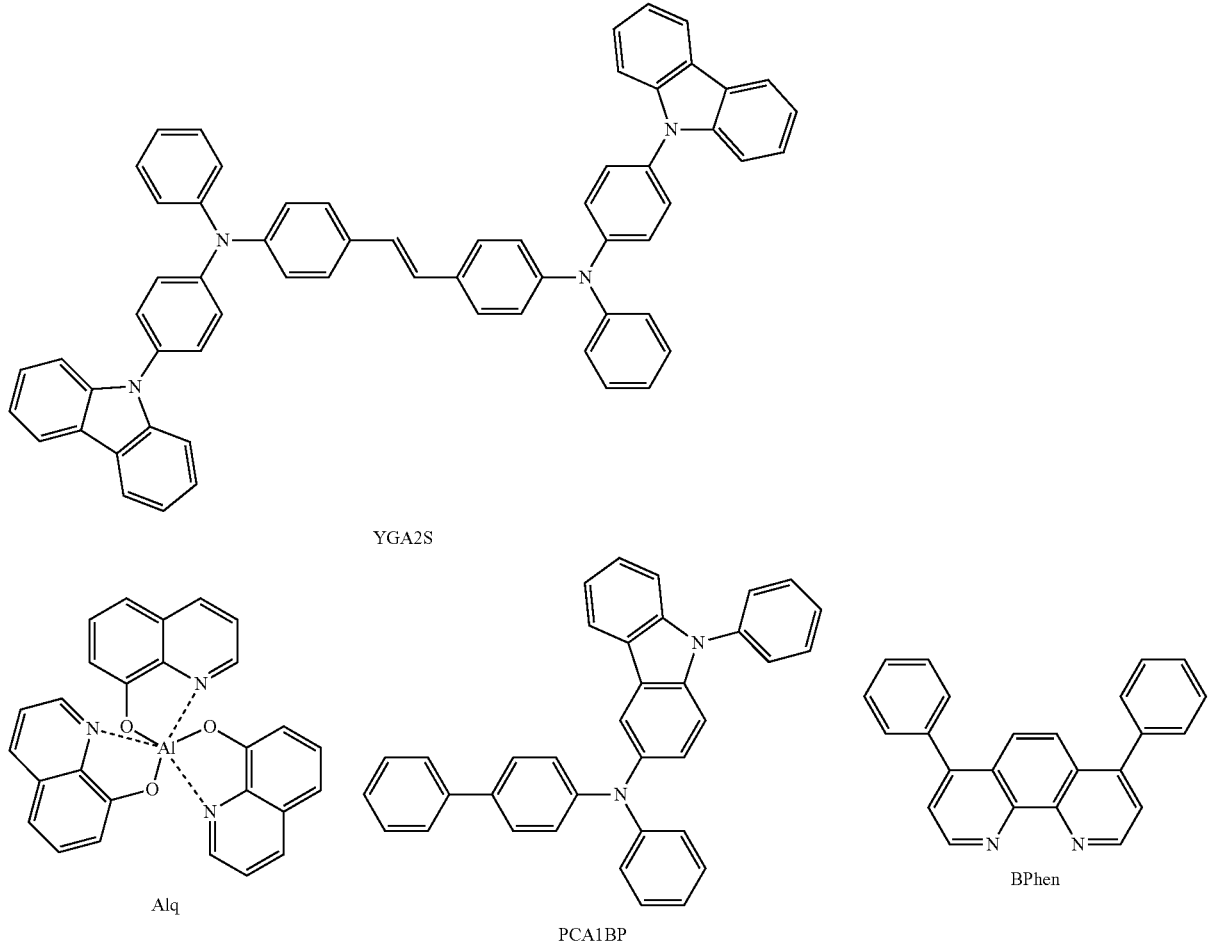

A method for fabricating a light-emitting element 1 of this example is described below.
(Light-Emitting Element 1)

A film of indium tin oxide containing silicon (ITSO) was formed over a glass substrate 1100 by a sputtering method, so that a first electrode 1101 functioning as an anode was formed. The thickness was 110 nm and the electrode area was 2 mm×2 mm.

Next, as pretreatment for forming the light-emitting element over the glass substrate 1100, UV-ozone treatment was performed for 370 seconds after washing of a surface of the glass substrate 1100 with water and baking that was performed at 200° C. for 1 hour.

After that, the glass substrate 1100 was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the glass substrate 1100 was cooled down for about 30 minutes.

Next, the glass substrate 1100 was fixed to a substrate holder in a vacuum evaporation apparatus so that a surface of the glass substrate 1100 on which the first anode 1101 was formed faced downward. The pressure in the vacuum evaporation apparatus was reduced to about $10^{-4}$ Pa. Then, on the first anode 1101, 4,4'-bis[N-(1-naphthyl)-N-phenylamino]biphenyl (abbreviation: NPB) and molybdenum(VI) oxide were deposited by co-evaporation to form a hole-injection layer 1111. The thickness of the layer 1111 was 50 nm, and the ratio of NPB to molybdenum(VI) oxide was adjusted to be 4:1 (=NPB:molybdenum oxide) in weight ratio. Note that a co-evaporation method refers to an evaporation method in which evaporation is carried out from a plurality of evaporation sources at the same time in one treatment chamber.

Next, on the hole-injection layer 1111, a film of N-phenyl-N-(4-phenylphenyl)-N-(9-phenyl-9H-carbazol-3-yl)amine (abbreviation: PCA1BP) was formed to a thickness of 10 nm, whereby a hole-transport layer 1112 was formed.

Next, 9-[4-(10-phenyl-9-anthracenyl)phenyl]-9H-carbazole (abbreviation: CzPA) and N,N'-bis[4-(9H-carbazol-9-yl)phenyl]-N,N'-diphenylstilbene-4,4'-diamine (abbreviation: YGA2S) were deposited by co-evaporation, whereby a light-emitting layer 1113 was formed on the hole-transport layer 1112. Here, the weight ratio of CzPA to YGA2S was adjusted to be 1:0.04 (=CzPA:YGA2S). The thickness of the light-emitting layer 1113 was 30 nm.

Next, a film of tris(8-quinolinolato)aluminum(III) (abbreviation: Alq) was formed to a thickness of 20 nm on the light-emitting layer 1113, whereby an electron-transport layer 1114 was formed.

Then, a film of bathophenanthroline (abbreviation: BPhen) was formed to a thickness of 10 nm on the electron-transport layer 1114, and further, a film of lithium fluoride (LiF) was formed to a thickness of 1 nm by evaporation, whereby an electron-injection layer 1115 was formed.

Lastly, a film of aluminum was formed to a thickness of 200 nm by evaporation, whereby a second electrode 1103 functioning as a cathode was formed. Thus, the light-emitting element 1 of this example was fabricated.

Note that, in the above evaporation process, evaporation was all performed by a resistance heating method.

Table 1 shows the element structure of the light-emitting element of this example which was fabricated in the above manner.

TABLE 1

| | First electrode | Hole-injection Layer | Hole-transport layer | Light-emitting layer | Electron-transport layer | Electron-injection layer | Second electrode |
|---|---|---|---|---|---|---|---|
| Light-emitting element 1 | ITSO 110 nm | NPB:MoOx (=4:1) 50 nm | PCA1BP 10 nm | CzPA:YGA2S (=1:0.04) 30 nm | Alq 20 nm | BPhen 10 nm | LiF 1 nm | Al 200 nm |

The light-emitting element 1 was sealed in a glove box containing a nitrogen atmosphere so as not to be exposed to the air (specifically, a sealant was applied onto outer edge of the element and heat treatment was performed at 80° C. for 1 hour at the time of sealing). Then, the operating characteristics of the light-emitting element 1 were measured. Note that the measurement was carried out at room temperature (in an atmosphere kept at 25° C.).

FIG. 7, FIG. 8, FIG. 9, and FIG. 10 show voltage vs. luminance characteristics, luminance vs. current efficiency characteristics, voltage vs. current characteristics, and luminance vs. chromaticity characteristics, respectively, of the light-emitting element 1.

Figure 7:
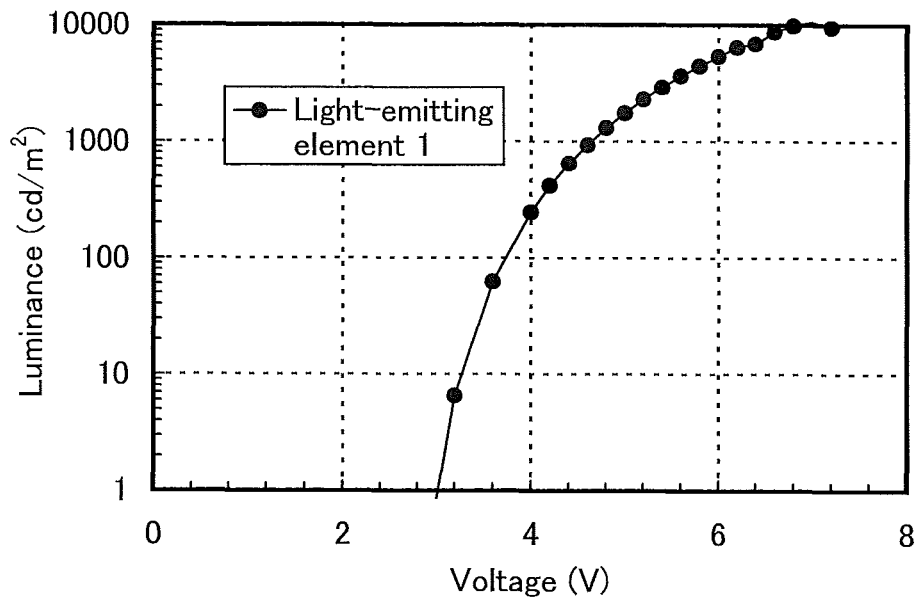
FIG. 7 shows voltage vs. luminance characteristics of a light-emitting element of Example 1.
Figure 8:
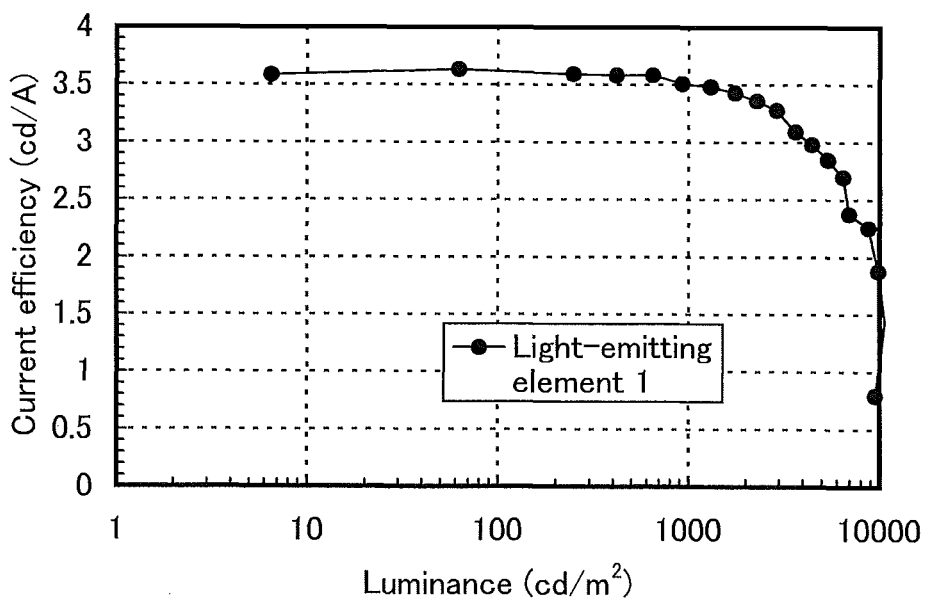
FIG. 8 shows luminance vs. current efficiency characteristics of the light-emitting element of Example 1.
Figure 9:
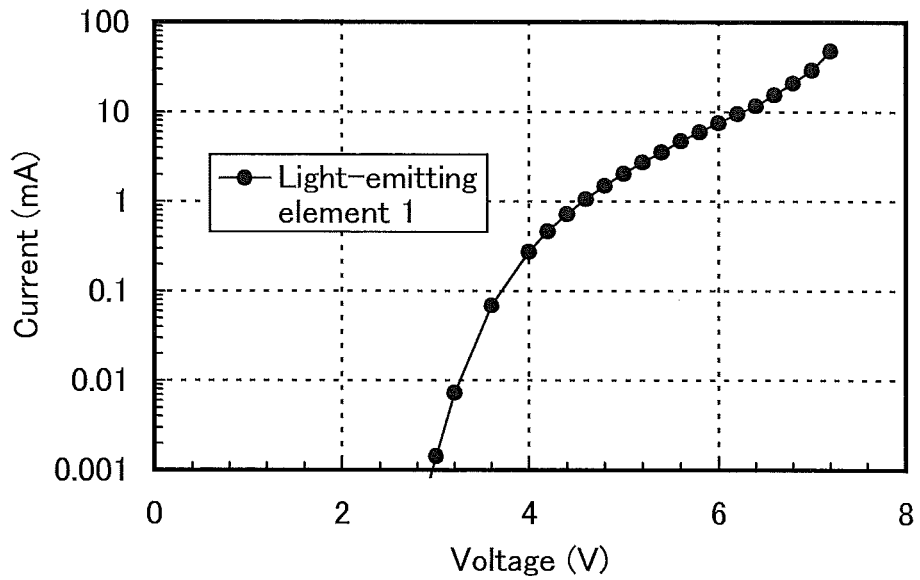
FIG. 9 shows voltage vs. current characteristics of the light-emitting element of Example 1.
Figure 10:
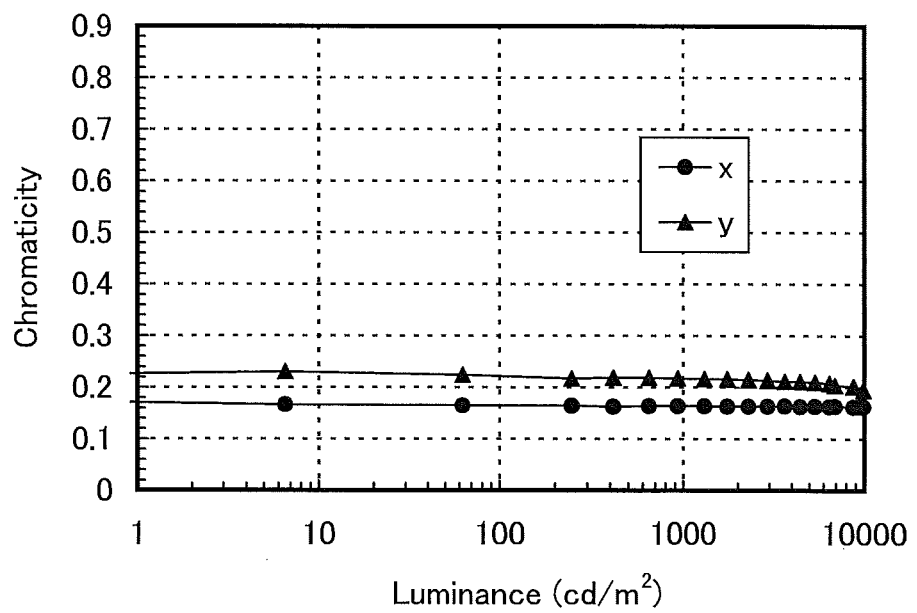
FIG. 10 shows luminance vs. chromaticity characteristics of the light-emitting element of Example 1.

It can be found from FIG. 7 and FIG. 8 that the light-emitting element 1 is a highly efficient element consuming low power. It can be found from FIG. 9 that the light-emitting element 1 is an element driven with low voltage. It can be found from FIG. 10 that the light-emitting element 1 has favorable carrier balance at any luminance.

Table 2 shows initial values of main characteristics of the light-emitting element 1 at a luminance of about 1000 cd/m².

TABLE 2

| | Voltage (V) | Current (mA) | Current density (mA/cm²) | Chromaticity (x, y) | Current efficiency (cd/A) | Power efficiency (lm/W) |
|---|---|---|---|---|---|---|
| Light-emitting element 1 | 4.6 | 1.1 | 27 | (0.16, 0.22) | 3.5 | 2.4 |

The above results show that the light-emitting element 1 has high luminance and high current efficiency. Moreover, as for color purity, it can be found that the light-emitting element exhibits blue emission with excellent color purity.

Figure 11:
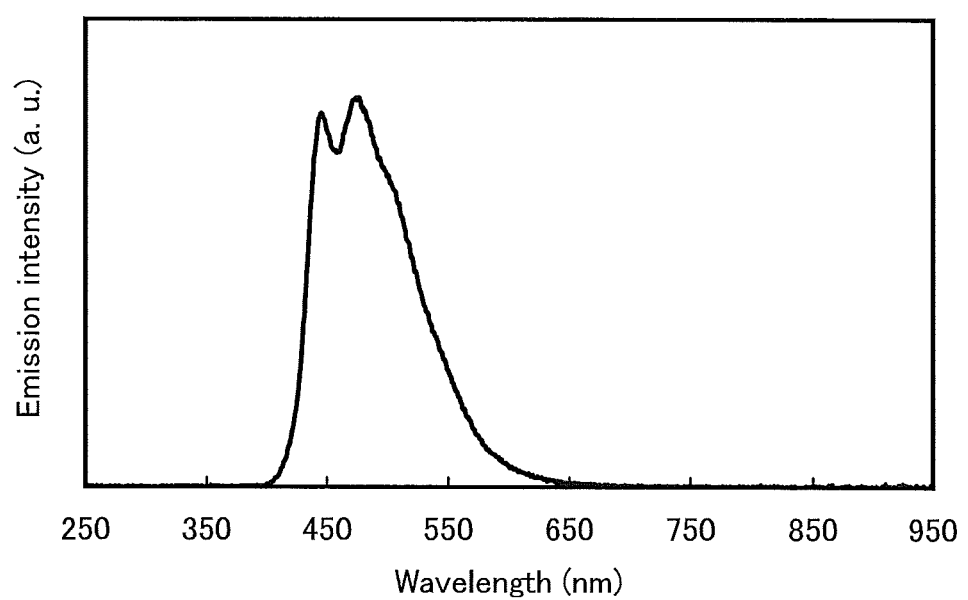
FIG. 11 shows an emission spectrum of the light-emitting element of Example 1.

FIG. 11 shows an emission spectrum when a current at a current density of 25 mA/cm² was supplied to the light-emitting element 1. As shown in FIG. 11, the emission spectrum of the light-emitting element 1 has peaks at around 445 nm and 476 nm and it is suggested that the peaks are derived from emission of YGA2S included in the light-emitting layer 1113.

The results of this example indicate that PCA1BP can be suitably used for the hole-transport layer of the light-emitting element which emits fluorescence in the visible region.

Example 2

In this example, a light-emitting element of one embodiment of the present invention is described referring to FIG. 6. Chemical formulae of materials used in this example are shown below. Note that the materials the chemical formulae of which are described above will be omitted.

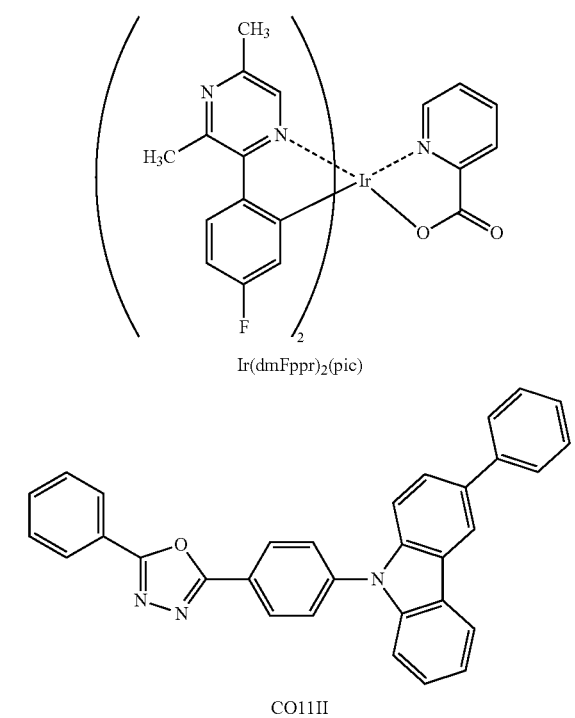

Ir(dmFppr)₂(pic)

CO11II

A method for fabricating a light-emitting element 2 of this example is described below.
(Light-Emitting Element 2)

The first electrode 1101, the hole-injection layer 1111, and the hole-transport layer 1112 were formed on the glass substrate 1100 under conditions similar to those of the light-emitting element 1. Note that the ratio of NPB to molybdenum oxide in the hole-injection layer 1111 was adjusted to be 4:2 NPB:molybdenum oxide) in weight ratio.

Next, 3-phenyl-9-[4-(5-phenyl-1,3,4-oxadiazol-2-yl)phenyl]-9H-carbazole (abbreviation: CO11II), PCA1BP, and bis{2-(4-fluorophenyl)-3,5-dimethylpyrazinato}(picolinato) iridium(III) (abbreviation: [Ir(dmFppr)₂(pic)]) were deposited by co-evaporation, whereby the light-emitting layer 1113 was formed on the hole-transport layer 1112. Here, the weight ratio of CO11II to PCA1BP and [Ir(dmFppr)₂(pic)] was adjusted to be 1:0.15:0.1 (=CO11II:PCA1BP:[Ir(dmFppr)₂(pic)]). The thickness of the light-emitting layer 1113 was 40 nm.

Next, a film of Alq was formed to a thickness of 10 nm on the light-emitting layer 1113, whereby the electron-transport layer 1114 was formed.

Then, a film of BPhen was formed to a thickness of 20 nm on the electron-transport layer 1114, and further, a film of LiF was formed to a thickness of 1 nm by evaporation, whereby the electron-injection layer 1115 was formed.

Lastly, a film of aluminum was formed to a thickness of 200 nm by evaporation, whereby the second electrode 1103 functioning as a cathode was formed. Thus, the light-emitting element 2 of this example was fabricated.

Note that, in the above evaporation process, evaporation was all performed by a resistance heating method.

Table 3 shows the element structure of the light-emitting element of this example which was fabricated in the above manner.

TABLE 3

| | First electrode | Hole-injection Layer | Hole-transport layer | Light-emitting layer | Electron-transport layer | Electron-injection layer | | Second electrode |
|---|---|---|---|---|---|---|---|---|
| Light-emitting element 2 | ITSO 110 nm | NPB:MoOx (=4:2) 50 nm | PCA1BP 10 nm | CO11II:PCA1BP:Ir(dmFppr)$_2$(pic) (=1:0.15:0.1) 40 nm | Alq 10 nm | BPhen 20 nm | LiF 1 nm | Al 200 nm |

The light-emitting element 2 was sealed in a glove box containing a nitrogen atmosphere so as not to be exposed to the air (specifically, a sealant was applied onto outer edge of the element and heat treatment was performed at 80° C. for 1 hour at the time of sealing). Then, the operating characteristics of the light-emitting element 2 were measured. Note that the measurement was carried out at room temperature (in an atmosphere kept at 25° C.).

FIG. 12, FIG. 13, FIG. 14, and FIG. 15 show voltage vs. luminance characteristics, luminance vs. current efficiency characteristics, voltage vs. current characteristics, and luminance vs. chromaticity characteristics, respectively, of the light-emitting element 2.

Figure 12:
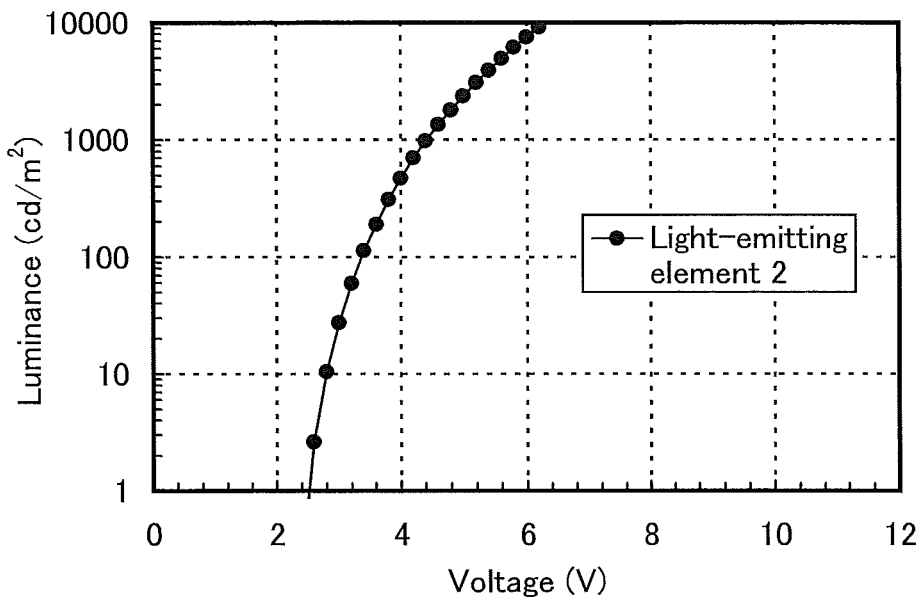
FIG. 12 shows voltage vs. luminance characteristics of a light-emitting element of Example 2.
Figure 13:
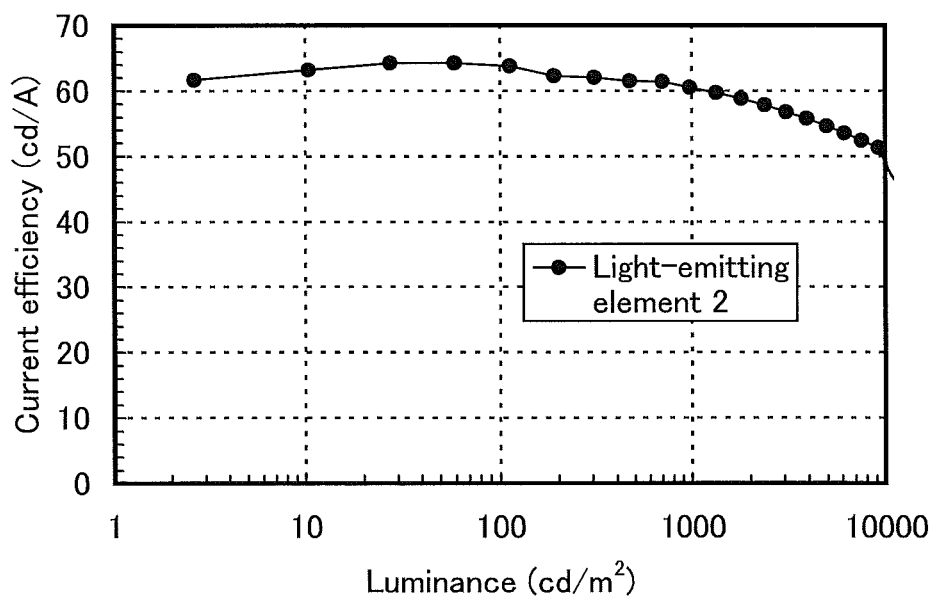
FIG. 13 shows luminance vs. current efficiency characteristics of the light-emitting element of Example 2.
Figure 14:
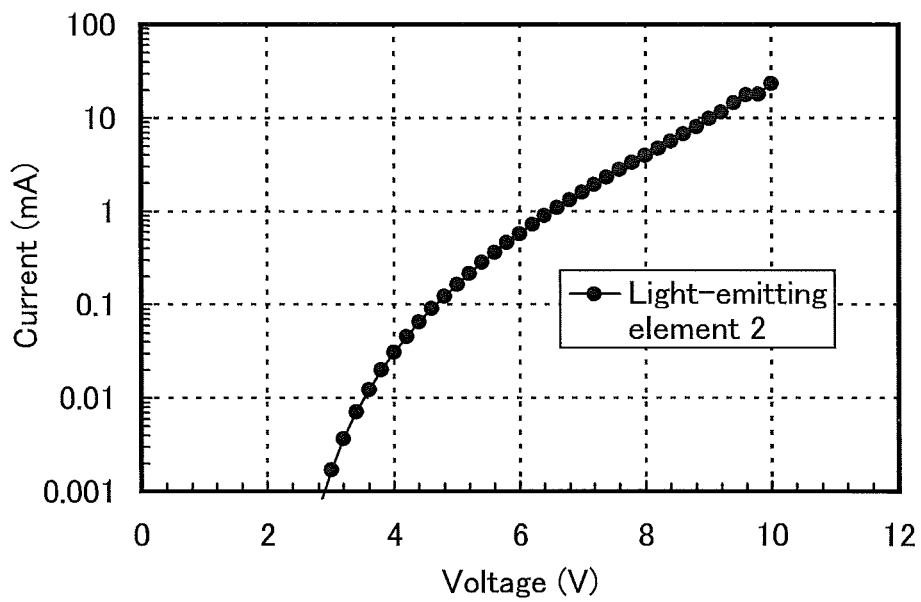
FIG. 14 shows voltage vs. current characteristics of the light-emitting element of Example 2.
Figure 15:
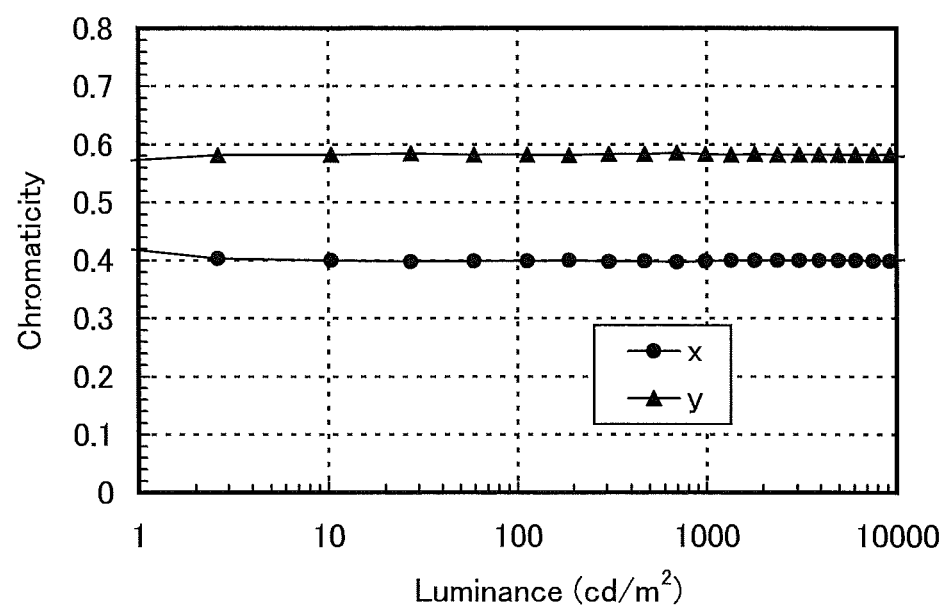
FIG. 15 shows luminance vs. chromaticity characteristics of the light-emitting element of Example 2.

It can be found from FIG. 12 and FIG. 13 that the light-emitting element 2 is a highly efficient element consuming low power. It can be found from FIG. 14 that the light-emitting element 2 is an element driven with low voltage. It can be found from FIG. 15 that the light-emitting element 2 has favorable carrier balance at any luminance.

Table 4 shows initial values of main characteristics of the light-emitting element 2 at a luminance of about 1000 cd/m$^2$.

TABLE 4

| | Voltage (V) | Current (mA) | Current density (mA/cm$^2$) | Chromaticity (x, y) | Current efficiency (cd/A) | Power efficiency (lm/W) |
|---|---|---|---|---|---|---|
| Light-emitting element 2 | 4.4 | 0.065 | 1.6 | (0.40, 0.58) | 61 | 43 |

The above results show that the light-emitting element 2 has high luminance and high current efficiency. Moreover, as for color purity, it can be found that the light-emitting element exhibits yellow emission with excellent color purity.

Figure 16:
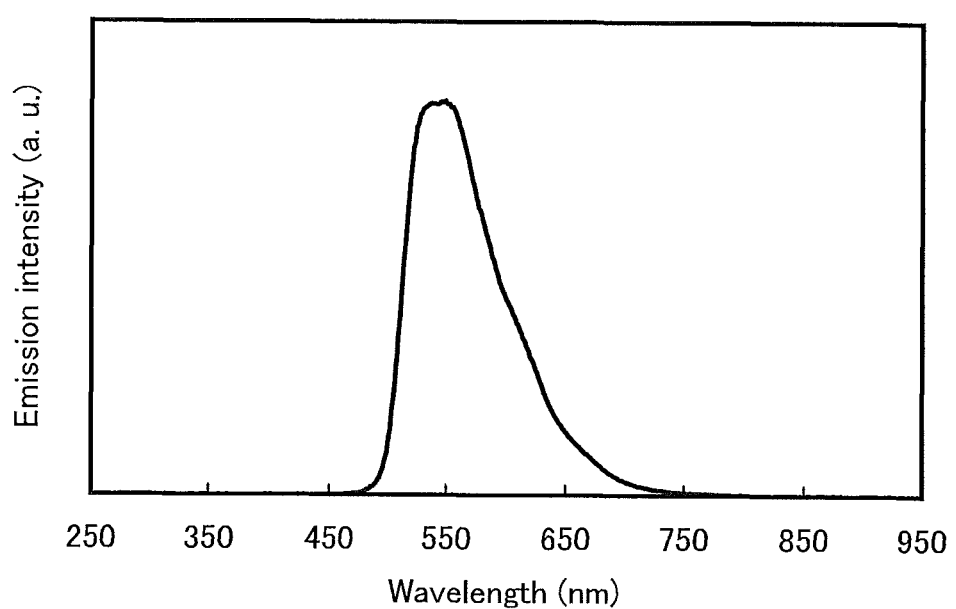
FIG. 16 shows an emission spectrum of the light-emitting element of Example 2.

FIG. 16 shows an emission spectrum when a current at a current density of 25 mA/cm$^2$ was supplied to the light-emitting element 2. As shown in FIG. 16, the emission spectrum of the light-emitting element 2 has a peak at around 550 nm and it is suggested that the peak is derived from emission of [Ir(dmFppr)$_2$(pic)] included in the light-emitting layer 1113.

Figure 17:
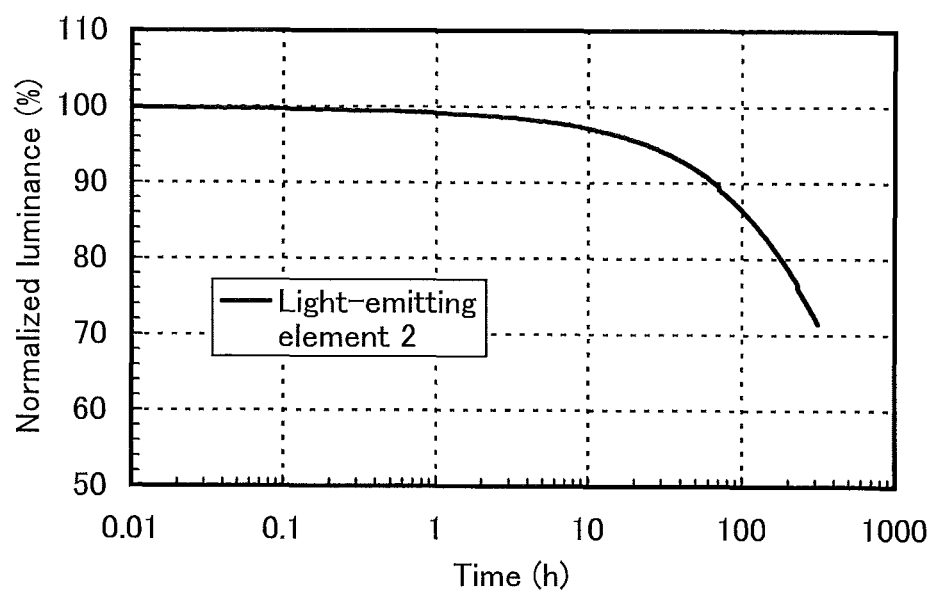
FIG. 17 shows the result of a reliability test of the light-emitting element of Example 2.

FIG. 17 shows results of a reliability test of the light-emitting element 2. Note that in the reliability test, the light-emitting element 2 was driven under the conditions where the initial luminance was set to 1000 cd/m$^2$ and the current density was constant. The light-emitting element 2 kept about 86% of the initial luminance after 100 hours elapsed. Thus, the reliability test revealed high reliability of the light-emitting element 2.

The results of this example indicate that PCA1BP may be used for the host material of the light-emitting layer and the hole-transport layer of the light-emitting element which emits phosphorescence with a wavelength longer than or equal to that of yellow light.

Example 3

In this example, a light-emitting element of one embodiment of the present invention is described referring to FIG. 6. Chemical formulae of materials used in this example are shown below. Note that the materials the chemical formulae of which are described above will be omitted.

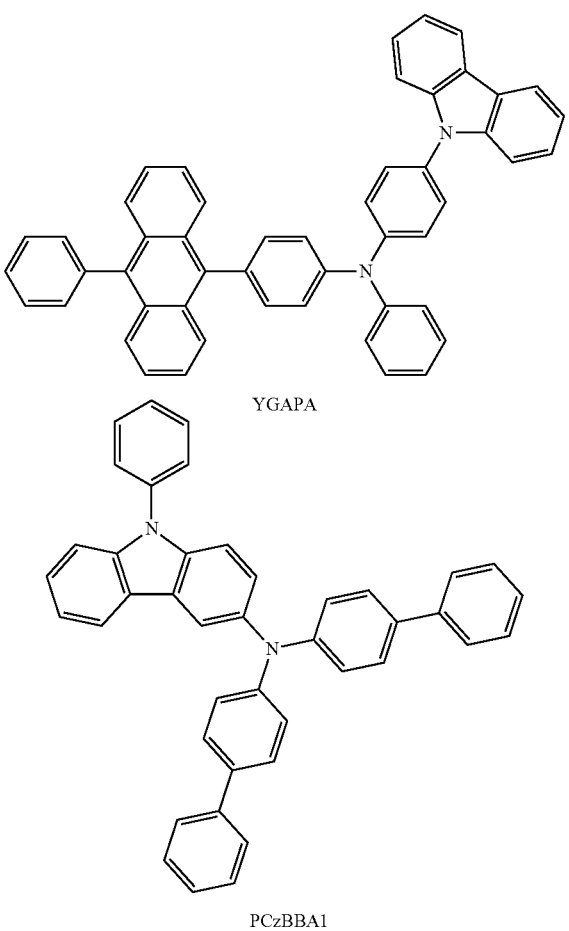

YGAPA

PCzBBA1

A method for fabricating a light-emitting element 3 of this example is described below.

(Light-Emitting Element 3)

The first electrode 1101 and the hole-injection layer 1111 were formed on the glass substrate 1100 under conditions similar to those of the light-emitting element 1.

Next, on the hole-injection layer 1111, a film of N,N-di(biphenyl-4-yl)-N-(9-phenyl-9H-carbazol-3-yl)amine (abbreviation: PCzBBA1) was formed to a thickness of 10 nm, whereby the hole-transport layer 1112 was formed.

Next, CzPA and 4-(9H-carbazol-9-yl)-4'-(10-phenyl-9-anthryl)triphenylamine (abbreviation: YGAPA) were deposited by co-evaporation, whereby the light-emitting layer 1113 was formed on the hole-transport layer 1112. Here, the weight ratio of CzPA to YGAPA was adjusted to be 1:0.04 (=CzPA:YGAPA). The thickness of the light-emitting layer 1113 was 30 nm.

Next, a film of Alq was formed to a thickness of 30 nm on the light-emitting layer 1113, whereby the electron-transport layer 1114 was formed.

Then, a film of LiF was formed to a thickness of 1 nm on the electron-transport layer 1114 by evaporation, whereby the electron-injection layer 1115 was formed.

Lastly, a film of aluminum was formed to a thickness of 200 nm by evaporation, whereby the second electrode 1103 functioning as a cathode was formed. Thus, the light-emitting element 3 of this example was fabricated.

Note that, in the above evaporation process, evaporation was all performed by a resistance heating method.

Table 5 shows the element structure of the light-emitting element of this example which was fabricated in the above manner.

TABLE 5

| | First electrode | Hole-injection Layer | Hole-transport layer | Light-emitting layer | Electron-transport layer | Electron-injection layer | Second electrode |
|---|---|---|---|---|---|---|---|
| Light-emitting element 3 | ITSO 110 nm | NPB:MoOx (=4:1) 50 nm | PCzBBA1 10 nm | CzPA:YGAPA (=1:0.04) 30 nm | Alq 30 nm | LiF 1 nm | Al 200 nm |

The light-emitting element 3 was sealed in a glove box containing a nitrogen atmosphere so as not to be exposed to the air (specifically, a sealant was applied onto outer edge of the element and heat treatment was performed at 80° C. for 1 hour at the time of sealing). Then, the operating characteristics of the light-emitting element 3 were measured. Note that the measurement was carried out at room temperature (in an atmosphere kept at 25° C.).

FIG. 18, FIG. 19, FIG. 20, and FIG. 21 show voltage vs. luminance characteristics, luminance vs. current efficiency characteristics, voltage vs. current characteristics, and luminance vs. chromaticity characteristics, respectively, of the light-emitting element 3.

Figure 18:
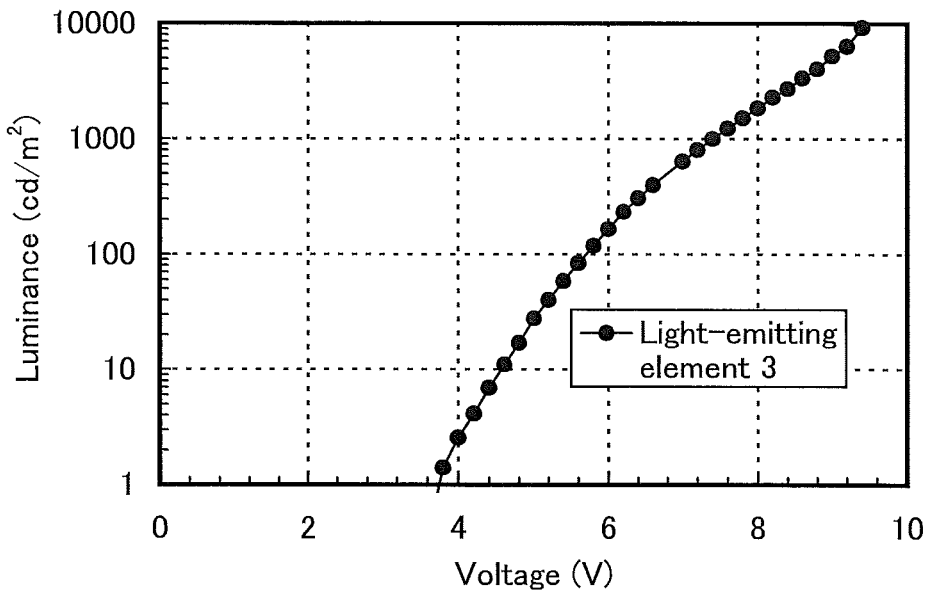
FIG. 18 shows voltage vs. luminance characteristics of a light-emitting element of Example 3.
Figure 19:
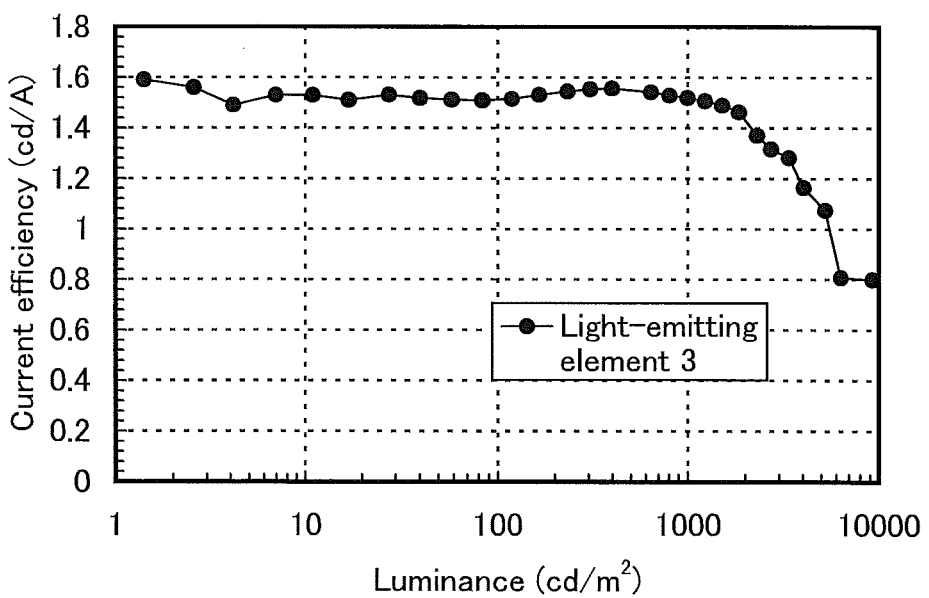
FIG. 19 shows luminance vs. current efficiency characteristics of the light-emitting element of Example 3.
Figure 20:
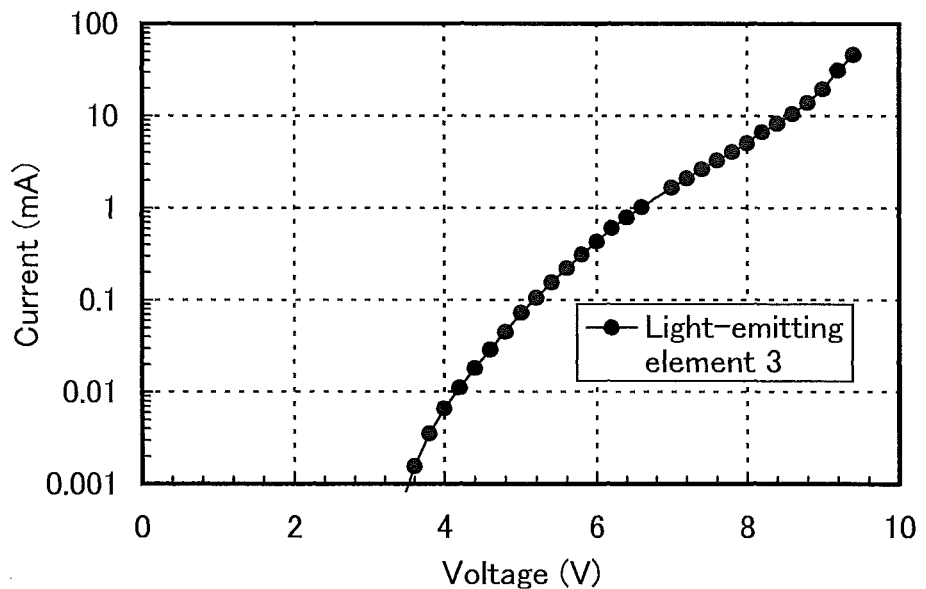
FIG. 20 shows voltage vs. current characteristics of the light-emitting element of Example 3.
Figure 21:
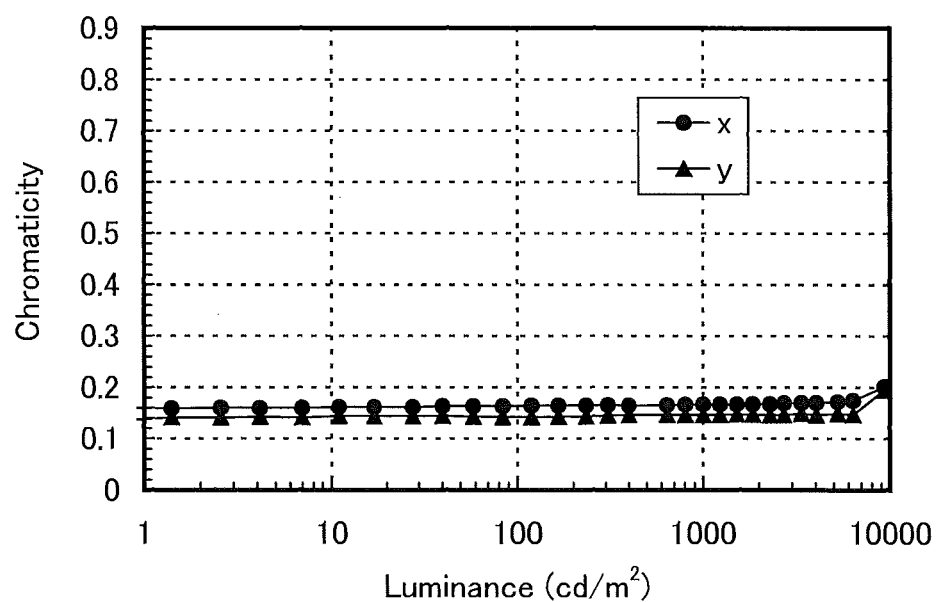
FIG. 21 shows luminance vs. chromaticity characteristics of the light-emitting element of Example 3.

It can be found from FIG. 18 and FIG. 19 that the light-emitting element 3 is a highly efficient element consuming low power. It can be found from FIG. 20 that the light-emitting element 3 is an element driven with low voltage. It can be found from FIG. 21 that the light-emitting element 3 has favorable carrier balance at any luminance.

Table 6 below shows initial values of main characteristics of the light-emitting element 3 at a luminance of about 1000 cd/m$^2$.

TABLE 6

| | Voltage (V) | Current (mA) | Current density (mA/cm$^2$) | Chromaticity (x, y) | Current efficiency (cd/A) | Power efficiency (lm/W) |
|---|---|---|---|---|---|---|
| Light-emitting element 3 | 7.4 | 2.6 | 66 | (0.17, 0.15) | 1.5 | 0.65 |

The above results show that the light-emitting element 3 has high luminance and high current efficiency. Moreover, as for color purity, it can be found that the light-emitting element exhibits blue emission with excellent color purity.

Figure 22:
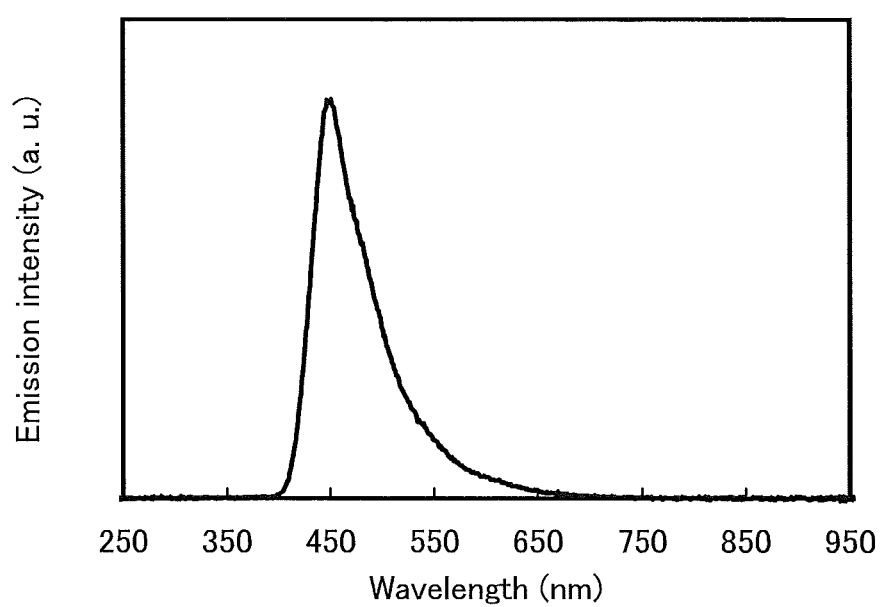
FIG. 22 shows an emission spectrum of the light-emitting element of Example 3.

FIG. 22 shows an emission spectrum when a current at a current density of 25 mA/cm$^2$ was supplied to the light-emitting element 3. As shown in FIG. 22, the emission spectrum of the light-emitting element 3 has a peak at around 453 nm and it is suggested that the peak is derived from emission of YGAPA included in the light-emitting layer 1113.

The results of this example show that PCzBBA1 can be suitably used for the hole-transport layer of the light-emitting element which emits fluorescence in a visible region.

Example 4

In this example, a light-emitting element of one embodiment of the present invention is described referring to FIG. 6. Chemical formulae of materials used in this example are shown below. Note that the materials the chemical formulae of which are described above will be omitted.

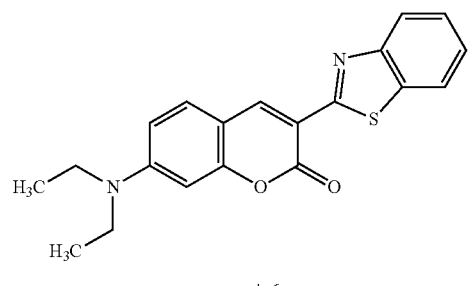

coumarin6

A method for fabricating a light-emitting element 4 of this example is described below.

(Light-Emitting Element 4)

The first electrode 1101 and the hole-injection layer 1111 were formed on the glass substrate 1100 under conditions similar to those of the light-emitting element 1.

Next, on the hole-injection layer 1111, a film of PCzBBA1 was formed to a thickness of 10 nm, whereby the hole-transport layer 1112 was formed.

Next, Alq and coumarin 6 were deposited by co-evaporation, whereby the light-emitting layer 1113 was formed on the hole-transport layer 1112. Here, the weight ratio of Alq to coumarin 6 was adjusted to be 1:0.01 (=Alq:coumarin 6). The thickness of the light-emitting layer 1113 was 40 nm.

Next, a film of Alq was formed to a thickness of 30 nm on the light-emitting layer 1113, whereby the electron-transport layer 1114 was formed.

Then, a film of LiF was formed to a thickness of 1 nm on the electron-transport layer 1114 by evaporation, whereby the electron-injection layer 1115 was formed.

Lastly, a film of aluminum was formed to a thickness of 200 nm by evaporation, whereby the second electrode 1103 functioning as a cathode was formed. Thus, the light-emitting element 4 of this example was fabricated.

Note that, in the above evaporation process, evaporation was all performed by a resistance heating method.

Table 7 shows the element structure of the light-emitting element of this example which was fabricated in the above manner.

TABLE 7

| | First electrode | Hole-injection Layer | Hole-transport layer | Light-emitting layer | Electron-transport layer | Electron-injection layer | Second electrode |
|---|---|---|---|---|---|---|---|
| Light-emitting element 4 | ITSO 110 nm | NPB:MoOx (=4:1) 50 nm | PCzBBA1 10 nm | Alq:coumarin6 (=1:0.01) 40 nm | Alq 30 nm | LiF 1 nm | Al 200 nm |

The light-emitting element 4 was sealed in a glove box containing a nitrogen atmosphere so as not to be exposed to the air (specifically, a sealant was applied onto outer edge of the element and heat treatment was performed at 80° C. for 1 hour at the time of sealing). Then, the operating characteristics of the light-emitting element 4 were measured. Note that the measurement was carried out at room temperature (in an atmosphere kept at 25° C.).

FIG. 23, FIG. 24, FIG. 25, and FIG. 26 show voltage vs. luminance characteristics, luminance vs. current efficiency characteristics, voltage vs. current characteristics, and luminance vs. chromaticity characteristics, respectively, of the light-emitting element 4.

Figure 23:
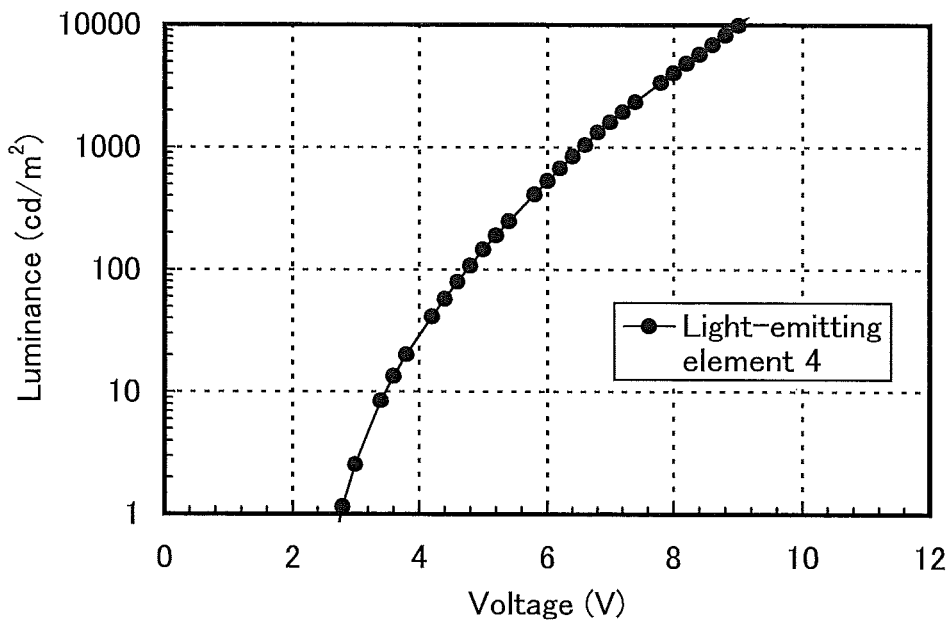
FIG. 23 shows voltage vs. luminance characteristics of a light-emitting element of Example 4.
Figure 24:
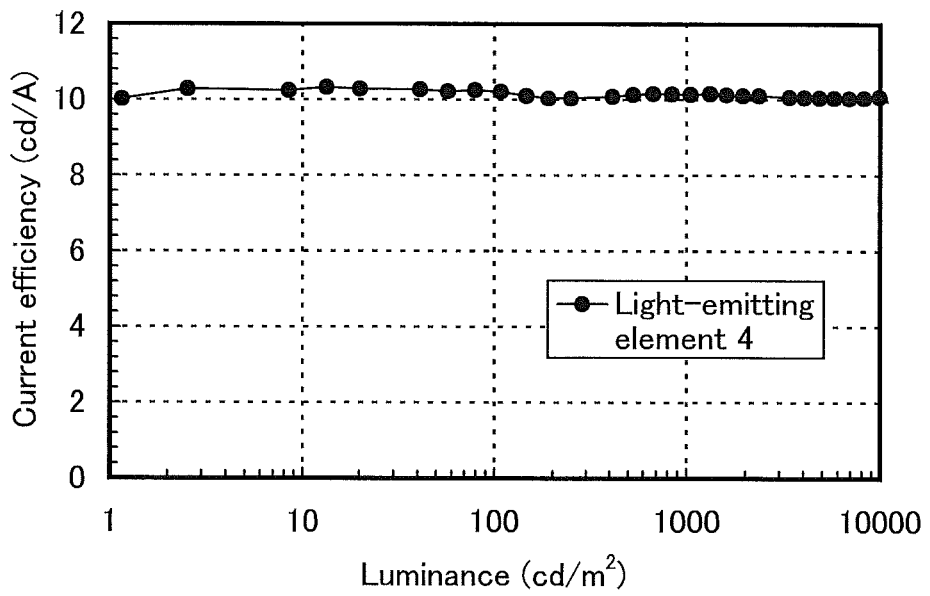
FIG. 24 shows luminance vs. current efficiency characteristics of the light-emitting element of Example 4.
Figure 25:
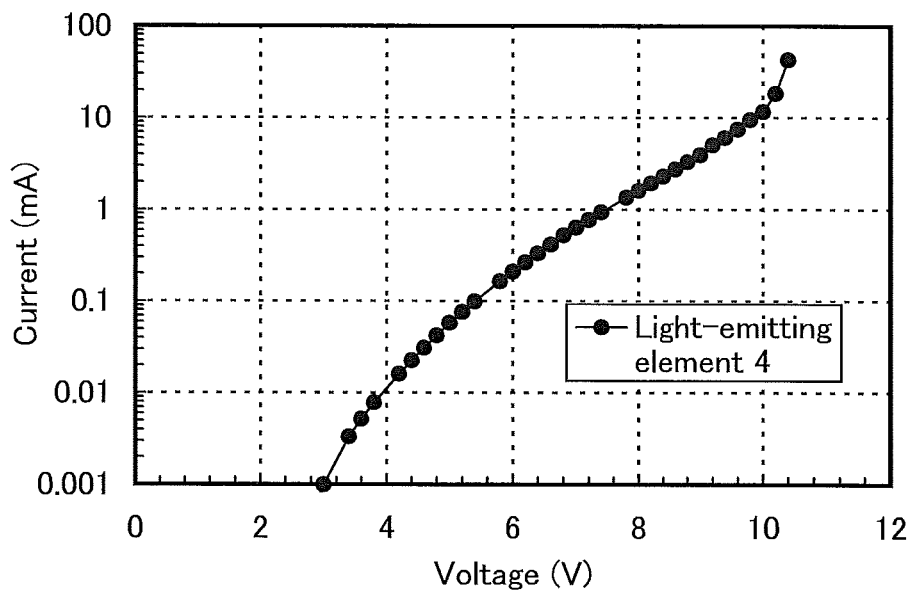
FIG. 25 shows voltage vs. current characteristics of the light-emitting element of Example 4.
Figure 26:
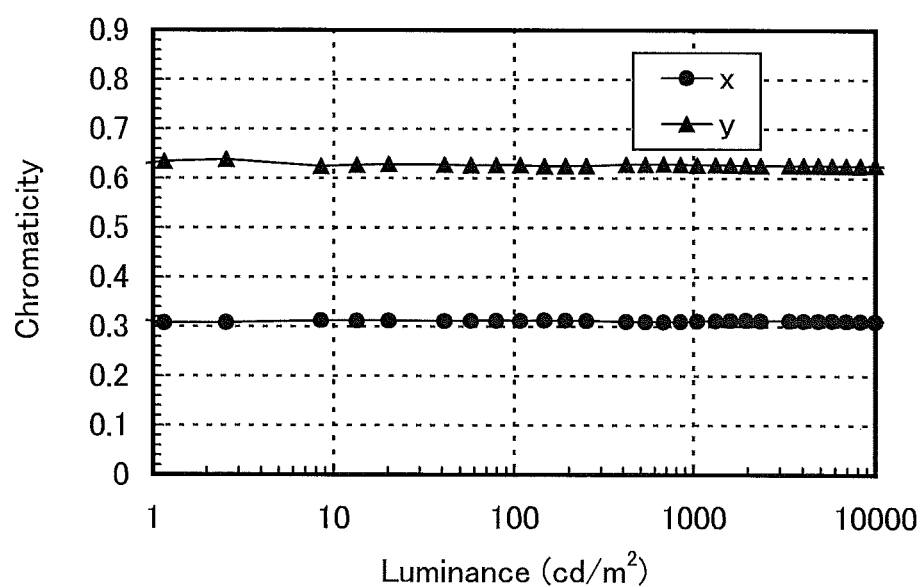
FIG. 26 shows luminance vs. chromaticity characteristics of the light-emitting element of Example 4.

It can be found from FIG. 23 and FIG. 24 that the light-emitting element 4 is a highly efficient element consuming low power. It can be found from FIG. 25 that the light-emitting element 4 is an element driven with low voltage. It can be found from FIG. 26 that the light-emitting element 4 has favorable carrier balance at any luminance.

Table 8 below shows initial values of main characteristics of the light-emitting element 4 at a luminance of about 1000 cd/m².

TABLE 8

| | Voltage (V) | Current (mA) | Current density (mA/cm²) | Chromaticity (x, y) | Current efficiency (cd/A) | Power efficiency (lm/W) |
|---|---|---|---|---|---|---|
| Light-emitting element 4 | 6.4 | 0.33 | 8.3 | (0.31, 0.62) | 10 | 5.0 |

The above results show that the light-emitting element 4 has high luminance and high current efficiency. Moreover, as for color purity, it can be found that the light-emitting element exhibits green emission with excellent color purity.

Figure 27:
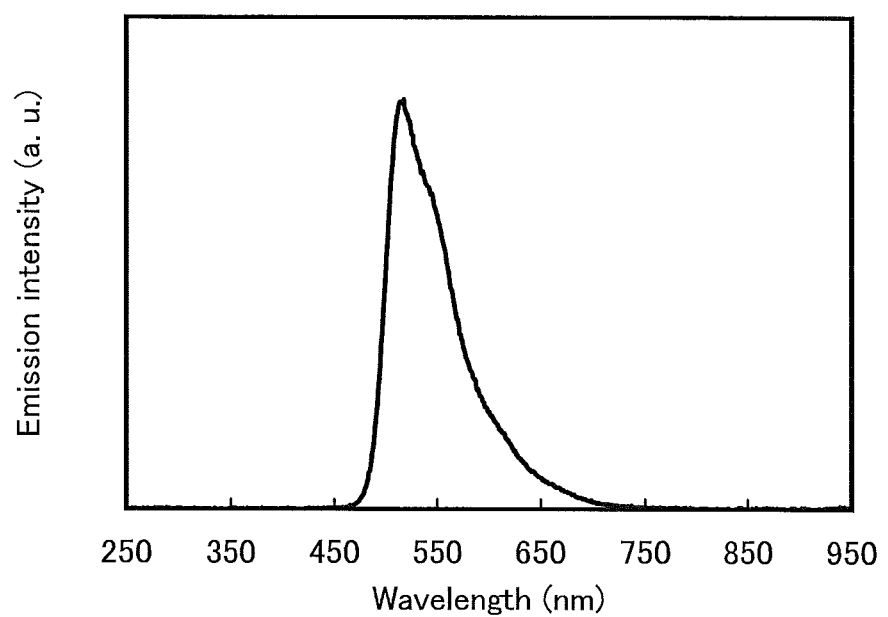
FIG. 27 shows an emission spectrum of the light-emitting element of Example 4.

FIG. 27 shows an emission spectrum when a current at a current density of 25 mA/cm² was supplied to the light-emitting element 4. As shown in FIG. 27, the emission spectrum of the light-emitting element 4 has a peak at around 517 nm and it is suggested that the peak is derived from emission of coumarin 6 included in the light-emitting layer 1113.

The results of this example show that PCzBBA1 can be suitably used for the hole-transport layer of the light-emitting element which emits fluorescence in a visible region.

Example 5

This example shows the synthesis of an organic compound included in a light-emitting element of one embodiment of the present invention and results of evaluation of characteristics thereof.

Synthesis Example 1

Described is a method for synthesizing N-phenyl-N-(4-phenylphenyl)-N-(9-phenyl-9H-carbazol-3-yl)amine (abbreviation: PCA1BP) represented by a structural formula (100) below.

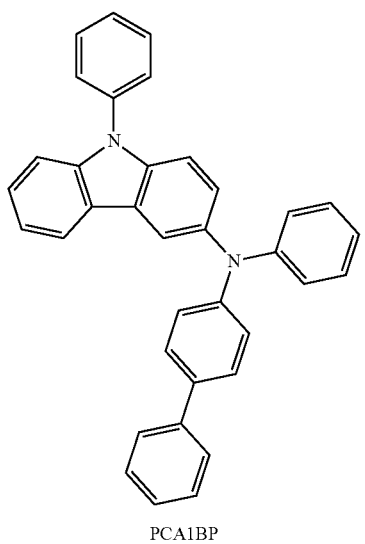

(100)

PCA1BP

Into a 200 mL three-neck flask were put 3.2 g (10 mmol) of 3-bromo-9-phenyl-9H-carbazole, 2.5 g (10 mmol) of 4-phenyl-diphenylamine, 1.5 g (15 mmol) of sodium tert-butoxide, and 0.1 g (0.2 mmol) of bis(dibenzylideneacetone)palladium(0), and the air in the flask was replaced with nitrogen. Then, 20 mL of dehydrated xylene was added to this mixture. After the mixture was deaerated while being stirred under reduced pressure, 1.2 mL (0.6 mmol) of tri(tert-butyl)phosphine (10 wt % hexane solution) was added thereto. This mixture was stirred under a nitrogen atmosphere at 110° C. for 6.5 hours to be reacted.

After the reaction, 400 mL of toluene was added to the reaction mixture solution, and the resulting suspension was filtrated through Florisil (produced by Wako Pure Chemical Industries, Ltd., Catalog No. 540-00135), alumina, and Celite (produced by Wako Pure Chemical Industries, Ltd., Catalog No. 531-16855). The obtained filtrate was concentrated, and methanol was added thereto. The mixture was irradiated with supersonic and then recrystallized to obtain 4.4 g of an objective light-yellow powder at a yield of 91%. A synthesis scheme (a) thereof is shown below.

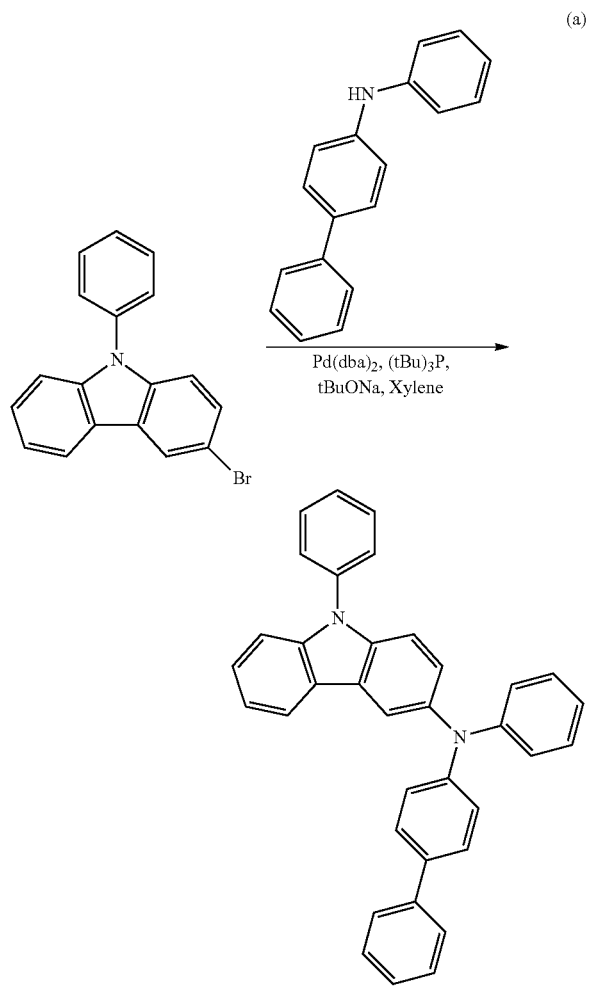

(a)

The Rf values of the objective substance, 3-bromo-9-phenyl-9H-carbazole, and 4-phenyl-diphenylamine were respectively 0.65, 0.73, and 0.54, which were obtained by silica gel thin layer chromatography (TLC) (with a developing solvent containing ethyl acetate and hexane in a 1:5 ratio).

This compound was identified as PCA1BP, which was the object of the synthesis, by nuclear magnetic resonance (NMR) spectroscopy.

$^1$H NMR data of the obtained substance are as follows:
$^1$H-NMR (DMSO-d6, 300 MHz): δ (ppm)=7.00-7.11 (m, 5H), 7.21-7.44 (m, 10H), 7.54-7.71 (m, 9H), 8.06 (d, J=1.8 Hz, 1H), 8.17 (d, J=7.2 Hz, 1H).

Figure 28A:
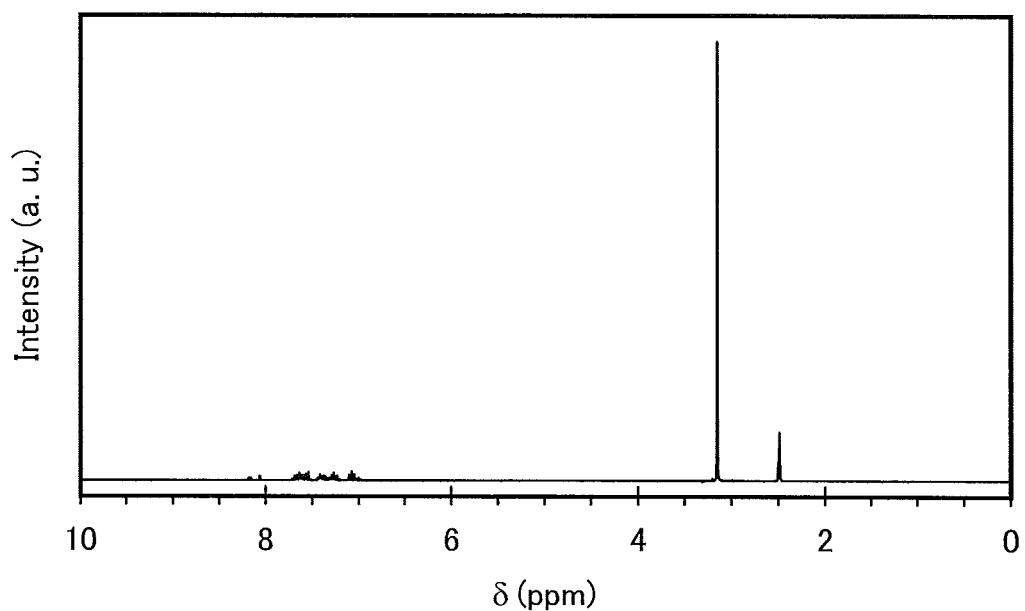
FIGS. 28A and 28B are $^1$H NMR charts of an organic compound represented by a structural formula (100).
Figure 28B:
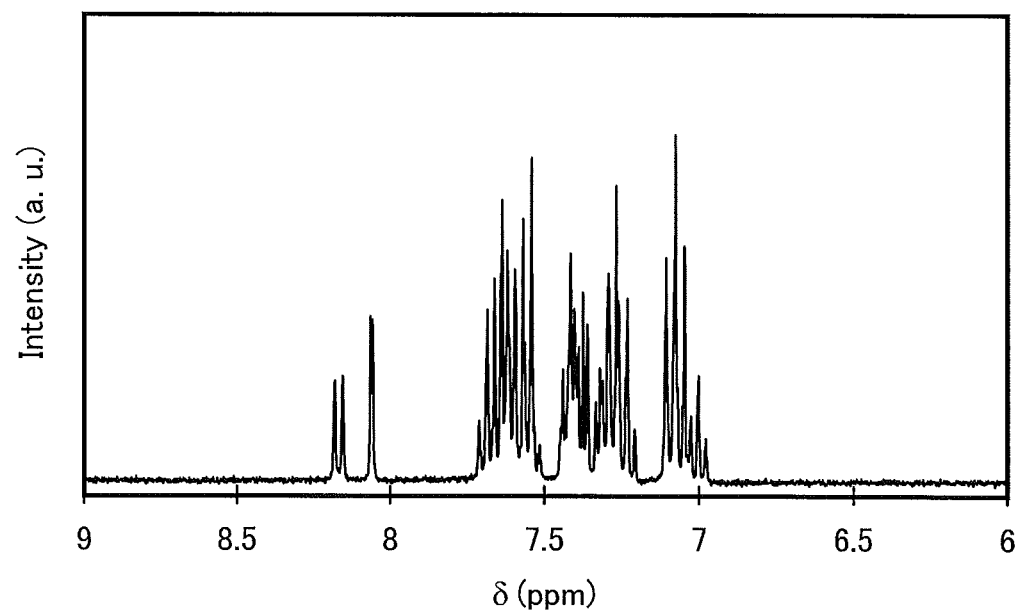

FIGS. 28A and 28B show $^1$H NMR charts. Note that FIG. 28B is a chart showing an enlarged part of FIG. 28A in the range of 6.00 ppm to 9.00 ppm.

Figure 29A:
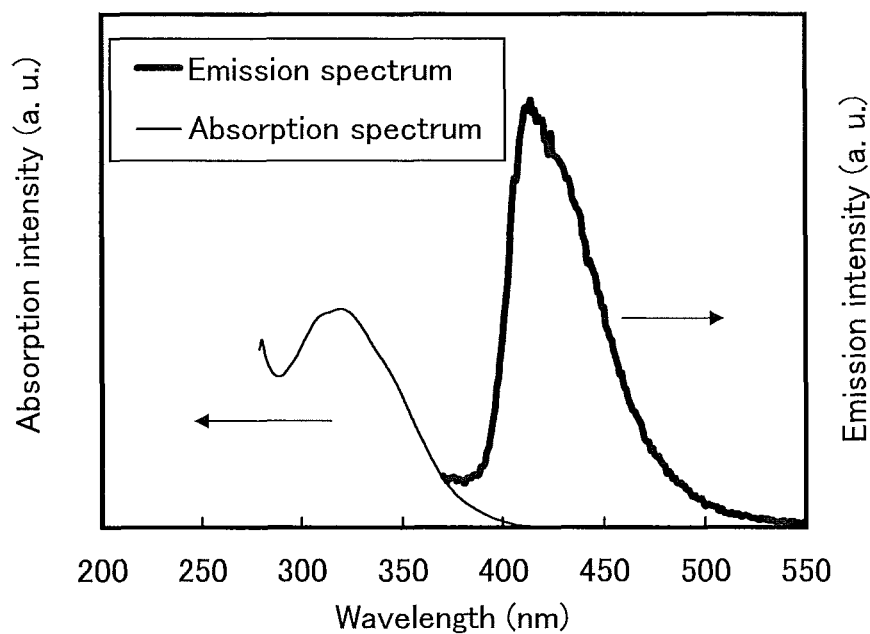
FIGS. 29A and 29B show ultraviolet-visible absorption spectra and emission spectra of the organic compound represented by the structural formula (100).
Figure 29B:
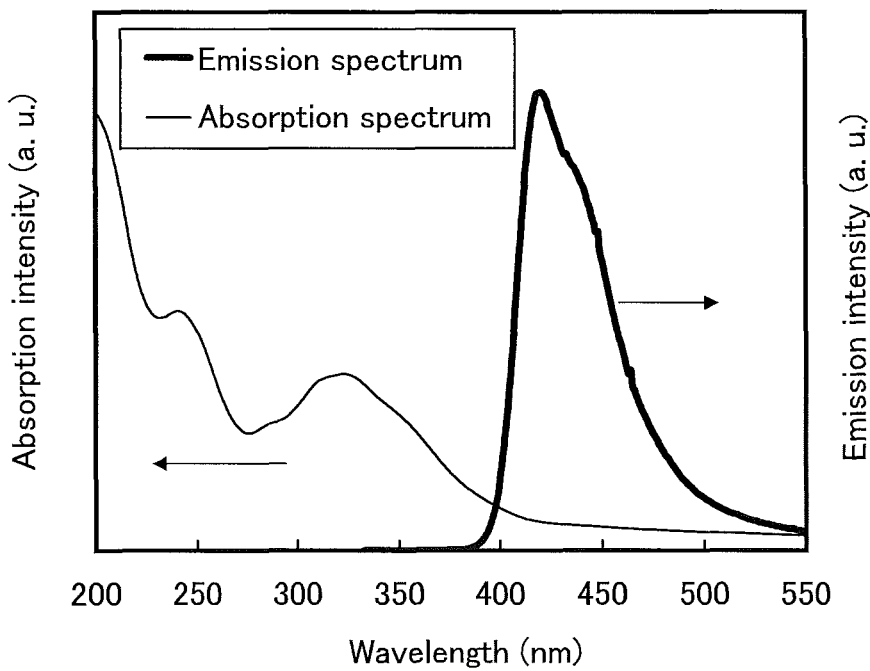

FIG. 29A shows an absorption spectrum and an emission spectrum of a toluene solution (0.120 mmol/L) of PCA1BP. FIG. 29B shows an absorption spectrum and an emission spectrum of a thin film of PCA1BP. The absorption spectrum was measured with a UV-visible spectrophotometer (V-550, manufactured by JASCO Corporation). The measurements were performed with samples prepared in such a manner that the solution was put in a quartz cell and the thin film was obtained by evaporation onto a quartz substrate. The absorption spectrum of the solution was obtained by subtracting the absorption spectra of quartz and toluene from those of quartz and the solution, and the absorption spectrum of the thin film was obtained by subtracting the absorption spectrum of a quartz substrate from those of the quartz substrate and the thin film. In the case of the toluene solution, the absorption peak was observed at around 321 nm, and the maximum emission wavelength was 415 nm (excitation wavelength: 325 nm). In the case of the thin film, the absorption peak was observed at around 323 nm, and the maximum emission wavelength was 421 nm (excitation wavelength: 312 nm).

Further, a HOMO level and a LUMO level of PCA1BP were obtained by cyclic voltammetry (CV) measurement. An electrochemical analyzer (ALS model 600A or 600C, manufactured by BAS Inc.) was used for the CV measurement.

Further, as for a solution used for the CV measurement, dehydrated dimethylformamide (DMF, manufactured by Sigma-Aldrich Inc., 99.8%, Catalog No. 22705-6) was used as a solvent, and tetra-n-butylammonium perchlorate (n-Bu$_4$NClO$_4$, manufactured by Tokyo Chemical Industry Co., Ltd., Catalog No. T0836), which was a supporting electrolyte, was dissolved in the solvent such that the concentration of tetra-n-butylammonium perchlorate was 100 mmol/L. Further, the object to be measured was dissolved in the solvent such that the concentration thereof was 2 mmol/L. A platinum electrode (manufactured by BAS Inc., PIE platinum electrode) was used as a working electrode, a platinum electrode (manufactured by BAS Inc., Pt counter electrode for VC-3, (5 cm)) was used as an auxiliary electrode, and an Ag/Ag$^+$ electrode (manufactured by BAS Inc., RE-7 reference electrode for nonaqueous solvent) was used as a reference electrode. The CV measurement was performed under the following conditions: room temperature (20° C. to 25° C.) and a scan rate of 0.1 V/sec. Note that the potential energy of the reference electrode with respect to the vacuum level was assumed to be −4.94 eV in this example.

On the assumption that the intermediate potential (the half-wave potential) between the oxidation peak potential $E_{pa}$ and the reduction peak potential $E_{pc}$ which are obtained in the CV measurement corresponds to the HOMO level, the HOMO level of PCA1BP was calculated to be −5.31 eV, and the LUMO level of PCA1BP was calculated to be −2.12 eV. Accordingly, the band gap (ΔE) of PCA1BP was found to be 3.19 eV.

In addition, the oxidation peak took a similar value even after the 100 cycles. This indicates that PCA1BP has properties effective against repetition of redox reactions between an oxidized state and a neutral state.

Furthermore, PCA1BP was subjected to mass spectrometric (MS) analysis by LC/MS.

Figure 30A:
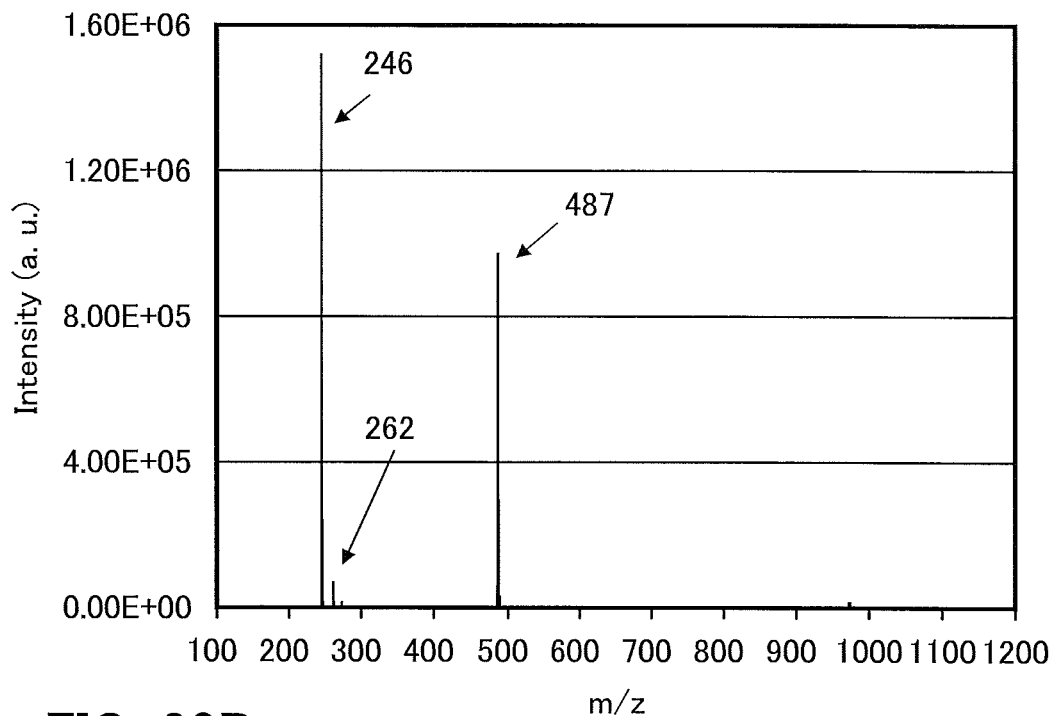
FIGS. 30A and 30B show results of LC/MS analysis of the organic compound represented by the structural formula (100).
Figure 30B:
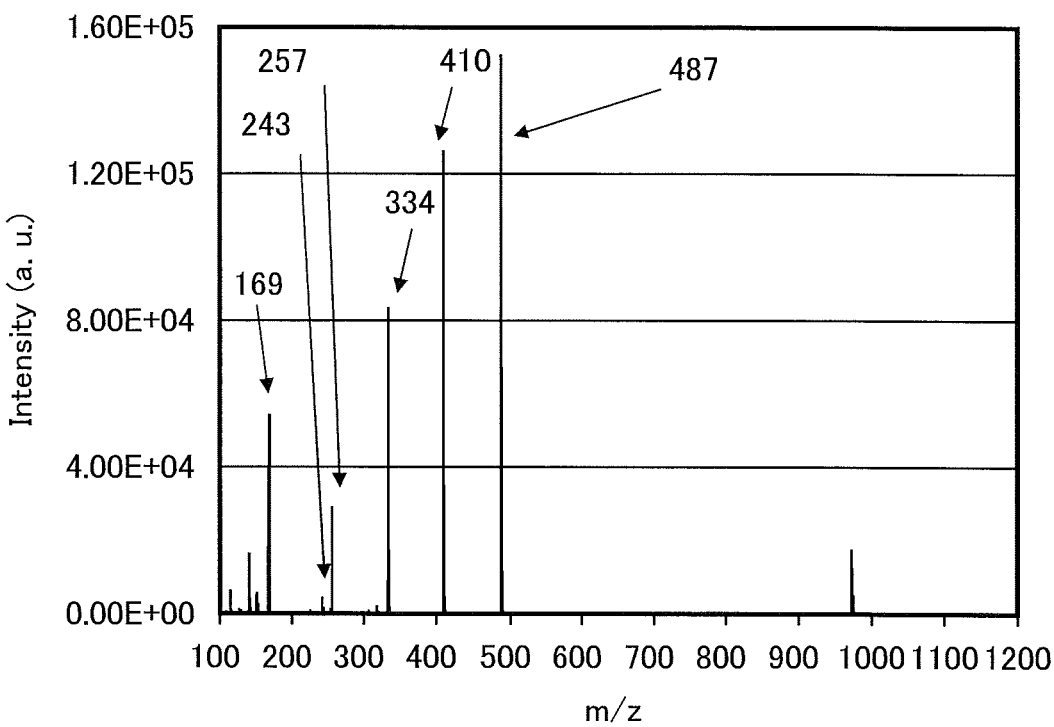

The analysis by LC/MS was carried out with Acquity UPLC (manufactured by Waters Corporation), and Xevo G2 T of MS (manufactured by Waters Corporation). In the MS, ionization was carried out by an electrospray ionization (abbreviation: ESI) method. At this time, the capillary voltage and the sample cone voltage were set to 3.0 kV and 30 V, respectively, and detection was performed in a positive mode. A component which underwent the ionization under the above conditions was made to collide with an argon gas in a collision cell to dissociate into product ions. Energy (collision energy) for the collision with argon was 6 eV, 30 eV and 50 eV. A mass range for the measurement was m/z 100-1200. FIG. 30A shows the measurement results in the case of a collision energy of 6 eV. FIG. 30B shows the measurement results in the case of a collision energy of 50 eV.

In FIG. 30A, owing to the presence and absence of hydrogen ions and isotopes, a plurality of peaks derived from precursor ions of PCA1BP are detected mainly around m/z=487 when the collision energy is 6 eV. Further, owing to the presence and absence of hydrogen ions and isotopes, a plurality of peaks derived from product ions of PCA1BP are detected mainly around m/z=246 and around m/z=262. Also, owing to the presence and absence of hydrogen ions and isotopes, a peak derived from product ions of PCA1BP are detected mainly around m/z=246 when the collision energy is 30 eV, though not shown.

The product ion detected around m/z=246 can be regarded as being derived from a proton adduct of a cation in a state where phenylcarbazole is eliminated from PCA1BP, and is one of characteristic product ions representing an organic compound having the phenylcarbazole.

Further, the product ion detected around m/z=246 can also be regarded as being derived from a radical cation of an N-phenyl-N-phenylamine, and can be one of characteristic product ions representing an organic compound having the phenylcarbazole and the N-phenyl-N-phenylamine.

In FIG. 30B, owing to the presence and absence of hydrogen ions and isotopes, a plurality of peaks derived from precursor ions of PCA1BP are detected mainly around m/z=487 when the collision energy is 50 eV. Further, owing to the presence and absence of hydrogen ions and isotopes, a plurality of peaks derived from product ions of PCA1BP are detected mainly around m/z=169, around m/z=243, around m/z=257, around m/z=334, and around m/z=410.

The product ion detected around m/z=243 can be regarded as being derived from a proton adduct of a radical cation at the 3-position of phenylcarbazole and is one of characteristic product ions representing an organic compound having the phenylcarbazole.

The results in FIGS. 30A and 30B are characteristically derived from PCA1BP and thus can be regarded as important data in identification of PCA1BP contained in the light-emitting element.

Figure 31A:
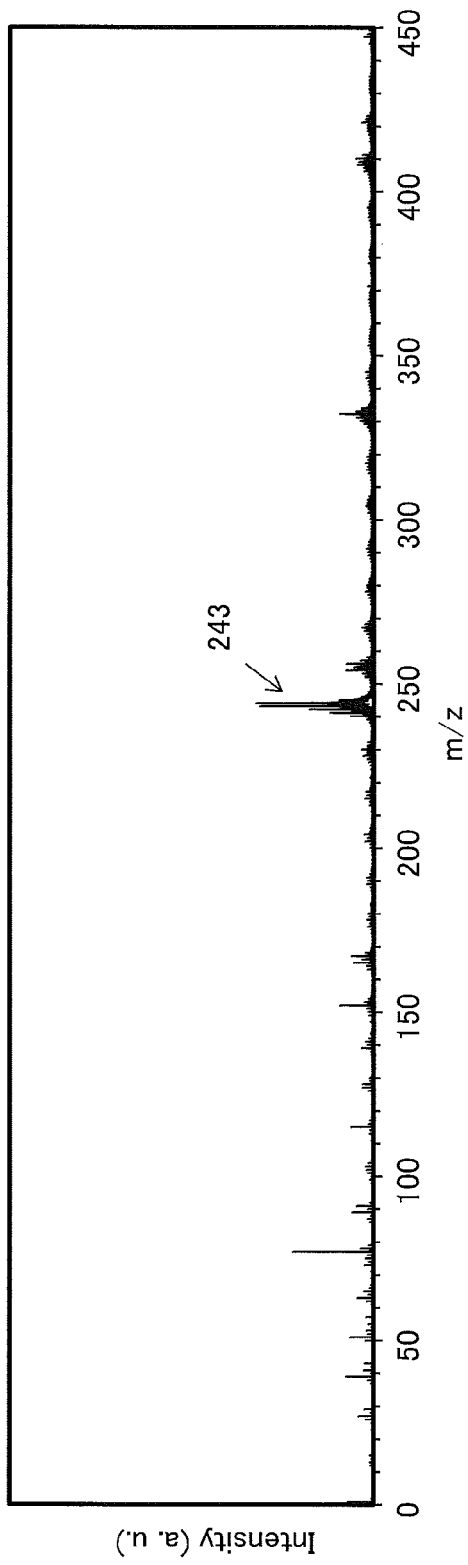
FIGS. 31A and 31B show results of TOF-SIMS measurement of the organic compound represented by the structural formula (100).
Figure 31B:
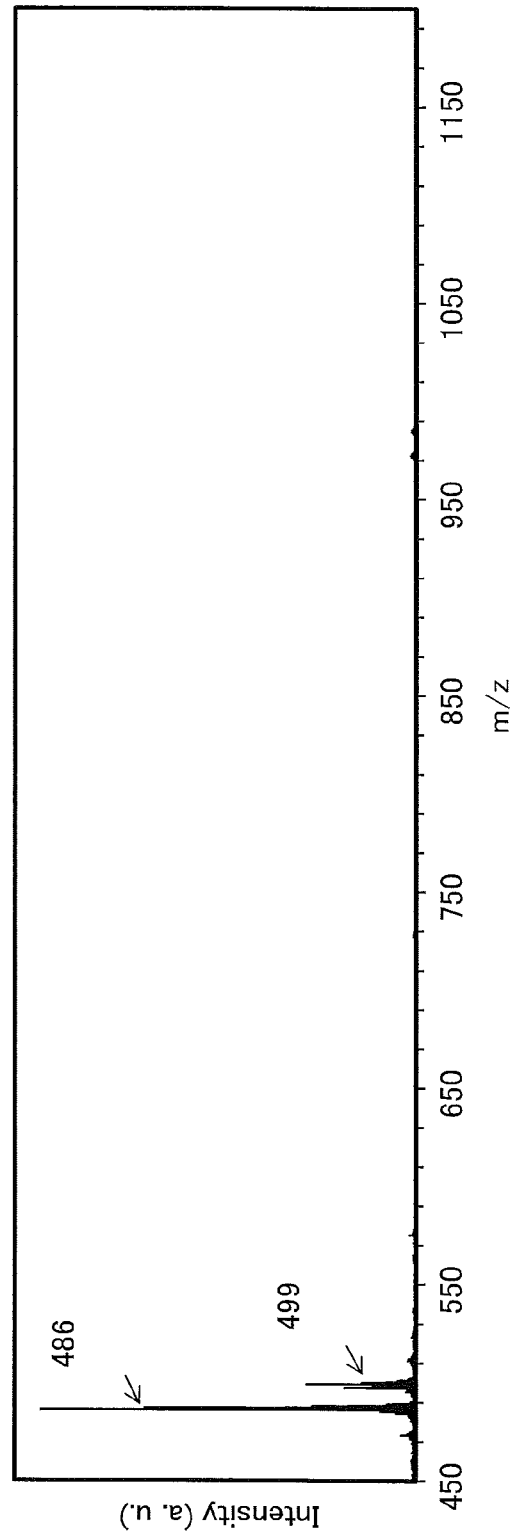
Figure 32A:
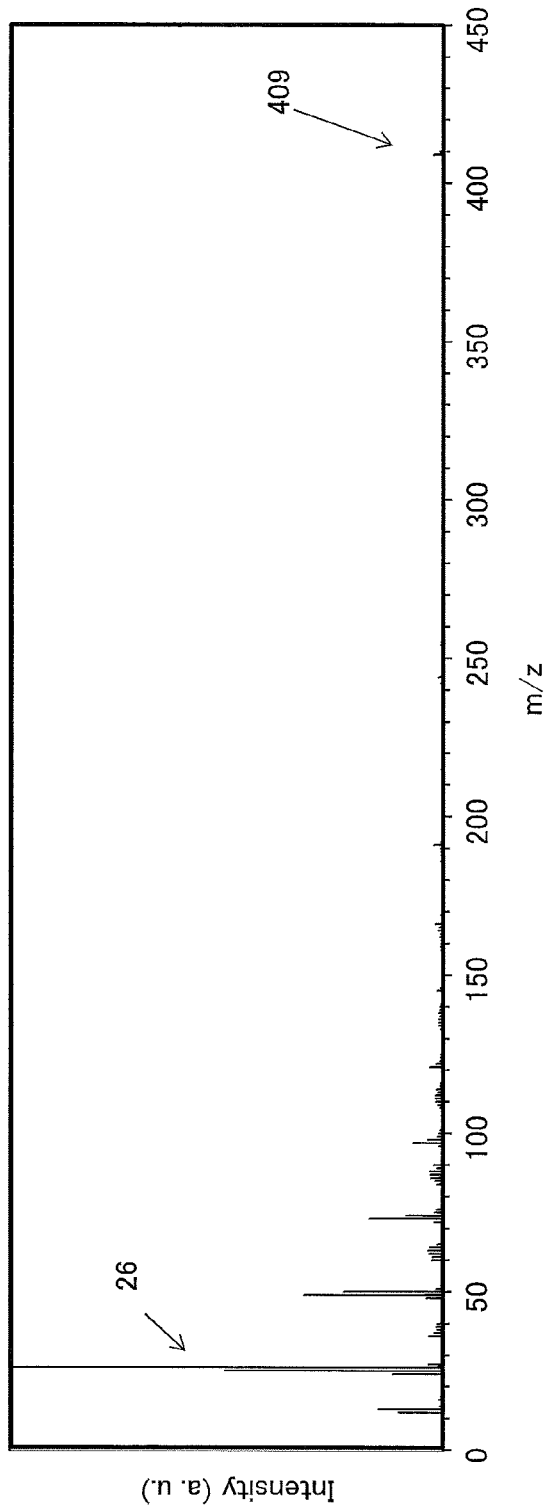
FIGS. 32A and 32B show results of TOF-SIMS measurement of the organic compound represented by the structural formula (100).
Figure 32B:
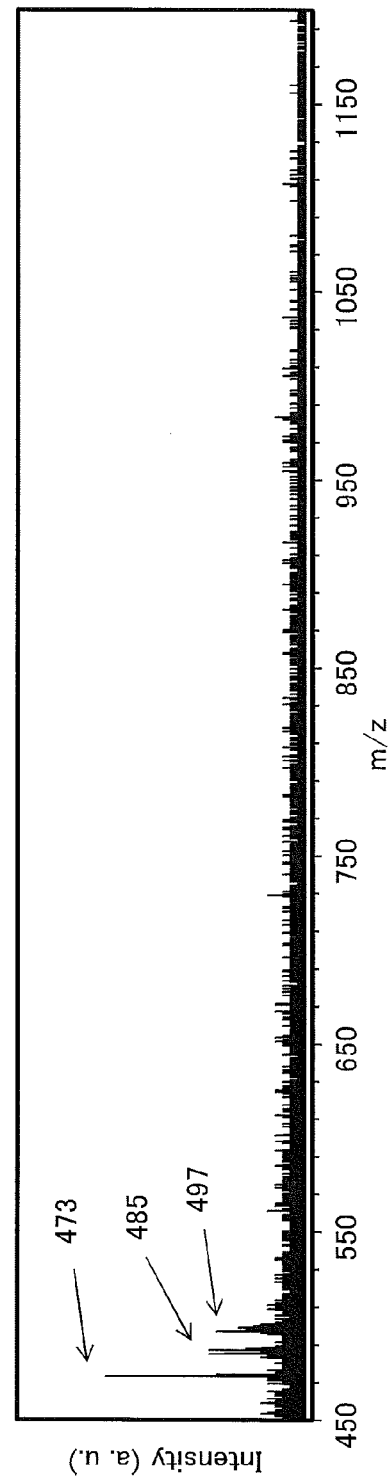

Measurement of PCA1BP with a TOF-SIMS was further performed, and FIGS. 31A and 31B and FIGS. 32A and 32B show the qualitative spectra (positive ions and negative ions). Note that FIGS. 31A and 31B show measurement results in the case of positive ions, and FIGS. 32A and 32B show measurement results in the case of negative ions. In each of FIGS. 31A and 32A, the horizontal axis represents m/z in the range of 0 to 450, and the vertical axis represents intensity (arbitrary unit). In each of FIGS. 31B and 32B, the horizontal axis represents m/z in the range of 450 to 1200, and the vertical axis represents intensity (arbitrary unit).

TOF.SIMS 5 (manufactured by ION-TOF GmbH) was used, where $Bi_3^{++}$ was used as a primary ion. Note that irradiation with the primary ions was performed in a pulsed manner with a pulse width of 7 ns to 12 ns. The irradiation amount was greater than or equal to $8.2 \times 10^{10}$ ions/cm$^2$ and less than or equal to $6.7 \times 10^{11}$ ions/cm$^2$ (less than or equal to $1 \times 10^{12}$ ions/cm$^2$), the acceleration voltage was 25 keV, and the current value was 0.2 pA. A powder of PCA1BP was a sample used for the measurement.

The results in FIGS. 31A and 31B reveal that, owing to the presence and absence of hydrogen ions and isotopes, PCA1BP mainly has a plurality of peaks derived from precursor ions around m/z=486, a plurality of peaks derived from product ions around m/z=243, and a plurality of peaks derived from adducts around m/z=499. The results in FIGS. 32A and 32B reveal that, owing to the presence and absence of hydrogen ions and isotopes, PCA1BP mainly has a plurality of peaks derived from precursor ions around m/z=485, a plurality of peaks derived from product ions around m/z=26, around m/z=409, and around 712/Z=473, and a plurality of peaks derived from adducts around m/z=497. Note that the measurement results with a TOF-SIMS can be similarly regarded as important data in identification of PCA1BP contained in the light-emitting element.

As described above, a peak of a product ion detected around m/z=243 which is one of characteristic product ions representing an organic compound having the phenylcarbazole can be observed also in the result of the measurement with the TOF-SIMS.

Synthesis Example 2

Described is a method for synthesizing N,N-di(biphenyl-4-yl)-N-(9-phenyl-9H-carbazol-3-yl)amine (abbreviation: PCzBBA1) represented by a structural formula (101) below.

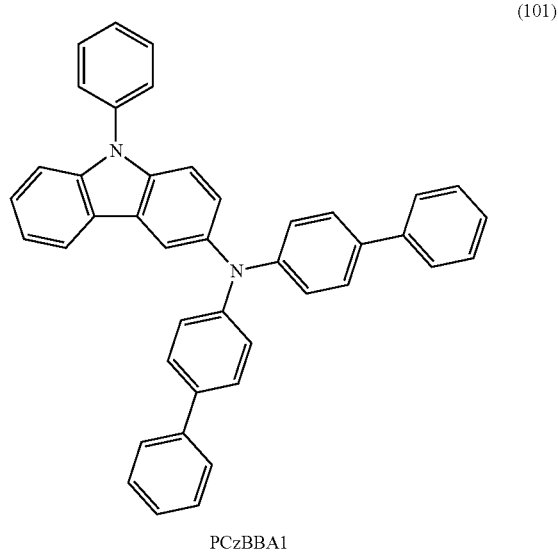 [SMILES: c1ccc(-c2ccc(N(c3ccc(-c4ccccc4)cc3)c3ccc4c(c3)c3ccccc3n4-c3ccccc3)cc2)cc1]

PCzBBA1

Into a 200 mL three-neck flask were put 3.7 g (10 mmol) of 3-iodo-9-phenyl-9H-carbazole, 3.2 g (10 mmol) of 4,4'-diphenyldiphenylamine, 1.5 g (15 mmol) of sodium tert-butoxide, and 0.1 g (0.2 mmol) of bis(dibenzylideneacetone)palladium(0), and the air in the flask was replaced with nitrogen. Then, 25 mL of dehydrated xylene was added to this mixture. After the mixture was deaerated while being stirred under reduced pressure, 1.2 mL (0.6 mmol) of tri(tert-butyl)phosphine (10 wt % hexane solution) was added thereto. This mixture was stirred under a nitrogen atmosphere at 110° C. for 4.5 hours to be reacted.

After the reaction, 200 mL of toluene was added to this reaction mixture, and this suspension was filtrated through Florisil, alumina, and then Celite. The obtained filtrate was concentrated and then recrystallized to obtain 3.7 g of an objective light-yellow powder at a yield of 66%. A synthesis scheme (b) thereof is shown below.

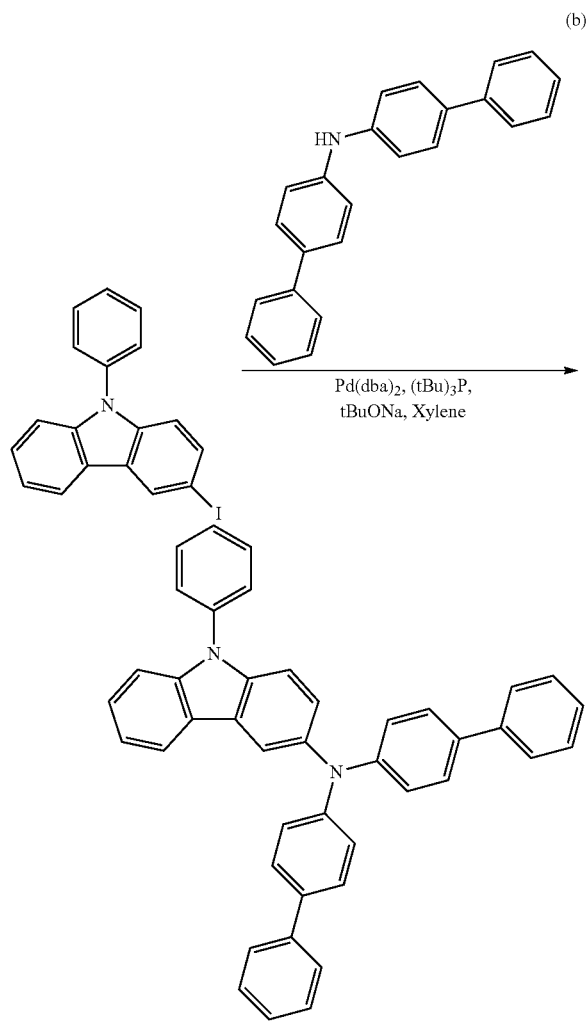

The Rf values of the objective substance, 3-iodo-9-phenyl-9H-carbazole, and 4,4'-diphenyldiphenylamine were respectively 0.43, 0.59, and 0.19, which were obtained by silica gel thin layer chromatography (TLC) (with a developing solvent containing ethyl acetate and hexane in a 1:10 ratio).

This compound was identified as PCzBBA1, which was the object of the synthesis, by nuclear magnetic resonance (NMR) spectroscopy.

$^1$H NMR data of the obtained substance are as follows: $^1$H-NMR (DMSO-d6, 300 MHz): δ (ppm)=7.14 (d, J=8.1 Hz, 4H), 7.22-7.46 (m, 11H), 7.53-7.73 (m, 13H), 8.15 (s, 1H), 8.23 (d, J=7.8 Hz, 1H).

Figure 33A:
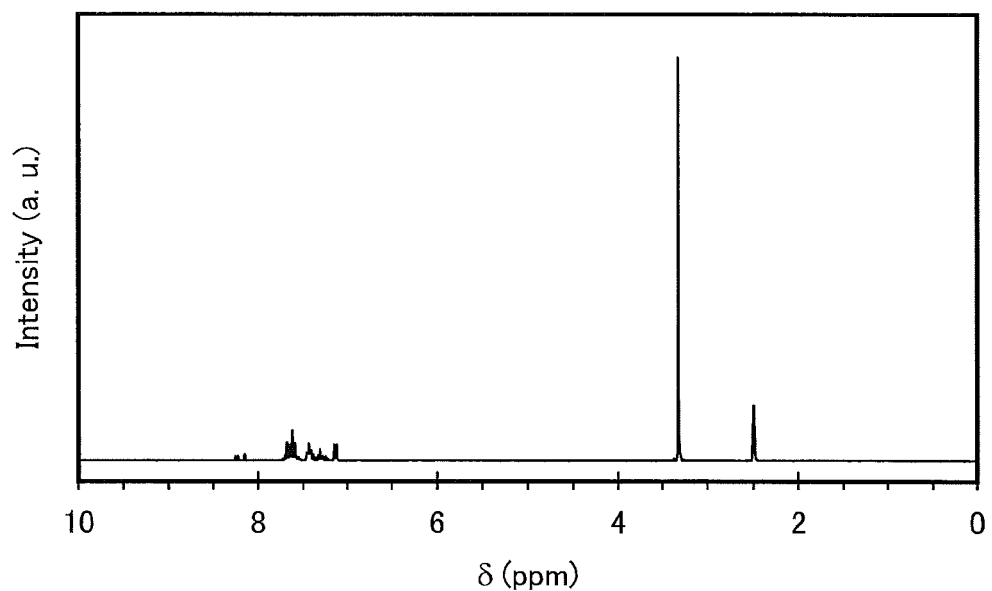
FIGS. 33A and 33B are $^1$H NMR charts of an organic compound represented by a structural formula (101).
Figure 33B:
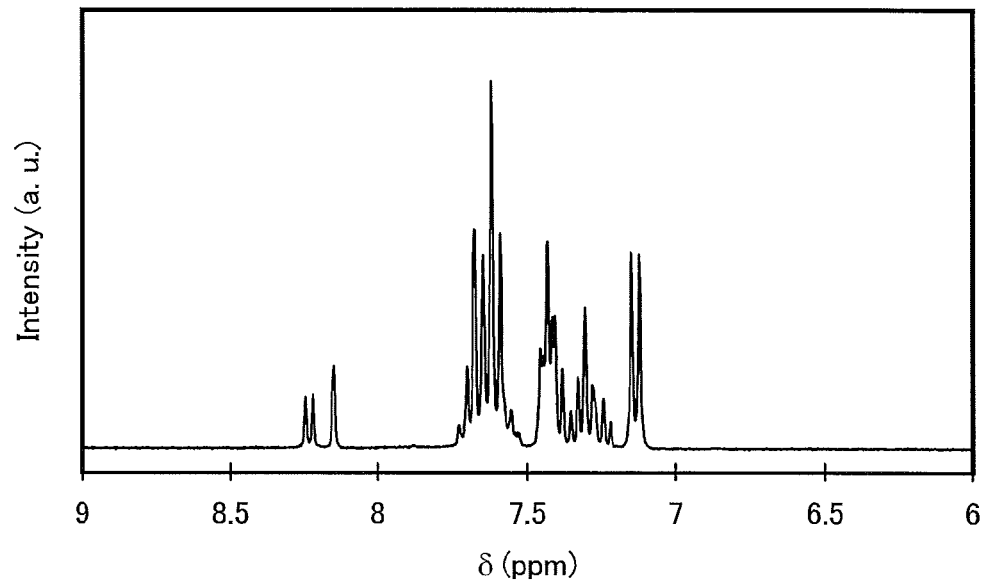

FIGS. 33A and 33B show $^1$H NMR charts. Note that FIG. 33B is a chart showing an enlarged part of FIG. 33A in the range of 6.00 ppm to 9.00 ppm.

Figure 34A:
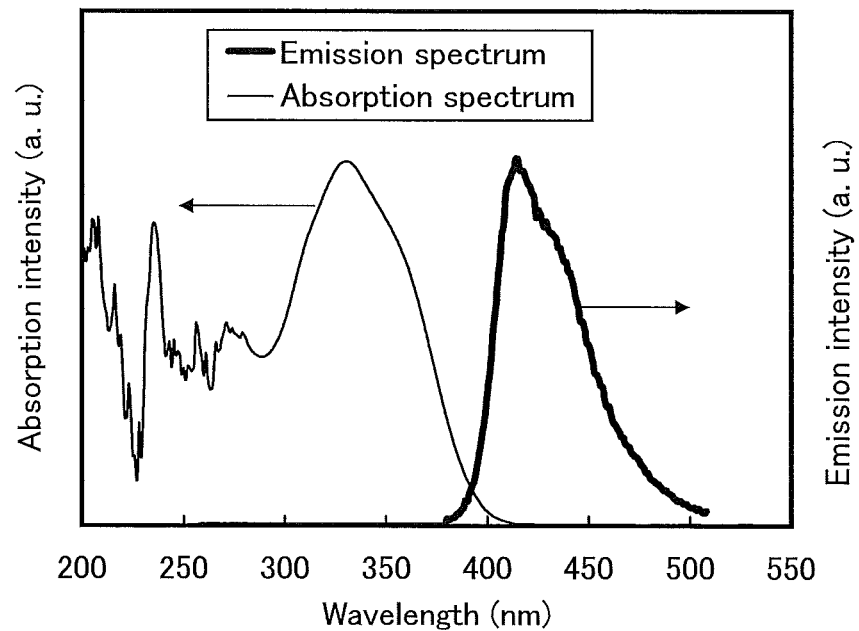
FIGS. 34A and 34B show ultraviolet-visible absorption spectra and emission spectra of the organic compound represented by the structural formula (101).
Figure 34B:
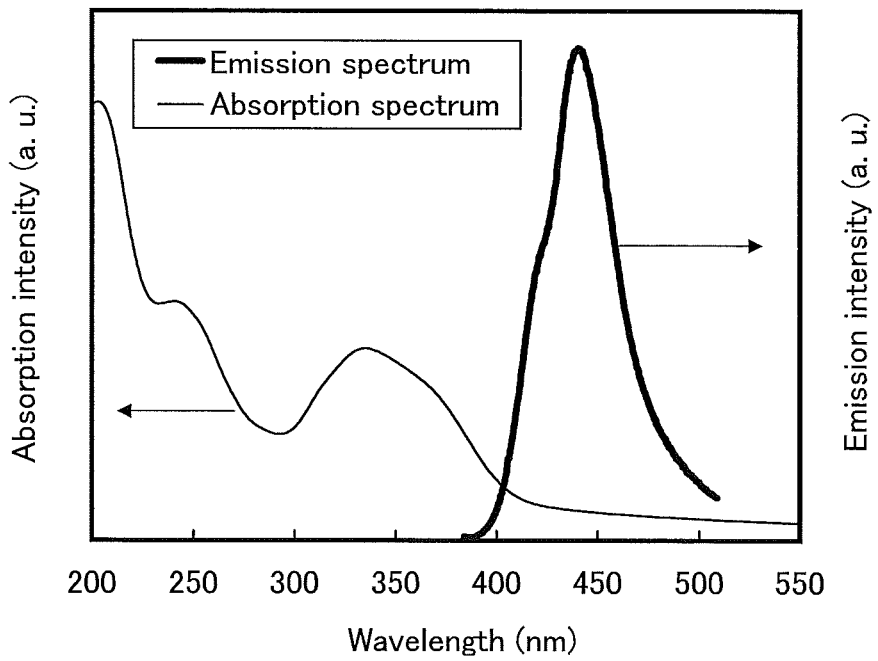

FIG. 34A shows an absorption spectrum and an emission spectrum of a toluene solution (0.120 mmol/L) of PCz-BBA1. FIG. 34B shows an absorption spectrum and an emission spectrum of a thin film of PCzBBA1. The measurement was performed using conditions and a method which were similar to those in Synthesis Example 1. In the case of the toluene solution, the absorption peak was observed at around 330 nm, and the maximum emission wavelength was 415 nm (excitation wavelength: 330 nm). In the case of the thin film, the absorption peak was observed at around 335 nm, and the maximum emission wavelength was 441 nm (excitation wavelength: 335 nm).

Further, a HOMO level and a LUMO level of PCzBBA1 were obtained by cyclic voltammetry (CV) measurement. When the measurement was performed using conditions and a method which were similar to those in Synthesis Example 1, the HOMO level of PCzBBA1 was calculated to be −5.28 eV, and the LUMO level of PCzBBA1 was calculated to be −2.30 eV. Thus, the band gap (ΔE) of PCzBBA1 was found to be 2.98 eV. In addition, the oxidation peak took a similar value even after the 100 cycles. This indicates that PCzBBA1 has properties effective against repetition of redox reactions between an oxidized state and a neutral state.

Further, PCzBBA1 was subjected to MS analysis by LC/MS.

Figure 35A:
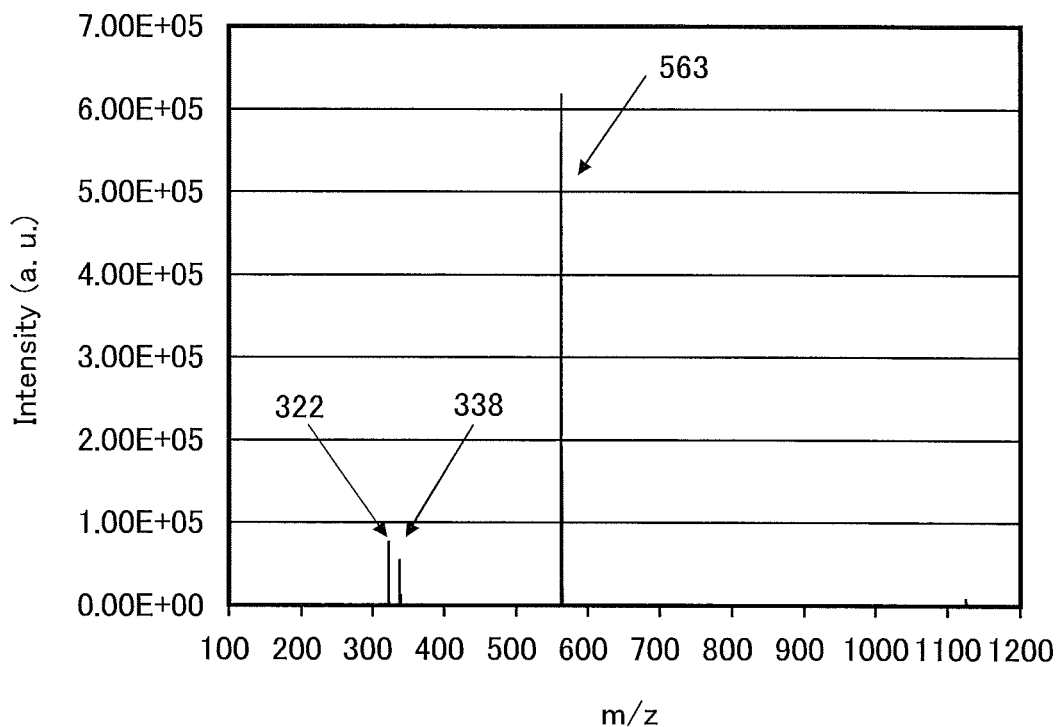
FIGS. 35A and 35B show results of LC/MS analysis of the organic compound represented by the structural formula (101).
Figure 35B:
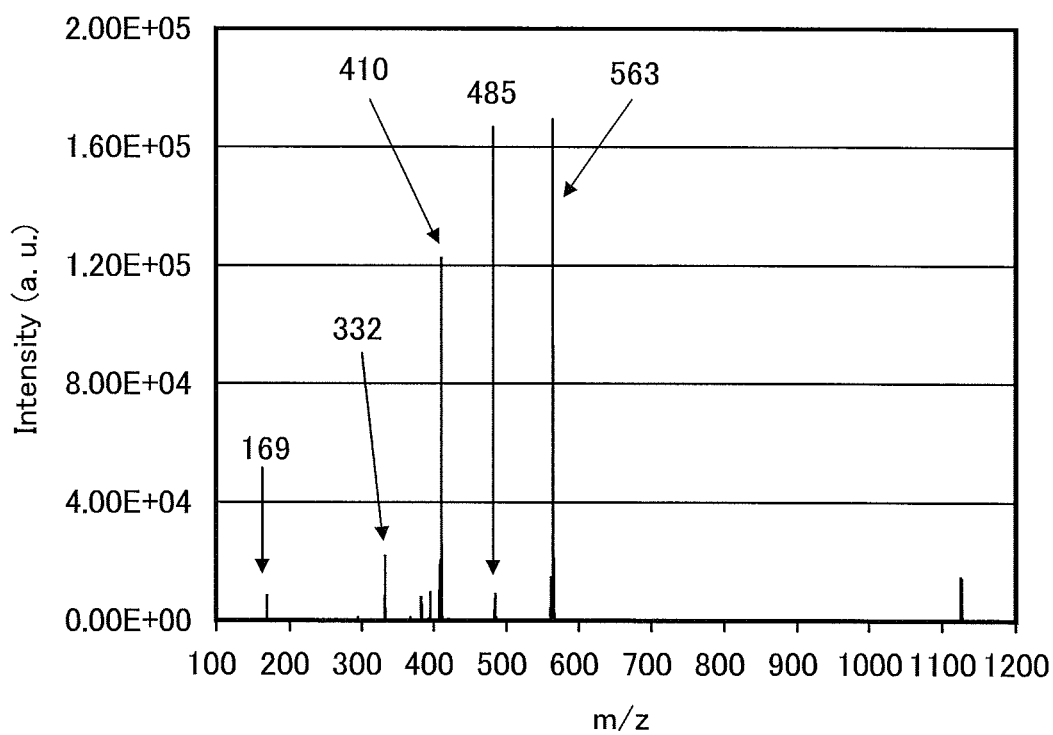

The LC/MS was conducted using an apparatus, a method, and conditions which were similar to those in the case of PCA1BP. FIG. 35A shows the measurement results in the case of a collision energy of 6 eV. FIG. 35B shows the measurement results in the case of a collision energy of 50 eV.

In FIG. 35A, owing to the presence and absence of hydrogen ions and isotopes, a plurality of peaks derived from precursor ions of PCzBBA1 are detected mainly around m/z=563 when the collision energy is 6 eV. Further, owing to the presence and absence of hydrogen ions and isotopes, a plurality of peaks derived from product ions are detected mainly around m/z=322 and around m/z=338.

The product ion detected around m/z=322 can be regarded as being derived from a proton adduct of a cation in a state where phenylcarbazole is eliminated from PCzBBA1, and is one of characteristic product ions representing an organic compound having the phenylcarbazole.

Further, the product ion detected around m/z=322 can also be regarded as being derived from a radical cation of an N,N-bis-biphenylamine, and can be one of characteristic product ions representing an organic compound having the phenylcarbazole and the N,N-bis-biphenylamine.

In FIG. 35B, owing to the presence and absence of hydrogen ions and isotopes, a plurality of peaks derived from precursor ions of PCzBBA1 are detected mainly around m/z=563 when the collision energy is 50 eV. Further, owing to the presence and absence of hydrogen ions and isotopes, a plurality of peaks are detected mainly around m/z=169, around m/z=332, around m/z=410, and around m/z=485. The results in FIGS. 35A and 35B are characteristically derived from PCzBBA1 and thus can be regarded as important data in identification of PCzBBA1 contained in the light-emitting element.

Measurement of PCzBBA1 with a TOF-SIMS was further performed, and FIGS. 36A and 36B and FIGS. 37A and 37B show the qualitative spectra (positive ions and negative ions). The measurement was performed using an apparatus, a method, and conditions which were similar to those in the case of PCA1BP.

Figure 36A:
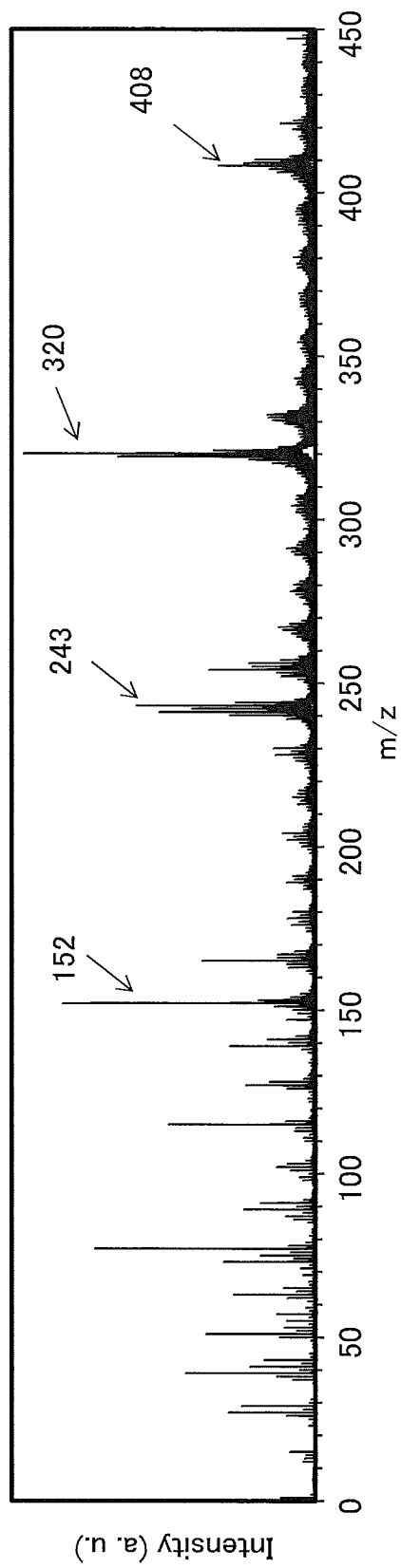
FIGS. 36A and 36B show results of TOF-SIMS measurement of the organic compound represented by the structural formula (101).
Figure 36B:
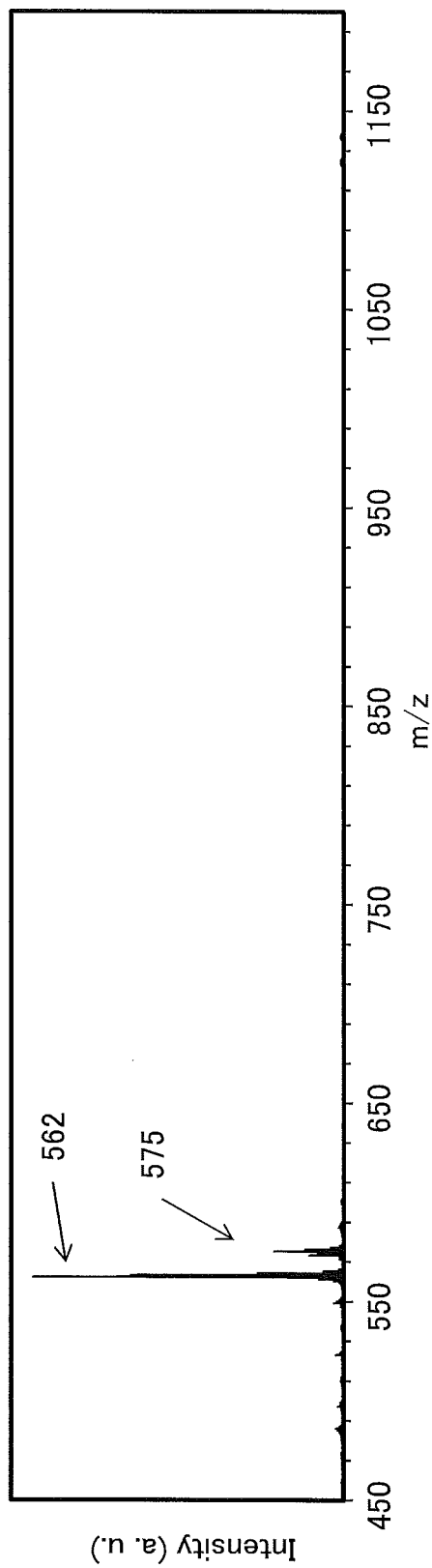
Figure 37A:
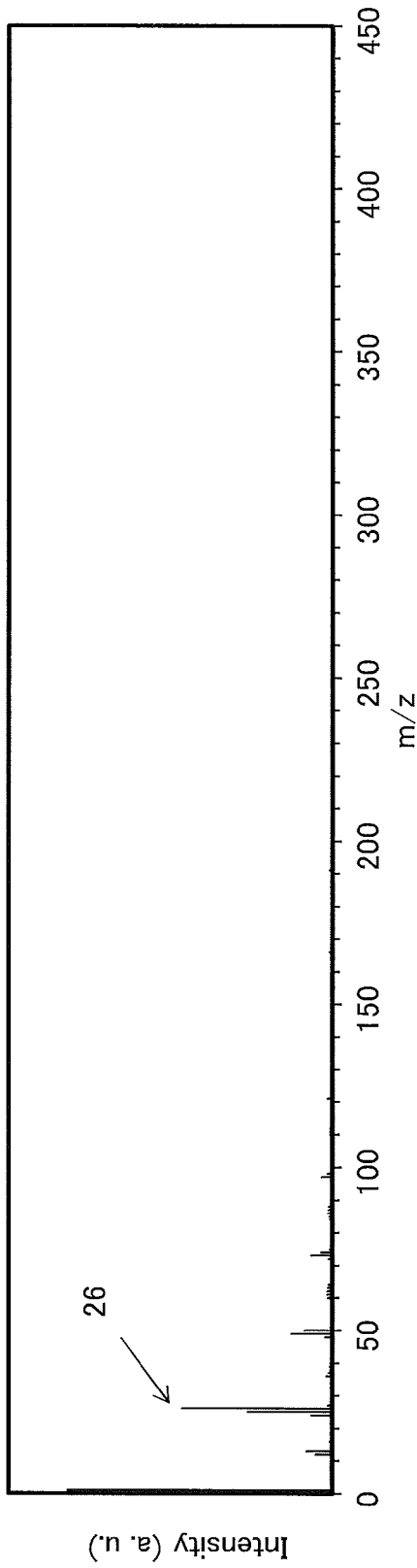
FIGS. 37A and 37B show results of TOF-SIMS measurement of the organic compound represented by the structural formula (101).
Figure 37B:
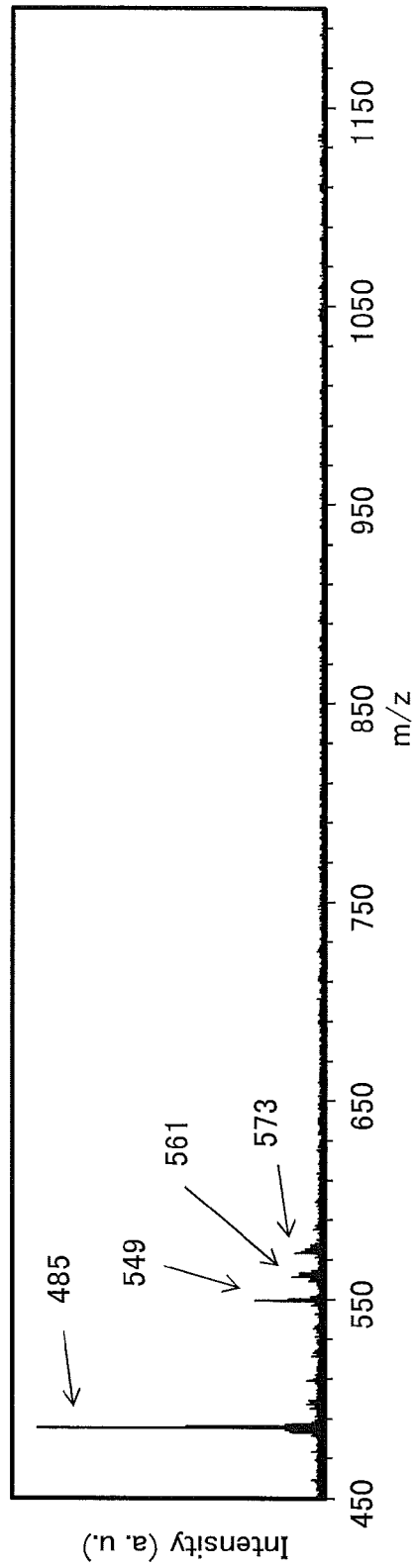

Note that FIGS. 36A and 36B show measurement results in the case of positive ions, and FIGS. 37A and 37B show measurement results in the case of negative ions. In FIGS. 36A and 37A, the horizontal axis represents m/z in the range of 0 to 450, and the vertical axis represents intensity (arbitrary unit). In FIGS. 36B and 37B, the horizontal axis represents m/z in the range of 450 to 1200, and the vertical axis represents intensity (arbitrary unit).

The results in FIGS. 36A and 36B reveal that, owing to the presence and absence of hydrogen ions and isotopes, PCzBBA1 mainly has a plurality of peaks derived from precursor ions around m/z=562, a plurality of peaks derived from product ions around m/z=152, around m/z=243, around m/z=320, and around m/z=408, and a plurality of peaks derived from adducts around m/z=575. The results in FIGS. 37A and 37B reveal that, owing to the presence and absence of hydrogen ions and isotopes, PCzBBA1 mainly has a plurality of peaks derived from precursor ions around m/z=561, a plurality of peaks derived from product ions around m/z=26, around m/z=485, and around m/z=549, and a plurality of peaks derived from adducts around m/z=573. Note that the measurement results with a TOF-SIMS can be similarly regarded as important data in identification of PCzBBA1 contained in the light-emitting element.

The product ion detected around m/z=243 can be regarded as being derived from a proton adduct of a radical cation at the 3-position of phenylcarbazole and is one of characteristic product ions representing an organic compound having the phenylcarbazole.

Comparison Example

Further, N-[4-(9H-carbazol-9-yl)phenyl]-N-(4-phenyl) phenylaniline (abbreviation: YGA1BP) represented by a structural formula (200) below was subjected to MS analysis by LC/MS. Here, YGA1BP is isomeric with PCA1BP shown in Synthesis Example 1.

(200)

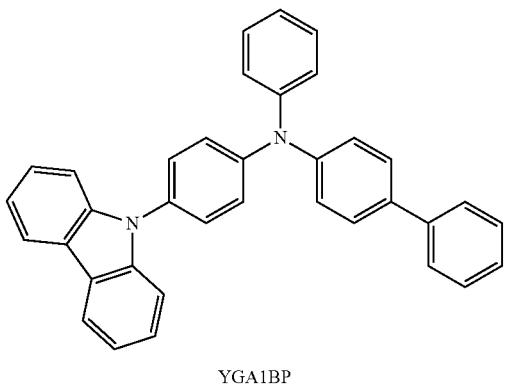

YGA1BP

Figure 38A:
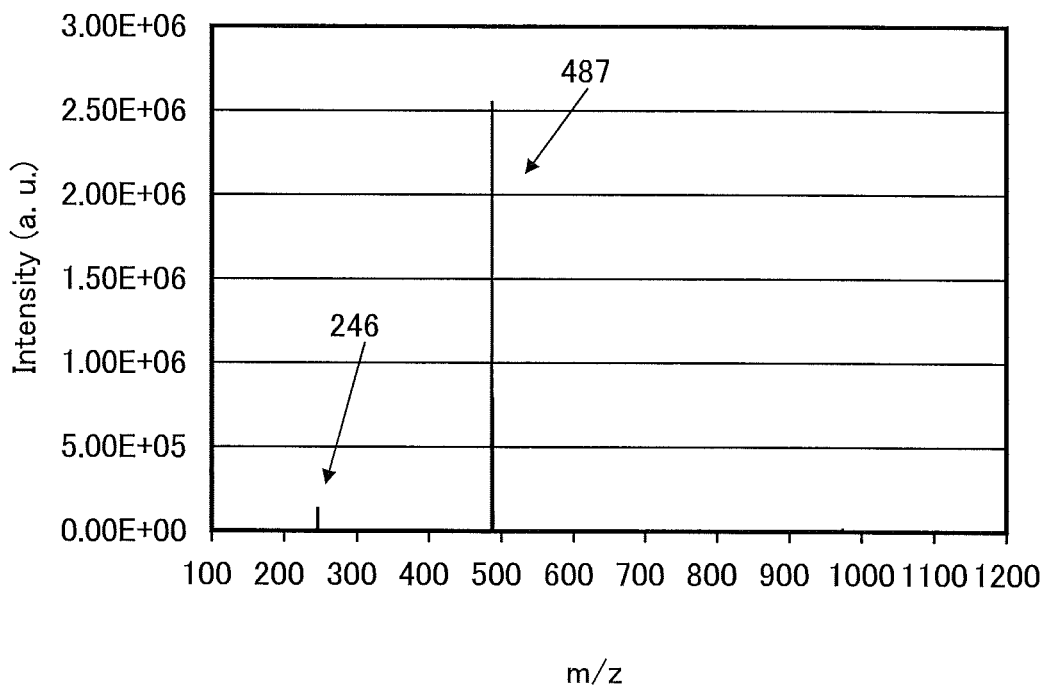
FIGS. 38A and 38B show results of LC/MS analysis of an organic compound represented by a structural formula (200).
Figure 38B:
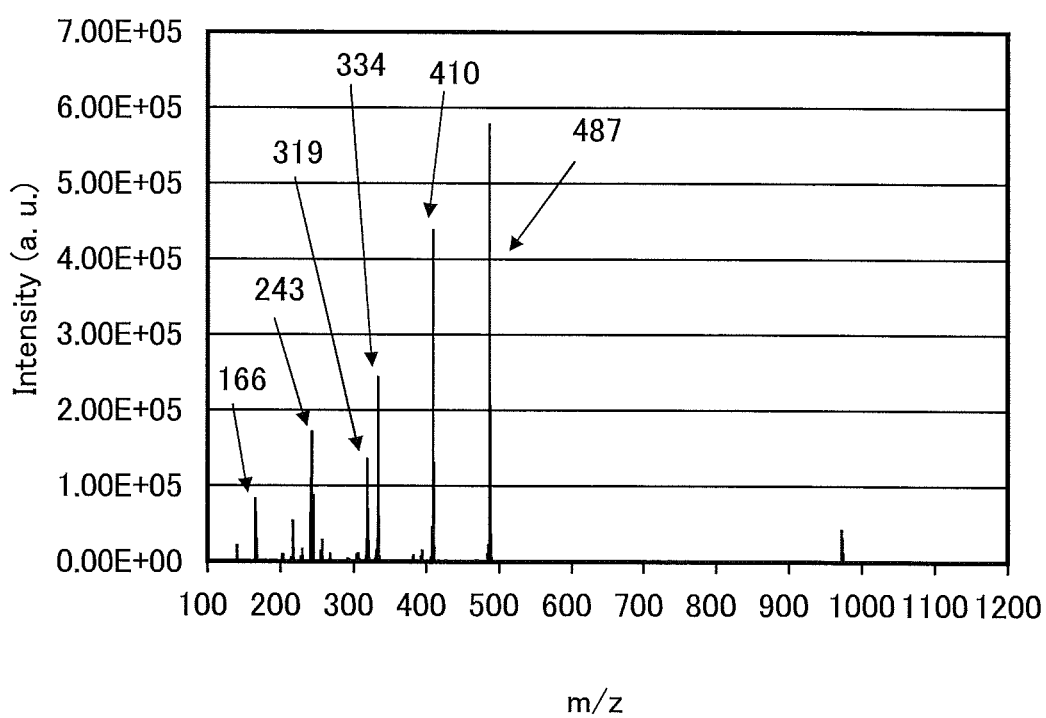

The LC/MS was conducted using an apparatus, a method, and conditions which were similar to those in the case of PCA1BP. FIG. 38A shows the measurement results in the case of a collision energy of 6 eV. FIG. 38B shows the measurement results in the case of a collision energy of 50 eV.

In FIG. 38A, owing to the presence and absence of hydrogen ions and isotopes, a plurality of peaks derived from precursor ions of YGA1BP are detected mainly around m/z=487 when the collision energy is 6 eV. Further, owing to the presence and absence of hydrogen ions and isotopes, a plurality of peaks derived from product ions are detected around m/z=246.

In FIG. 38B, owing to the presence and absence of hydrogen ions and isotopes, a plurality of peaks derived from precursor ions of YGA1BP are detected mainly around m/z=487 when the collision energy is 50 eV. Further, owing to the presence and absence of hydrogen ions and isotopes, a plurality of product ions are detected mainly around m/z=166, m/z=243, m/z=319, m/z=334, and m/z=410. Note that the results in FIGS. 38A and 38B are characteristically derived from YGA1BP and thus can be regarded as important data in identification of YGA1BP contained in the light-emitting element.

By comparing the result of this comparison example (FIG. 38) with the result of Synthesis Example 1 (FIG. 30), it is revealed that YGA1BP is isomeric with PCA1BP and that YGA1BP and PCA1BP having the same substituents (carbazole and N-phenyl-Nphenylamine) show different intensity ratios.

In particular, when the collision energy is 50 eV, the peak intensity of a product ion of YGA1BP detected around m/z=243 is high as compared to the case of PCA1BP; the peak intensity was ¼ or more of the peak intensity derived from a precursor ion. However, as for PCA1BP and PCzBBA1 shown in Synthesis Example 2 (FIG. 35), few peaks are detected around m/z=243. Consequently, the peak of the product ion detected around m/z=243 can be regarded as being derived from a (9H-carbazole-9-yl)phenyl group contained in YGA1BP. Thus, LC/MS analysis is effective in differentiating allotropes which are different from each other in a substitution site of a carbazole skeleton.

Figure 39:
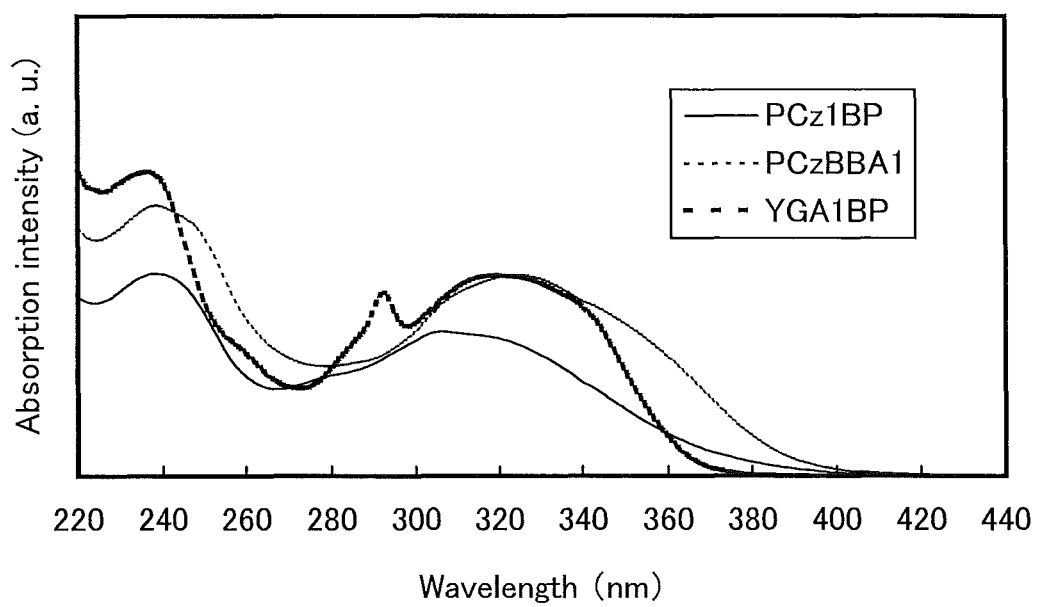
FIG. 39 shows ultraviolet-visible absorption spectra of the organic compounds represented by the structural formulae (100), (101), and (200).

FIG. 39 shows the results of measuring absorption edges in absorption spectra of PCA1BP, PCzBBA1, and YGA1BP in Synthesis Examples 1 and 2 and Comparison Example. Here, liquid chromatogaphy (LC) separation was carried out with Acquity UPLC (produced by Waters Corporation). Acquity UPLC BEH C8 (2.1×100 mm, 1.7 µm) was used as a column for the LC separation, and the column temperature was 40° C. Acetonitrile was used for Mobile Phase A and a 0.1% formic acid aqueous solution was used for Mobile Phase B. Further, a sample was prepared in such a manner that PCA1BP, PCzBBA1, or YGA1BP was dissolved in toluene at a given concentration and the mixture was diluted with acetonitrile. The injection amount was 5.0 µL.

In the LC separation, a gradient method in which the composition of mobile phases is changed was employed. The ratio of Mobile Phase A to Mobile Phase B was 65:25 for 0 to 1 minute immediately after the start of the measurement, and then the composition was changed so that the ratio of Mobile Phase A to Mobile Phase B in the 10th minute after the start of the measurement was 95:5. The composition was changed linearly.

It is found from FIG. 39 that the absorption edges of PCA1BP and PCzBBA1 are on a longer wavelength side than the absorption edge of YGA1BP. Specifically, the absorption edges thereof are found to be at 380 nm or more (3.3 eV or less). It can be said that this is one of characteristics of a carbazole-3-amine skeleton. Thus, as for PCA1BP and PCzBBA1, a band gap between HOMO and LUMO is narrow and excitation energy is low as compared to YGA1BP. Therefore, it can be said that PCA1BP and PCzBBA1 are superior in transfer of energy from a light-emitting substance which emits light with a wavelength of about 380 nm to about 420 nm to PCA1BP and PCzBBA1. In addition, a peak on the longest wavelength side of an absorption spectrum of each of PCA1BP and PCzBBA1 was found to be at 300 nm or more.

This application is based on Japanese Patent Application serial no. 2012-257369 filed with Japan Patent Office on Nov. 26, 2012, the entire contents of which are hereby incorporated by reference.

What is claimed is:

1. A light-emitting device comprising:
   an organic compound between a pair of electrodes; and
   at least one of a hole-injection layer, a hole-transport layer, and a light-emitting layer,
   wherein:
   the organic compound is included in at least one of the hole-injection layer, the hole-transport layer and the light-emitting layer, the organic compound is represented by a formula (G1)

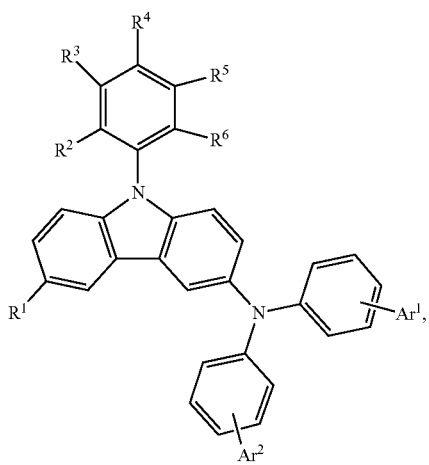

(G1)

R¹ represents hydrogen, an alkyl group having 1 to 6 carbon atoms, or a substituted or unsubstituted phenyl group,
R² to R⁶ separately represent hydrogen, an alkyl group having 1 to 6 carbon atoms, a substituted or unsubstituted phenyl group, a substituted or unsubstituted naphthyl group, or a substituted or unsubstituted phenanthryl group,
Ar¹ represents hydrogen, a substituted or unsubstituted phenyl group, a substituted or unsubstituted naphthyl group, or a substituted or unsubstituted phenanthryl group,
Ar² represents a substituted or unsubstituted phenyl group, a substituted or unsubstituted naphthyl group, or a substituted or unsubstituted phenanthryl group,
a molecular weight X of the organic compound is greater than or equal to 450 and less than or equal to 1500,
an absorption edge of the organic compound is at 380 nm or more, and
a product ion is detected at least around m/z=(X−240) by mass spectrometry.

2. The light-emitting device according to claim 1, wherein the organic compound is represented by a formula (G2)

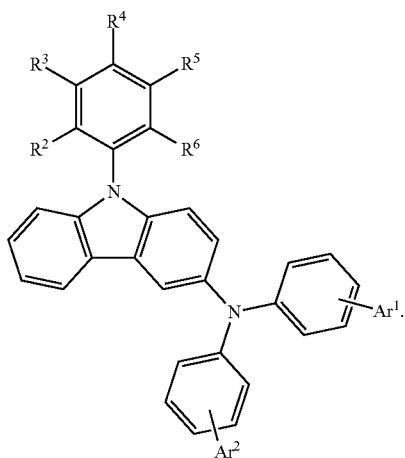

(G2)

3. The light-emitting device according to claim 2, wherein the organic compound is represented by a formula (G3)

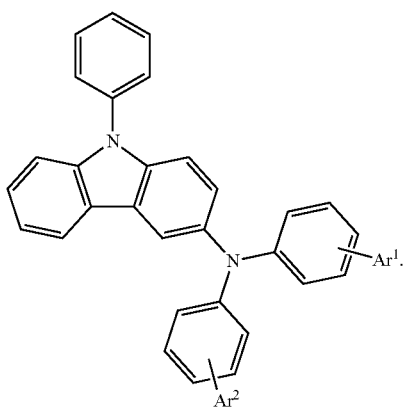

(G3)

4. The light-emitting device according to claim 3, wherein the organic compound is represented by a formula (G4)

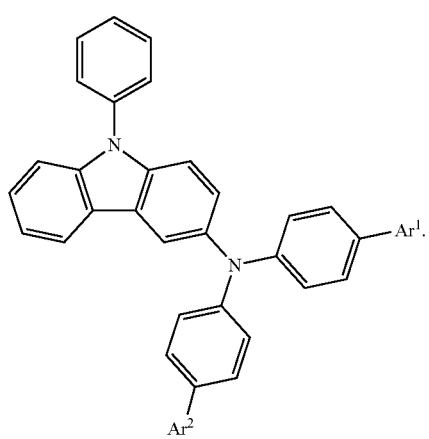

(G4)

5. The light-emitting device according to claim 4, wherein the organic compound is represented by a formula (100)

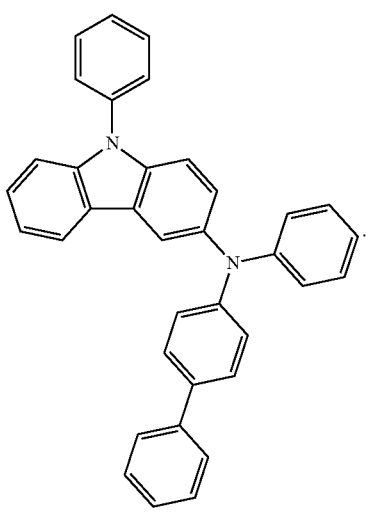

(100)

6. The light-emitting device according to claim 4, wherein the organic compound is represented by a formula (101)

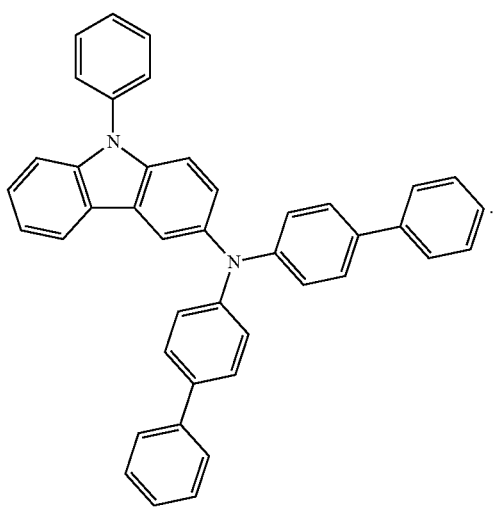

(101)

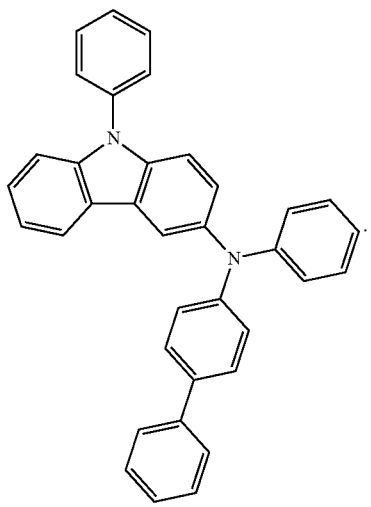

(100)

7. The light-emitting device according to claim 1, wherein the mass spectrometry is liquid chromatography mass spectrometry in a positive mode in which an argon gas is made to collide at any energy higher than or equal to 1 eV and lower than or equal to 30 eV with the organic compound.

8. An electronic device comprising the light-emitting device according to claim 1.

9. A lighting device comprising the light-emitting device according to claim 1.

10. A light-emitting device comprising:

an organic compound between a pair of electrodes; and at least one of a hole-injection layer, a hole-transport layer, and a light-emitting layer, wherein:

the organic compound is included in at least one of the hole-injection layer, the hole-transport layer and the light-emitting layer, the organic compound comprises a phenylcarbazole skeleton and an N-biphenyl-N-phenylamine skeleton, the N-biphenyl-N-phenylamine skeleton is bonded to a 3-position of the phenylcarbazole skeleton, a molecular weight X of the organic compound is greater than or equal to 450 and less than or equal to 1500, an absorption edge of the organic compound is at 380 nm or more, and a product ion is detected at least around m/z=(X−240) by mass spectrometry.

11. The light-emitting device according to claim 10, wherein the organic compound is represented by a formula (100)

12. The light-emitting device according to claim 10, wherein the mass spectrometry is liquid chromatography mass spectrometry in a positive mode in which an argon gas is made to collide at any energy higher than or equal to 1 eV and lower than or equal to 30 eV with the organic compound.

13. An electronic device comprising the light-emitting device according to claim 10.

14. A lighting device comprising the light-emitting device according to claim 10.

15. A light-emitting device comprising:

an organic compound between a pair of electrodes; and at least one of a hole-injection layer, a hole-transport layer, and a light-emitting layer, wherein:

the organic compound is included in at least one of the hole-injection layer, the hole-transport layer and the light-emitting layer, the organic compound comprises a phenylcarbazole skeleton and an N,N-bis-biphenylamine skeleton, the N,N-bis-biphenylamine skeleton is bonded to a 3-position of the phenylcarbazole skeleton, a molecular weight X of the organic compound is greater than or equal to 450 and less than or equal to 1500, an absorption edge of the organic compound is at 380 nm or more, and a product ion is detected at least around m/z=(X−240) by mass spectrometry.

16. The light-emitting device according to claim 15, wherein the organic compound is represented by a formula (101)

(101)

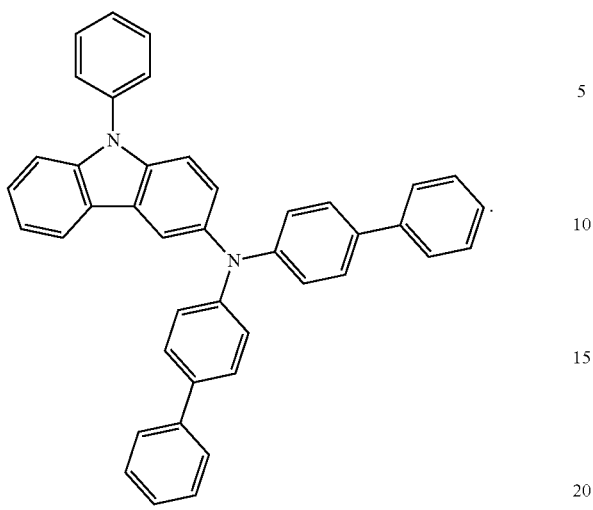

17. The light-emitting device according to claim 15, wherein the mass spectrometry is liquid chromatography mass spectrometry in a positive mode in which an argon gas is made to collide at any energy higher than or equal to 1 eV and lower than or equal to 30 eV with the organic compound.

18. An electronic device comprising the light-emitting device according to claim 15.

19. A lighting device comprising the light-emitting device according to claim 15.

* * * * *